US006396191B1

(12) United States Patent
Hagelstein et al.

(10) Patent No.: US 6,396,191 B1
(45) Date of Patent: May 28, 2002

(54) THERMAL DIODE FOR ENERGY CONVERSION

(75) Inventors: Peter L. Hagelstein, Farmington, MA (US); Yan R. Kucherov, Salt Lake City, UT (US)

(73) Assignee: Eneco, Inc., Salt Lake City, UT (US)

( * ) Notice: Subject to any disclaimer, the term of this patent is extended or adjusted under 35 U.S.C. 154(b) by 0 days.

(21) Appl. No.: 09/721,051

(22) Filed: Nov. 22, 2000

Related U.S. Application Data

(63) Continuation-in-part of application No. 09/519,640, filed on Mar. 6, 2000.
(60) Provisional application No. 60/213,564, filed on Jun. 22, 2000, and provisional application No. 60/123,900, filed on Mar. 11, 1999.

(51) Int. Cl.[7] .................................................. H02N 7/00
(52) U.S. Cl. ..................................................... 310/306
(58) Field of Search ................................... 310/304, 306

(56) References Cited

U.S. PATENT DOCUMENTS

| | | | |
|---|---|---|---|
| 3,267,608 A | 7/1963 | Hernqvist | |
| 3,173,032 A | 3/1965 | Maynard | 310/4 |
| 3,328,611 A | 6/1967 | Davis | 310/4 |
| 3,515,908 A | 6/1970 | Caldwell | 310/4 |
| 3,579,031 A * | 5/1971 | Kearns | 315/363 |

(List continued on next page.)

FOREIGN PATENT DOCUMENTS

EP     0 452 661 A2    10/1991

OTHER PUBLICATIONS

Bass, John C. et al., "Improved Thermoelectric Converter Units and Power Generators", *Electronics Tech Briefs*, Dec. 1999.
Bates, Clayton W. Jr., "Low–temperature Thermionic Emitters Using Metal–Semiconductor Composites", *Materials Letters*, vol. 23, (Apr. 1995), pp. 1–5.
Collier, C.P. et al., "Electronically Configurable Molecular–Based Logic Gates", *Science*, vol. 285 (Jul. 16, 1999), pp. 391–394.
DiSalvo, Francis J., "Thermoelectric Cooling and Power Generation", *Science*, vol. 285 (Jul. 30, 1999), pp. 703–706.
Lin, T.P. et al., "Thermionic Emission Including Both Space–Ch arge and Image Forces", *Journal of Applied Physics*, vol. 85, No. 8 (Apr. 15, 1989), pp. 3205–3211.

(List continued on next page.)

*Primary Examiner*—Mark O. Budd
(74) *Attorney, Agent, or Firm*—Workman, Nydegger & Seeley

(57) ABSTRACT

Solid state thermionic energy converter semiconductor diode implementation and method for conversion of thermal energy to electric energy, and electric energy to refrigeration. In embodiments of this invention a highly doped n* region can serve as an emitter region, from which carriers can be injected into a gap region. The gap region can be p-type, intrinsic, or moderately doped n-type. A hot ohmic contact is connected to the n*-type region. A cold ohmic contact serves as a collector and is connected to the other side of the gap region. The cold ohmic contact has a recombination region formed between the cold ohmic contact and the gap region and a blocking compensation layer that reduces the thermoelectric back flow component. The heated emitter relative to the collector generates an EMF which drives current through a series load. The inventive principle works for hole conductivity, as well as for electrons.

72 Claims, 29 Drawing Sheets

U.S. PATENT DOCUMENTS

| | | | |
|---|---|---|---|
| 3,843,896 A | 10/1974 | Rason et al. ................... | 310/4 |
| 3,890,161 A | 6/1975 | Brown, III .................. | 136/212 |
| 3,899,696 A | 8/1975 | Fletcher et al. ................ | 310/4 |
| 3,983,423 A | 9/1976 | Rasor et al. ................... | 310/4 |
| 4,040,903 A | 8/1977 | Monroe, Jr. ................. | 176/39 |
| 4,047,093 A | 9/1977 | Levoy ........................... | 322/2 |
| 4,151,438 A | 4/1979 | Fitzpatrick et al. ......... | 310/306 |
| 4,188,571 A | 2/1980 | Brunson ...................... | 322/2 |
| 4,266,179 A | 5/1981 | Hamm, Jr. .................... | 322/2 |
| 4,280,074 A | 7/1981 | Bell ........................... | 310/306 |
| 4,281,280 A | 7/1981 | Richards ...................... | 322/2 |
| 4,298,768 A | 11/1981 | Israel et al. ................. | 136/202 |
| 4,303,845 A | 12/1981 | Davis ......................... | 310/306 |
| 4,323,808 A | 4/1982 | Davis ......................... | 310/306 |
| 4,346,330 A | 8/1982 | Lee et al. .................... | 315/150 |
| 4,368,416 A | 1/1983 | James .......................... | 322/2 |
| 4,373,142 A | 2/1983 | Morris ....................... | 310/306 |
| 4,528,417 A | 7/1985 | Chubb ........................ | 136/253 |
| 4,667,126 A | 5/1987 | Fitzpatrick .................. | 310/306 |
| 4,700,099 A * | 10/1987 | Iden ............................ | 310/306 |
| 4,755,350 A | 7/1988 | Kennel ....................... | 376/321 |
| 4,771,201 A | 9/1988 | Free ........................... | 310/306 |
| 4,927,599 A | 5/1990 | Allen ......................... | 376/321 |
| 5,028,835 A | 7/1991 | Fitzpatrick .................. | 313/14 |
| 5,327,038 A | 7/1994 | Culp .......................... | 310/306 |
| 5,459,367 A | 10/1995 | Davis ......................... | 310/306 |
| 5,492,570 A | 2/1996 | Homer-Richardson et al.. | 136/200 |
| 5,541,464 A | 7/1996 | Johnson et al. ............. | 310/306 |
| 5,572,042 A | 11/1996 | Thomas et al. ................ | 257/10 |
| 5,578,886 A | 11/1996 | Holmlid et al. ............ | 310/306 |
| 5,623,119 A | 4/1997 | Yater et al. ................. | 136/225 |
| 5,637,946 A | 6/1997 | Bushman .................... | 310/306 |
| 5,646,474 A | 7/1997 | Pryor ......................... | 313/310 |
| 5,722,242 A | 3/1998 | Edelson ........................ | 62/3.1 |
| 5,780,954 A | 7/1998 | Davis ......................... | 310/306 |
| 5,841,219 A | 11/1998 | Sadwick et al. ............ | 313/293 |
| 5,955,772 A | 9/1999 | Shakouri et al. ............ | 257/467 |
| 5,973,259 A | 10/1999 | Edelson ....................... | 136/254 |
| 5,981,071 A | 11/1999 | Cox ............................ | 428/408 |
| 5,994,638 A | 11/1999 | Edelson ...................... | 136/205 |
| 6,020,671 A | 2/2000 | Pento et al. ................. | 310/306 |
| 6,022,637 A * | 2/2000 | Wilson ........................ | 429/112 |
| 6,037,697 A | 3/2000 | Begg et al. .................. | 310/306 |
| 6,203,939 B1 * | 5/2001 | Wilson ........................ | 429/112 |

OTHER PUBLICATIONS

Mahan, G.D. et al., "Multilayer Thermionic Refrigerator and Generator", *Journal of Applied Physics*, vol. 83, No. 9 (May 1, 1998) pp. 4683–4689.

Mahan, G.D. et al., "Multilayer Thermionic Refrigeration", *Physical Review Letters*, vol. 80, No. 18 (May 4, 1998) pp. 4016–4019.

Rasor, Ned S., "VA. Technology of Thermoelectric and Thermionic Energy Conversion", *RASOR Associates Report*, (1989), pp. 397–414.

Rasor, Ned. S., "VB. Engineering Aspects of Thermionic Energy Conversion", *RASOR Associates Report*, (1989), pp. 415–439.

Shakori, Ali et al., "Heterostructure Integrated Thermionic Coolers", *Applied Physics Letters*, vol. 71, No. 9, (Sep. 1, 1997) pp. 1234–1236.

Capper, P., "Properties of Narrow Gap Cadmium–based Compounds", EMIS Datareviews, Series No. 10, 1994.

* cited by examiner

THERMAL DIODE FOR ENERGY CONVERSION

RELATED APPLICATIONS

This application claims priority to U.S. Provisional Patent Application Serial No. 60/213,564, filed on Jun. 22, 2000, and is a continuation in part of U.S. patent application Ser. No. 09/519,640, filed Mar. 6, 2000, which claims priority to provisional application Serial No. 60/123,900, filed Mar. 11, 1999, which applications are incorporated herein by specific reference.

BACKGROUND MATERIAL

1. Field of the Invention

This invention relates to the conversion of thermal energy to electric energy, and electric energy to refrigeration, and more particularly to a solid state thermionic converter using semiconductor diode implementation.

2. Relevant Technology

Thermionic energy conversion is a method of converting heat energy directly into electric energy by thermionic emission. In this process, electrons are thermionically emitted from the surface of a metal by heating the metal and imparting sufficient energy to a portion of the electrons to overcome retarding forces at the surface of the metal in order to escape. Unlike most other conventional methods of generating electric energy, thermionic conversion does not require either an intermediate form of energy or a working fluid, other than electric charges, in order to change heat into electricity.

In its most elementary form, a conventional thermionic energy converter consists of one electrode connected to a heat source, a second electrode connected to a heat sink and separated from the first electrode by an intervening space, leads connecting the electrodes to the electric load, and an enclosure. The space in the enclosure is either highly evacuated or filled with a suitable rarefied vapor, such as cesium.

The essential process in a conventional thermionic converter is as follows. The heat source supplies heat at a sufficiently high temperature to one electrode, the emitter, from which electrons are thermionically evaporated into the evacuated or rarefied-vapor-filled interelectrode space. The electrons move through this space toward the other electrode, the collector, which is kept at a low temperature near that of the heat sink. There the electrons condense and return to the hot electrode via external electric leads and an electric load connected between the emitter and the collector.

An embodiment of a conventional thermionic converter 100 is schematically illustrated in FIG. 1. These conventional devices typically comprise an emitter 110, or low electron-work-function cathode, a collector 112, or comparatively colder, high electron-work-function anode, an enclosure 114, suitable electric conductors 116, and an external load 118. Emitter 110 is exposed to heat flow 120 which causes this cathode to emit electrons 122, thus closing the electric circuit and providing an electric intensity to load 118. As indicated above, interelectrode space 130 in conventional thermionic converters is an evacuated medium or a rarified-vapor-filled medium.

The flow of electrons through the electric load is sustained by the temperature difference between the electrodes. Thus, electric work is delivered to the load.

Thermionic energy conversion is based on the concept that a low electron work function cathode in contact with a heat source will emit electrons. These electrons are absorbed by a cold, high work function anode, and they can flow back to the cathode through an external load where they perform useful work. Practical thermionic generators are limited by the work function of available metals or other materials that are used for the cathodes. Another important limitation is the space charge effect. The presence of charged electrons in the space between the cathode and anode will create an extra potential barrier which reduces the thermionic current. These limitations detrimentally affect the maximum current density, and thus present a major problem in developing large-scale thermionic converters.

Conventional thermionic converters are typically classified as vacuum converters or gas-filled converters. Vacuum converters have an evacuated medium between the electrodes. These converters have limited practical applications.

Embodiments in a first class of gas-filled converters are provided with a vaporized substance in the interelectrode space that generates positive ions. This vaporized substance is commonly a vaporized alkali metal such as cesium, potassium and rubidium. Because of the presence of these positive ions, liberated electrons can more easily travel from the emitter to the collector. The emitter temperature in these types of conventional devices is in part determined by the vaporization temperature of the substance that generates the positive ions. Generally, the emitter temperature should be at least 3.5 times the temperature of the reservoir of the positive ion generating substance if efficient production of ions is to be achieved in these conventional devices.

Embodiments in a second class of gas-filled converters are provided with a third electrode to generate ions. The gas in the interelectrode space in these conventional devices is an inert gas such as neon, argon and xenon. Although these converters can operate at lower temperatures, such as about 1500 K, they are more complex.

Typical conventional thermionic emitters are operated at temperatures ranging from 1400 to 2200 K and collectors at temperatures ranging from 500 to 1200 K. Under optimum conditions of operation, overall efficiencies of energy conversion range from 5 to 40%, electric power densities are of the order of 1 to 100 watts/cm$^2$, and current densities are of the order of 5 to 100 A/cm$^2$. In general, the higher the emitter temperature, the higher the efficiency and the power and current densities with designs accounting for radiation losses. The voltage at which the power is delivered from one unit of a typical converter is 0.3 to 1.2 volts, i.e., about the same as that of an ordinary electrolytic cell. Thermionic systems with a high power rating frequently consist of many thermionic converter units connected electrically in series. Each thermionic converter unit is typically rated at 10 to 500 watts.

The high-temperature attributes of thermionic converters are advantageous for certain applications, but they are restrictive for others. This is because the required emitter temperatures are generally beyond the practical capability of many conventional heat sources. In contrast, typical thermoelectric converters are operable at heat source temperatures ranging from 500 to 1500 K. However, even under optimum conditions, overall efficiencies of thermoelectric energy converters only range from 3 to 10%, electric power densities are normally less than a few watts/cm$^2$, and current densities are of the order of 1 to 100 A/cm$^2$.

From a physics standpoint, thermoelectric devices are similar to thermionic devices. In both cases a temperature gradient is placed upon a metal or semiconductor, and both cases are based upon the concept that electron motion is electricity. However, the electron motion also carries energy. A forced current transports energy for both thermionic and thermoelectric devices. The main difference between thermoelectric and thermionic devices is in the transport mechanism: ballistic and diffusive transport for thermionics and ohmic transport for thermoelectrics. Ohmic flow is microscopically diffusive, but not macroscopically so. The distinguishing feature is whether excess carriers are present. In thermoelectrics, the carriers normally present are responsible for current. In thermionics, the current is due to putting excess carriers in the gap. A thermionic device has a relatively high efficiency if the electrons ballistically go over and across the gap. For a thermionic device all of the kinetic energy is carried from one electrode to the other. The motion of electrons in a thermoelectric device is quasi-equilibrium and ohmic, and can be described in terms of a Seebeck coefficient, which is an equilibrium parameter.

In structures with narrow barriers, the electrons will not travel far enough to suffer collisions as they cross the barrier. Under these circumstances, the ballistic version of thermionic emission theory is a more accurate representation of the current transport. The current density is given by:

$$j = A_0 T^2 e^{\frac{-e\varphi}{k_B T}},$$

where $A_0$ is the Richardson's constant, $\varphi$ is the barrier height (electron work function), e is the electron charge, $k_B$ is Boltzmann's constant, and T is the temperature. Richardson's constant $A_0$ is given by $A_0 = (emk_B^2 T^2)/(2\pi^2 h^2)$, where m is the effective electron mass and h is reduced Plank's constant.

The foregoing electron current density equation provides quantitative language for explaining some of the observations described above. For example, this equation for the emission current shows that the rate of emission increases rapidly with temperature, and it decreases exponentially with the work function.

Solutions to the foregoing problems have been sought according to the present state of the art by using vacuum converters or gas-filled converters. Attempts to reduce space-charge effects with vacuum converters have involved the reduction of the interelectrode separation to the order of micrometers. Attempts to reduce the same effects with gas-filled converters have led to the introduction of positive ions into the cloud of electrons in front of the emitter. Nevertheless, these conventional devices still present shortcomings such as those related to limited maximum current densities and temperature regimes. Consequently, there remains a need to provide a more satisfactory solution to converting thermal energy to electric energy at lower temperature regimes with high efficiencies and high power densities.

SUMMARY OF THE INVENTION

The present invention was developed to fill a need for a device which efficiently converts thermal energy to electric energy at relatively low operating temperatures and with power densities and efficiencies high enough for commercial applications. The present invention also operates in reverse mode to provide efficient cooling.

The present invention seeks to resolve a number of the problems which have been experienced in the background art, as identified above. More specifically, the apparatus and method of this invention constitute an important advance in the art of thermionic power conversion, as evidenced by the following objects and advantages realized by the invention over the background art.

For example, one object of the present invention is to generate high power densities and efficiencies of a typical thermionic converter, but to operate at temperature regimes of typical thermoelectric devices.

A further object of the present invention is to perform energy conversion through thermionic emission using semiconductor thermal diode implementation.

Additional objects and advantages of the invention will be apparent from the description which follows, or may be learned by the practice of the invention.

Briefly summarized, the foregoing and other objects are achieved by a solid state thermionic converter utilizing semiconductor diode implementation comprising an emitter that preferably comprises an n*-type region; a gap region between the emitter and a collector, the gap region being preferably adjacent to said n*-type region; and a cold ohmic contact connected to said gap region, said cold ohmic contact having a recombination collector region formed between said cold ohmic contact and said gap region. In some embodiments of this invention a collector provides a recombination element and such collector is in electric communication with a cold ohmic contact. Preferably, a hot ohmic contact is in electric communication with the emitter. The gap region maybe n-type, p-type, or intrinsic. To use the electric current generated by embodiments of the converter of this invention, the electric circuit is typically closed externally with an electric load, preferably connected to the hot ohmic contact and the cold ohmic contact. It is understood that terms such as "electric communication", "electric connection" and "electric contact" refer to a relationship between elements whereby electric current can flow between such elements, whether such elements are in direct contact or the electric current flow is facilitated by at least one conductor linking such elements.

In the refrigeration embodiment, carrier transport is assisted by an external electric field. A first ohmic contact on the emitter, preferably comprising an n*-type region, is connected to a thermal load that is cooled by heat flow from electrons leaving the emitter. As described in connection with preferred embodiments of heat-to-electricity converters according to this invention, electrons in refrigeration embodiments preferably circulate from the emitter, preferably from a hot ohmic contact on the preferably n*-type region, to the gap region. A gap region is preferably adjacent to the emitter, and a second ohmic contact having a recombination collector region is preferably formed between the second ohmic contact and the gap region. The gap region in embodiments of this invention may be n-type, p-type, or intrinsic. A heat exchanger dissipates the heat from hot electrons on the second ohmic contact connected to the gap region.

BRIEF DESCRIPTION OF DRAWINGS

In order to more fully understand the manner in which the above-recited advantages and objects of the invention are obtained, a more particular description of the invention will be rendered by reference to specific embodiments thereof which are illustrated in the appended drawings. Understanding that these drawings depict only typical embodiments of the invention and are therefore not to be considered limiting of its scope, the presently preferred embodiments and the presently understood best mode of the invention will be described with additional detail through use of the accompanying drawings in which.

DETAILED DESCRIPTION OF THE INVENTION

Figure 2:
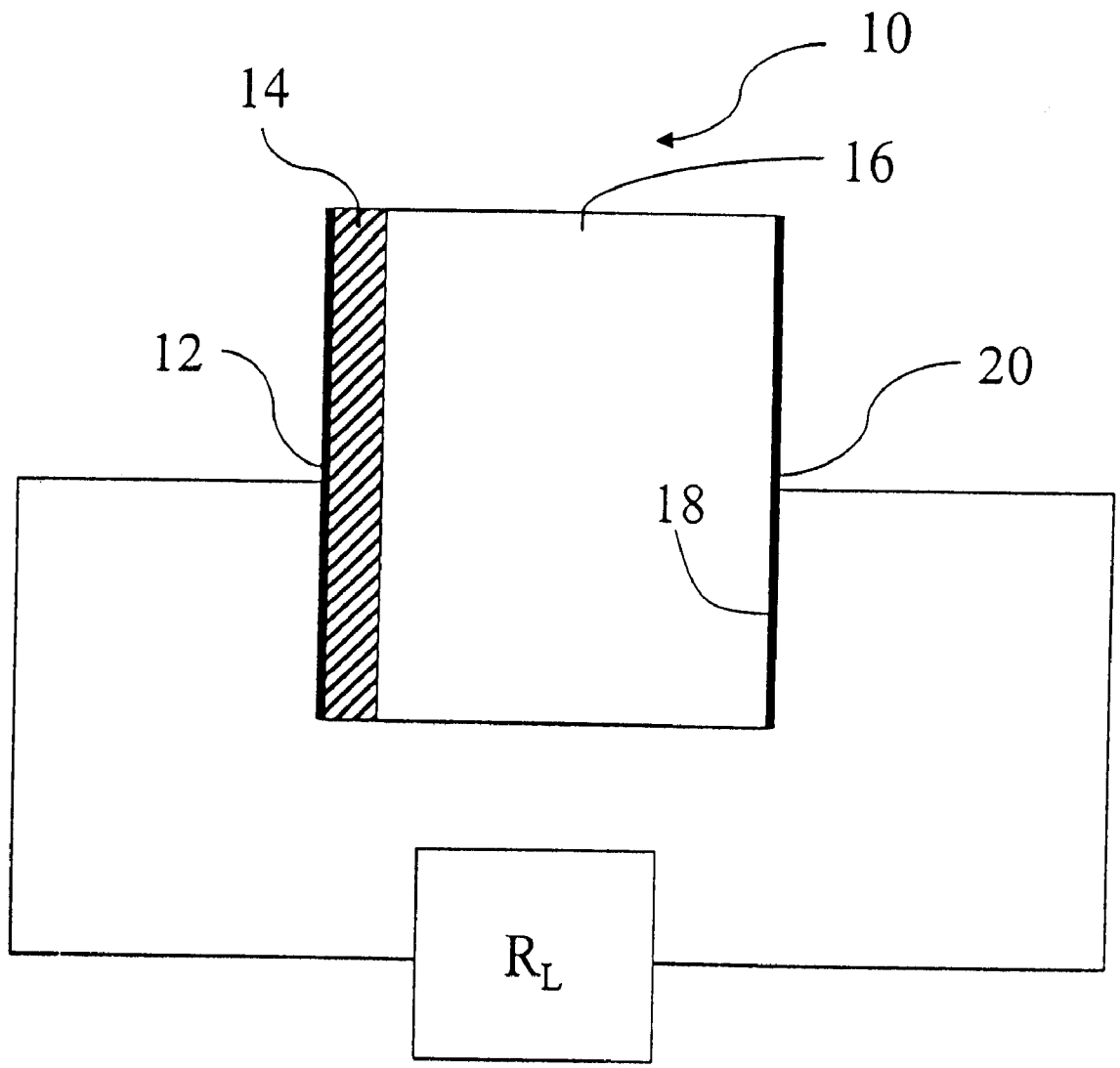
FIG. 2 is a cross-sectional view of a thermal diode of the present invention.

The present invention embodies a solid state thermionic energy converter 10, generally illustrated in FIG. 2, and is directed to a method and apparatus for the conversion of energy. A preferred embodiment of the inventive solid state thermionic energy converter 10 comprises a semiconductor diode having an n*-type region 14 as an emitter, a gap region 16 adjacent to the n*-type region 14, a hot ohmic contact 12 connected to said n*-type region 14, and a cold ohmic contact 20 being a collector and connected to said gap region 16. The cold ohmic contact 20 has a recombination collector region 18 formed between said cold ohmic contact 20 and said gap region 16.

The recombination region in some embodiments of this invention comprises a distinct layer. In other embodiments of this invention the recombination region is obtained by treating and/or damaging the surface of an ohmic contact or collector. Forming a recombination region in the context of this invention thus includes procedures for incorporating a recombination layer and procedures for treating and/or damaging the surface of an ohmic contact or collector.

The terms n*-region are used herein to refer to an n-region which has a higher electron concentration than a n-region. Illustrative embodiments of materials comprised in n*-regions are given below. A general characterization of the n*-region and n-region in terms of their relative donor number densities is provided hereinbelow (see Equation (2.22) and its discussion). Examples of n-type regions are provided by regions that include InSb doped with Te at a concentration from about $10^{16}$ cm$^{-3}$ to about $10^{19}$ cm$^{-3}$. Concentrations in the order of $10^{20}$ cm$^{-3}$ are also envisaged as characterizing the dopant concentration of materials in n-type regions in embodiments of this invention. Examples of n*-type regions are provided by regions that include InSb doped with Te at a concentration from about $10^{19}$ cm$^{-3}$ to about $3 \cdot 10^{19}$ cm$^{-3}$. Concentrations of about $3 \cdot 10^{20}$ cm$^{-3}$ are also envisaged as characterizing the dopant concentration of materials in n*-type regions in embodiments of this invention. In addition to Te, dopants in some other embodiments of the present invention include at least one of S, Se, and Sn. Furthermore, the symbol n** is used herein to refer to an n-region which has a higher electron concentration than an n*-region. Examples of n**-type regions are provided by regions that include a material such as In, Te, Ga, and Fe.

An electric load $R_L$ connected to hot ohmic contact 12 and to cold ohmic contact 20 is provided with the electric intensity generated by an embodiment of a converter according to this invention. The emitter may be a metal. The gap region 16 may be either moderately doped n-type, p-type, or intrinsic. Electrons are collected in the recombination collector region 18. The heated emitter relative to the collector generates an EMF which drives current through a series load.

It is also important to note that the inventive principle works for hole conductivity, as well as for electrons. Also, reference to metals herein includes alloys.

In contrast with conventional thermionic devices, embodiments of converters according to the present invention are solid-state devices. The prior art, however, teaches devices that rely on an evacuated interelectrode space or on a gas-filled interelectrode space. General characteristics of these conventional devices have been summarized above.

Instead of an evacuated or gas-filled space, embodiments of the present invention incorporate a semiconducting material. Semiconductors are valuable, not for their conductivity, but for two unusual properties. First, the concentration of free carriers, and consequently the conductivity, increases exponentially with temperature (approximately 5% per degree Celsius at ordinary temperatures). Second, the conductivity of a semiconductor can be increased greatly, and to a precisely controlled extent, by adding small amounts of impurities in the process called doping. Since there are two types of mobile charge carriers (electrons and holes), of opposite sign, extraordinary distributions of charge carriers can be created. The semiconductor diode utilizes this property. Semiconductors, pure or doped, p-type, or n-type, are bilateral; current flows in either direction with equal facility. If, however, a p-type region exists in close proximity to an n-type region, there is a carrier density gradient that is unilateral; current flows easily in one direction only. The resulting device, a semiconductor diode, exhibits a very useful control property of carrier transport that can be utilized for energy conversion.

The following written description and graphic material refer to analytic and numerical models of phenomena that are associated with working embodiments of the present invention. These models are not provided as limiting explanations of the present invention. It is understood that the present invention is not limited or restricted to any single explanation of its underlying physical processes. The purpose of setting forth the analytic and numerical models discussed below is to highlight relevant variables that can be used to design additional embodiments envisaged within the scope of the present invention, even though such embodiments are not explicitly referred to in the context of this written description. With these design tools, the teachings of this written description, and ordinary skill in the art, additional embodiments that are within the scope of the present invention and claims can be designed. Accordingly, the following written description and graphic material describe embodiments of the present invention and provide models that can be used for designing additional embodiments envisaged within the scope of the present invention.

The models set forth below include analytic and numerical models, and the implementation of such models to specific materials and embodiments of the present invention is also described below. It is understood that the headings in the following material are provided as guides for organization purposes and not as limiting or restrictive statements regarding this written description and figures, which are to be interpreted in their entirety as a whole.

The analytic model discussed below includes the derivation of expressions for the efficiency and the normalized current-voltage relation. It is also shown in the context of this model that the efficiency is a function of the dimensionless conductivity, which is in turn a function of material parameters and peak emitter doping. Material parameters are provided for a plurality of materials, and it is shown that InSb is a preferred material and that other materials can be used as semiconductors in embodiments of the present invention.

The numerical model discussed below provides a framework in which carrier injection from the heated emitter region into the gap region is studied. In addition to terminology and numerical solution techniques, basic equations in this model are introduced and solved.

Results for an InSb thermal diode are presented and discussed following the introduction of the analytical and numerical models because InSb is one of the preferred semiconductor materials for embodiments of the present invention. The behavior of the InSb embodiment is shown to be consistent with the injection of carriers from the emitter into a gap region, with allowed transport across the gap to the collector. These results are consistent with the efficiency depending on gap doping, as the gap doping determines barrier height and current flow. These results also show that efficiency optimization of a thermal diode according to the present invention using InSb can reach 5.5% with a 600 K emitter and an emitter electron density of $10^{20}$ cm$^{-3}$.

The following written description and figures also disclose compensation as a technique to increase efficiency in embodiments of the present invention. Compensation includes return current suppression. Methods for forming ohmic contacts in embodiments of the present invention are subsequently described.

Examples of embodiments of the present invention that comprise InSb with a compensation layer include InSb wafers with a n-type dopant, such as Te, and an emitter layer of Te implanted by a technique such as magnetron sputtering. The compensation layer in these embodiments is formed by p-type impurity implantation. This p-type impurity comprises at least one type of ions such as Ar and He ions, which compensate for the n-type dopant.

A more preferred material to build an n*/n emitter according to this invention comprises $Hg_{1-x}Cd_xTe$. For example, a $Hg_{0.86}Cd_{0.14}Te$ wafer is used in embodiments of this invention to build a n*/n emitter by reacting $Hg_{0.86}Cd_{0.14}Te$ with a n-type impurity substrate such as Al and In-Ga thus creating an electron injecting n* region. A preferred form of an In-Ga material for this purpose is $In_{0.75}Ga_{0.25}$. Embodiments with this emitter exhibit an output electric current density that increases as a function of the hot side temperature. It is shown below that these embodiments attain efficiencies that are above 30% of an ideal Carnot cycle efficiency.

$Hg_{1-x}Cd_xTe$ is part of a multi-plate or sandwich configuration in other embodiments of this invention. For example, an embodiment of these sandwiches comprises an InSb plate doped with an n-type material such as Te and an emitter layer of InSb sputtered with Te and coated with a material such as In-Ga, preferably $In_{0.75}Ga_{0.25}$. A second plate in this sandwich material comprises $Hg_{1-x}Cd_xTe$, where x is preferably 0.14.

Examples of embodiments according to the present invention include design parameters, uncompensated thermal diodes, compensated thermal diodes and Schottky diodes. Furthermore, converters according to the present invention include converters to convert thermal energy to electricity and refrigeration embodiments. As discussed hereinbelow, two types of embodiments include the same main components, whether they operate as thermionic converters for refrigeration or as thermal diodes for converting thermal energy into electricity.

It has been found in the context of this invention that $Hg_{1-x}Cd_xTe$ with x being from about 0.08 to about 0.15 exhibits a high thermionic figure of merit while remaining semiconductor and allowing an n* emitter layer/compensation layer design and behavior as described herein with respect to other materials. Furthermore, it has also been discovered in the context of this invention that $Hg_{0.92}Cd_{0.18}Te$ behaves as an excellent thermoelectric material.

1. The Solid State Thermionic Converter

The basic concept for the present invention is that a highly doped n* region 14 can serve as an emitter region, from which carriers can be boiled off into a gap region 16. The n* region is a semiconductor doped with a high concentration of donor (providing electrons) impurity. For example, InSb can be doped with Te or S. By itself, the dopant does not guarantee n-type conductivity, because it is positioned on quantum levels below the conductance band. For Te doping, these levels are spaced at an energy $E_t \sim 50$ meV from the bottom of the conductance band. As set forth in Sze, S. M., *Physics of Semiconductor Devices*. N.Y., John Wiley & Sons, 1981, pp. 16–27, work that is incorporated herein by reference, the ionized dopant concentration can be estimated for the case when the number of donor impurities $N_D$ is much larger than the number of acceptor impurities as follows:

$$n \cong \frac{1}{\sqrt{2}}(N_D N_C)^{1/2} e^{\frac{-E_D}{2k_B T}}$$

where T is the temperature, $k_B$ is Boltzmann's constant, $E_D$ is the impurity level spacing from the bottom of the conduction band or donor ionization energy, $N_D$ is the donor ionization energy, and $N_C$ is the effective density of states in the conduction band. The effective density of states is given by $$N_C = 2\left(\frac{2\pi m^* k_B T}{h^2}\right)^{3/2} M_c,$$

where h is Plank's constant, m* is the electron effective mass, and $M_c$ is the number of equivalent minima in the conduction band.

InSb band structure, for example, has two such minima. The spacing between the absolute minimum and the next one is about 0.5 eV, and at low temperatures $M_c$ is effectively unity. At temperatures higher than about 600 K, the second minimum becomes significant and $M_c$ is not unity.

These ionized electrons can be thermally injected into the gap region 18 through the interface barrier $\Phi_B$ and create a current i on an external load $R_L$. The i·R creates a voltage V which works against electron transport as an exponential factor $$e^{\frac{-qV}{kT}}.$$

The barrier height $\Phi_B$ also gives an exponential factor $$e^{\frac{-q\Phi_B}{k_BT}}.$$

Assuming a purely diffusive current, the pre-exponential factor in the forward current will be $$A\frac{qN_i^*D_N}{L},$$

where $D_N$ is the diffusion coefficient, A is the area factor, and L is the diffusion length. The resulting forward current is $$i_F \sim \frac{AqN_i^*D_N}{L}e^{\frac{-q\Phi_B}{k_BT_1}}e^{\frac{-qV}{k_BT_1}}. \quad (1.1)$$

This formula presumes a short gap region with linear diffusion. As the gap may be several hundred microns thick, there is the possibility of recombination effects occurring. This effect must be minimized. While recombination will result in a sharper electron profile and increase the prefactor, the price to be paid is high since the energetics associated with the replacement of the electron current with a hole current is unfavorable. The emitter work function is $\Phi$. The reverse current from the collector to the emitter is $$i_R = -\frac{AqD_nN_D^*}{L}e^{\frac{-q\Phi}{k_BT_0}}. \quad (1.2)$$

$T_o$ is the collector temperature. It is assumed that the interior area of the emitter is the same as the total area of the collector. It is also assumed that the collector and emitter regions are the same, so that the various prefactors are the same.

The total current i is composed of the forward and reverse currents, $i=i_F+i_R$. Making the approximation that the temperature dependence of the prefactors can be neglected, the diode law is $$i = \frac{AqD_nN_D^*}{L}\left[e^{\frac{-q(\Phi+V)}{k_BT_1}} - e^{\frac{-q\Phi}{k_BT_o}}\right]. \quad (1.3)$$

This equation can be viewed as an iV characteristic which is a function of two temperatures. When coupled with the load, there is in addition $V=iR_L$. These two separate equations define the operating point current and voltage, both of which are functions of the two temperatures.

The heat flow due to carrier diffusion is on the order of $$P_T = i_F\left(\Phi + V + \frac{3k_BT_1}{2q}\right) - i_R\left(\Phi + V + \frac{3k_BT_o}{2q}\right). \quad (1.5)$$

This carrier contribution to the heat flow can be thought of intuitively as follows: heat flow is generated one carrier at a time, and the focus is on the heat flow out of the emitter region to the collector. An electron that travels from the emitter to the gap must overcome the emitter-gap barrier $\Phi$ as well as the load voltage V, which will result in a local cooling of the emitter. This implies thermal power flow of $i_F(\Phi+V)$ out of the emitter. An electron that is viewed as part of the reverse current heats the emitter, and the associated local power into the emitter is $-i_R(\Phi+V)$. Electrons thermalize as they diffuse, so they are assumed always to be locally in equilibrium with the temperature of the semiconductor. Consequently, net current flow from one side to the other must also involve a net transfer of thermal energy that is proportional to the current flow and temperature difference. The mean carrier kinetic energy is $$\frac{3}{2}k_BT,$$

so that the net associated thermal power flow is $$\frac{3}{2}k_BT(i_F - i_R).$$

The phononic thermal power flow due to Fick's conduction law is defined as $P_k=K(T_1-T_2)$. This assumes a small temperature difference, as well as a constant thermal conductivity. The efficiency of this system is then $$\eta = \frac{P_k}{P_T + P_k},$$

where as indicated above, $P_T$ is the heat flow due to carrier diffusion, and $P_k$ is the phononic thermal power flow as given by Fick's conduction law.

A. Parameterization of the basic model

In order to identify the fundamental parameters of the system, the first task is to solve the iV characteristic. The current is eliminated to obtain $$V = \frac{R_LAqD_nN_D^*}{L}\left[e^{\frac{-q(\Phi+V)}{k_BT_1}} - e^{\frac{-q\Phi}{k_BT_o}}\right]. \quad (1.6)$$

This provides for identification of the important system parameters. The reduced potential and reduced voltage are defined according to $$\phi = \frac{q\Phi}{k_BT_o} \text{ and } v = \frac{qV}{k_BT_1}.$$

The dimensionless resistance $\xi$ is identified according to $$\xi = \frac{R_LAq^2D_nN_D^*}{Lk_BT_1}.$$

In terms of these parameters, the relation is $$v = \xi\left[e^{\frac{-\phi T_o}{T_1}}e^{-v} - e^{-\phi}\right],$$

which can be recast as $$v = \xi e^{-\phi}\left[e^{\frac{\phi(T_1-T_o)}{T_1}}e^{-v} - 1\right].$$

The absolute temperature difference $\Delta\tau$ is defined according to $$\Delta\tau = \frac{T_1 - T_o}{T_1}.$$

This leads then to the constraint $v=\xi e^{-\phi}[e^{\phi\Delta\tau}e^{-v}-1]$.
This normalized current-voltage relation is the same as that obtained in the idealized free streaming limit. Apparently, it is not a critical feature of the scheme that the electrons be free-streaming, as the diffusive model has an identical normalized current and voltage relation.

B. Efficiency including conduction loss effects

In the absence of conduction loss, this model corresponds closely to the free streaming limit of a thermionic model. All of the efficiency results apply to this model as well, as long as the conduction loss is not included. Consequently, attention is turned to a consideration of the degradation of the efficiency by conduction loss.

As shown above, the efficiency including conduction loss according to the simple model proposed here is $$\eta = \frac{P_\kappa}{P_T + P_\kappa}.$$

In terms of dimensionless quantities, this can be rewritten as $$\eta = \frac{v}{\phi(1-\Delta\tau) + v + (3/4)(2-\Delta\tau) + (3/4)\Delta\tau\coth[(\phi\Delta\tau - v)/2] + \chi\Delta\frac{\tau}{e^{-\phi}[e^{\phi\Delta\tau}e^{-v} - 1]}}.$$

In this equation, the dimensionless conductivity is $$\chi = \frac{\kappa}{k_B N_D^* D_n}.$$

Figure 3:
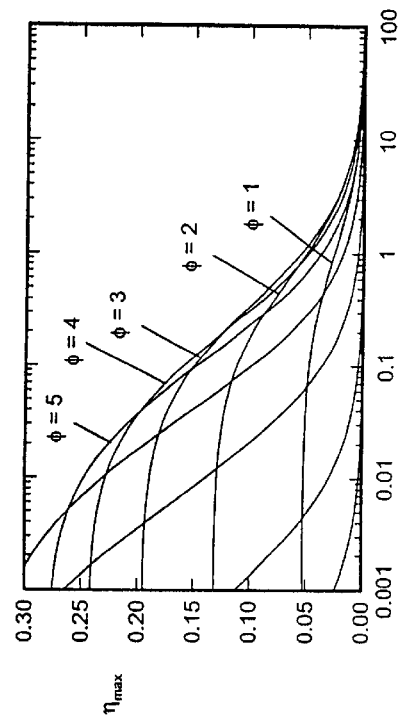
FIG. 3 is a plot of the efficiency as a function of the normalized conductivity $\chi$ for the case of $\Delta\tau=0.3$.
Figure 4:
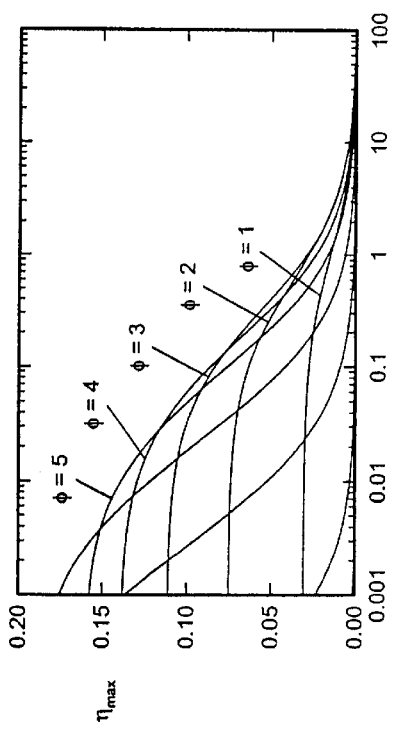
FIG. 4 is a plot of the efficiency as a function of the normalized conductivity $\chi$ for the case of $\Delta\tau=0.5$

The efficiency as a function of the normalized conductivity $\chi$ is illustrated in FIG. 3 for the case of $\Delta\tau=0.3$, for different values of the normalized barrier $\phi$. One sees that when the barrier is low, the system is more robust against thermal and electric losses, but the peak efficiency is correspondingly low. If the barrier is high, then the system is not robust against thermal loss, and a high efficiency becomes possible only if the thermal conduction is somehow very small. Consequently, one faces a compromise in which a moderate barrier will likely be optimum in the presence of relatively low loss. FIG. 4 illustrates the results for $\Delta\tau=0.5$.

C. Material Parameters

The results of the discussion above indicates that the maximum efficiency that can be obtained is a function of the dimensionless conductivity $\chi$, which is in turn a function of the material parameters and peak emitter doping. Before proceeding, the relevant material parameters need to be examined to determine whether the available semiconductors allow operation in physically interesting regimes.

Table 2 lists material parameters and the associated estimates of $\chi$. Values for the normalized conductivity $\chi$ are estimated using $N^*_D=10^{20}$ cm$^{-3}$. One observes a wide range (almost four orders of magnitude) of possible values of the normalized conductivity $\chi$. Data for the construction of this table were gathered from the *CRC Handbook of Chemistry and Physics,* $_{67}$th edition. Materials with small $\chi$ are more preferred. According to this criterion, a preferred material among the semiconductors listed in Table 2 is seen to be mercury selenide, with an associated value of $\chi=0.014$. According to FIG. 4, an efficiency that is optimized with respect to the barrier height will be able to reach about 13.3% for $\phi=5$ in the case of $\Delta\tau=0.3$. From FIG. 4, the corresponding maximum is 23.8% for $\phi=5$ in the case of $\Delta\tau=0.5$. These numbers are close to half of the thermodynamic maximum values.

TABLE 2

| Semiconductor | $\mu_e\left(\frac{cm^2}{V\,sec}\right)$ | $\kappa\left(\frac{W}{cm\,K}\right)$ | X |
|---|---|---|---|
| HgSe | 20000 | 0.010 | 0.014 |
| HgTe | 25000 | 0.020 | 0.022 |
| InSb | 78000 | 0.160 | 0.057 |
| CdSnAs2 | 22000 | 0.070 | 0.089 |
| InAs | 33000 | 0.290 | 0.25 |
| PbTe | 1600 | 0.023 | 0.40 |
| PbSe | 1000 | 0.017 | 0.47 |
| ZnO | 180 | 0.006 | 0.93 |
| PbS | 600 | 0.023 | 1.07 |
| GaAs | 8800 | 0.370 | 1.18 |
| GaSb | 4000 | 0.270 | 1.89 |
| CdO | 100 | 0.007 | 1.96 |
| Ge | 3800 | 0.640 | 4.72 |
| InP | 4600 | 0.800 | 4.87 |
| Si | 1900 | 1.240 | 18.3 |
| GaP | 300 | 1.100 | 103 |
| $Bi_{0.9}Te_{1-x}$ | 50,000 | 0.050 | 0.028 |
| $Se_xTe_{1-x}$ | 10,000 | 0.035 | 0.097 |
| Bi(∥trigon. axis) | 35,000 | 0.053 | 0.042 |

Figure 5:
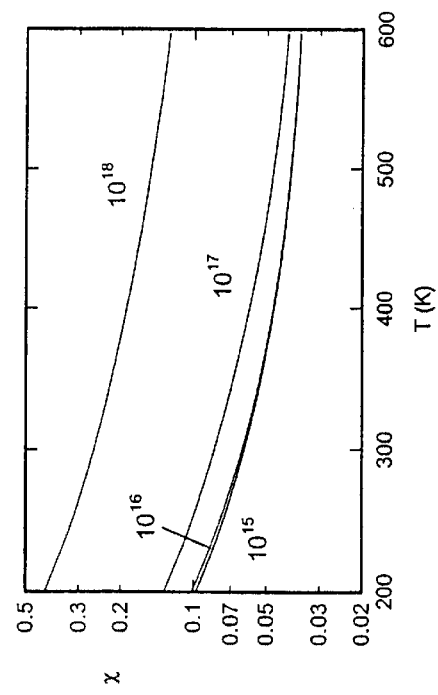
FIG. 5 is a plot of the normalized conductivity parameter $\chi$ as a function of temperature for InSb, assuming that $N_{D^*D}=10^{20}$ cm$^{-3}$.

Both the mobility and the thermal conductivity are, in general, functions of temperature. In InSb, both the mobility and the conductivity decrease with increasing temperature. The resulting temperature dependence of $\chi$ is illustrated in FIG. 5. FIG. 5 shows the normalized conductivity parameter $\chi$ (also referred to as "figure of merit") as a function of temperature for InSb, assuming that $N^*_D=10^{20}$ cm$^{-3}$. Results are shown for n-type gap regions with doping densities $N_D=10^{15}$, $10^{16}$, $10^{17}$, $10^{18}$ in units of cm$^{-3}$. The normalized conductivity is seen to decrease at higher temperature. In addition, the normalized conductivity decreases in the presence of background carriers, since the mobility of electrons in InSb decreases with increasing doping density.

Semiconductors listed in Table 2 are examples that include materials that can be used in embodiments of the present invention. InSb is a preferred material among these semiconductors. As it will be shown hereinbelow, $Hg_{1-x}Cd_x$Te is a more preferred semiconductor which exhibits a normalized conductivity parameter of about half the value of the same parameter for HgSe.

2. A Numerical Model in One Dimension

As stated previously, the emitter region is heated and carriers are injected into the gap region. The associated scale lengths are sufficiently large that the carrier flow in the gap region will be either by drift or by diffusion.

As indicated in the previous subsection, InSb is a preferred semiconductor in embodiments of the present invention, and consequently the following discussion refers to InSb as an example. It is understood, however, that reference to InSb is part of an illustrative example and that such reference to a specific material is not exclusive of other semiconductors.

InSb has a very high electron mobility (the effective electron mass is very small compared to the electron mass) while the corresponding heavy hole mobility is about average (the effective hole mass is on the general order of the electron mass). Consequently, the emitter is preferably a highly doped n* region, which will have a large supply of electrons that will be diffused/injected into the gap.

The gap region is very interesting in this type of scheme. The gap region may be intrinsic to enhance the electron mobility and perhaps to make a good analog to the vacuum thermionic system. This approach will lead to the presence of unscreened electrons in the gap region, which will produce an opposing potential that will be greater when more electrons are emitted. In essence, unscreened carrier injection into the gap would be expected to lead to a Debye screening problem, and intuition suggests that this would lead to a reduction in current flow. If so, p-type doping for the gap region may be desirable in order to provide background holes to screen the injected charge. To study this, the following one dimensional numerical model is proposed.

In the discussion of analytic modeling in the last section, the barrier height is taken as an independent parameter. In the kinds of structure considered here and in the following discussion, the barrier height is determined by the relative doping of the different regions. Control over the barrier height is implemented ultimately through the selection of the doping level of the gap region. The use of a p-type region leads to quite a large barrier relative to the barriers which gave the best results as discussed previously. Consequently, using an n-type gap region is utilized in order to fix the barrier height to be close to optimum. Charge injection from a hot n* emitter region into an n-type gap region is not a standard problem in semiconductor device design. Therefore, a numerical model is proposed that will aid in the analysis of such problems.

a. The static thermal semiconductor equations in one dimension

To proceed, the static thermal semiconductor equations are required in one space dimension. These are:

Gauss's law:

$$\frac{d}{dx}(\varepsilon E) = \rho \tag{2.1}$$

Charge density constitutive laws:

$$\rho = q(p - n + N_d^+ - N_a^-) \tag{2.2}$$

Current continuity equations:

$$-\frac{1}{q}\frac{d}{dx}J_n = G_n - U_n \tag{2.3}$$

$$\frac{1}{q}\frac{d}{dx}J_p = G_p - U_p \tag{2.4}$$

Current constitutive laws:

$$J_n = q\mu_e nE + qD_e\frac{dn}{dx} - q\mu_e n\alpha_n\frac{dT}{dx} \tag{2.5}$$

$$J_p = q\mu_h pE - qD_h\frac{dp}{dx} - q\mu_h p\alpha_p\frac{dT}{dx} \tag{2.6}$$

Conservation of thermal energy:

$$\frac{d}{dx}Q - (J_n + J_p)E = S \tag{2.7}$$

The $(J_n + J_p)E$ term enters this equation with a minus sign since the work done against the field goes into work done on the load resistance. The net result is that energy is taken out of the thermal degrees of freedom.

A glossary of conventional symbols used in semiconductor equations is given as follows:

∈: Dielectric constant

E: Electric field
x: Position
ρ: Charge density
q: Magnitude of the electron charge
n: Electron concentration
p: Hole concentration
$N_d^+$: Ionized donor concentration
$N_a^+$: Acceptor ion concentration
$N_d$: Donor concentration in a gap region
$N_d^*$: Donor concentration in an emitter region
$J_n$: Electron current
$J_p$: Hole current
$G_n$: Rate of generation of electrons per unit volume
$G_p$: Rate of generation of holes per unit volume
$U_n$: Rate of recombination of electrons per unit volume
$U_p$: Rate of recombination of holes per unit volume
$\mu_e$: Electron mobility
$\mu_h$: Hole mobility
$D_e$: Diffusion coefficient for electrons
$D_h$: Diffusion coefficient for holes
$\alpha_n$: Electron thermopower
$\alpha_p$: Hole thermopower
Q: Thermal heat flux
S: Thermal heat source b. Zero-current conditions In the absence of current flow, the semiconductor electron and hole concentrations will take on local thermal equilibrium values. The equilibrium relations, Equations (2.5)–(2.6), for the carrier concentrations can be found directly from a solution of the current constitutive relations with appropriate functional dependencies of the mobility, diffusivity and thermopower.

Figure 6:
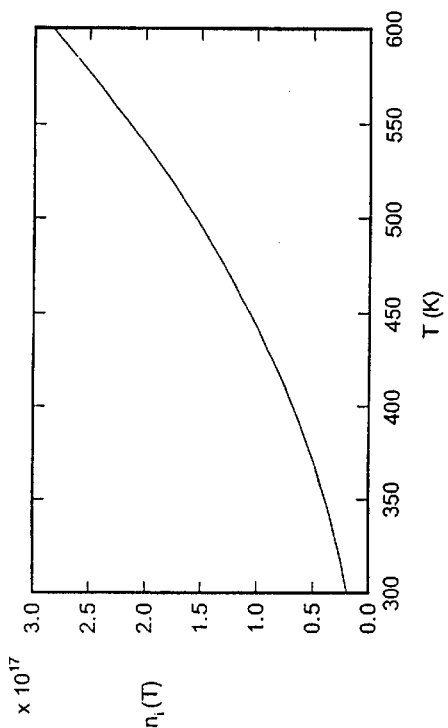
FIG. 6 is a plot of the intrinsic carrier density for InSb between 300 K and 600 K.

The following assumes that Maxwellian distributions are appropriate:

$$n = n_i(T)e^{\frac{q\phi}{k_B T}} \tag{2.8}$$

$$p = n_i(T)e^{\frac{-q\phi}{k_B T}} \tag{2.9}$$

where $n_i(T)$ is the intrinsic carrier density, and where Φ is now the thermodynamic potential energy. This model presumes the presence of parabolic bands. The intrinsic carrier density is given by $$n_i(T) = \sqrt{N_C(T)N_V(T)}\, e^{\frac{-E_g}{2k_B T}} \sim T^{\frac{3}{2}} e^{\frac{-E_g}{2k_B T}}. \tag{2.10}$$

where $N_C$ is the effective density of states for the conduction band, and $N_V$ is the effective density of states for the valence band. In the case of InSb, $n_i(T)$ is evaluated to be $$n_i(T) = 4.9 \times 10^{15}\left(\frac{m_{de}m_{dh}}{m_0^2}\right)^{\frac{3}{4}} T^{\frac{3}{2}} e^{\frac{-E_g}{2k_B T}} = 1.0 \times 10^{14} T^{\frac{3}{2}} e^{\frac{-E_g}{2k_B T}}\, \text{cm}^{-3}. \tag{2.11}$$

where $m_{de}$ is the effective electron diffusive mass and $m_{dh}$ is the effective hole diffusive mass. The intrinsic carrier density for the relevant temperature regime is plotted in FIG. 6.

The conduction band in the case of InSb is known not to be parabolic. The dispersion relation of the valence band is given by $(h^2k^2)/(2m_0^*) = E(1 + E/E_g)$, where $m_0^*$ is the effective mass at the minimum energy point of the conduction band. In the gap region, the electron concentration will be low and the electrons will be thermal, so that a parabolic approximation may provide a reasonable approximation. In the highly doped n* region, the effects of a non-parabolic band structure are expected to be seen. Relevant to the modeling, a reduction of the barrier height, relative to that computed from a parabolic model, is expected to be the primary impact.

C. The nonlinear Poisson equation

The equilibrium carrier densities can be utilized to develop a nonlinear Poisson equation for this model. Gauss¢s law can be recast in terms of the electric potential Φ:

$$\frac{d^2}{dx^2}\phi = \frac{q}{\varepsilon}[p - n + N_d^+ - N_a^-] \tag{2.12}$$

where $$E = -\frac{d\phi}{dx}.$$

In the case of zero current flow, it is convenient to reference the electric potential to the thermodynamic potential, in which case the carrier concentrations become $$n = n_i(T) e^{\frac{q\phi}{k_BT}}, \text{ and} \tag{2.8}$$

$$p = n_i(T) e^{\frac{-q\phi}{k_BT}}. \tag{2.9}$$

Combining these equations leads to the nonlinear Poisson equation $$\frac{d^2}{dx^2}\phi = \frac{2qn_i(T)}{\varepsilon}\left[\sinh\left(\frac{q\phi}{k_BT}\right) - \frac{N_d^+ - N_a^-}{2n_i(T)}\right]. \tag{2.13}$$

This is now a temperature-dependent version of the nonlinear Poisson equation that frequently appears in the analysis of diodes and bipolar transistors.

It is convenient to define normalized variables for the nonlinear Poisson equation so that we may obtain a normalized version of the equation. The normalized potential is defined as $$u = \frac{q\phi}{k_B T_{\max}},$$

where $T_{max}$ is the maximum temperature at the emitter. The nonlinear

Poisson equation in terms of u becomes $$\frac{d^2}{dx^2}u = \frac{1}{\lambda_D^2(T_{\max})}\left[\tau^{\frac{3}{2}} e^{\frac{u_g}{2}(1-\frac{1}{\tau})}\sinh\left(\frac{u}{\tau}\right) - c\right]. \tag{2.14}$$

where the temperature-dependent intrinsic Debye length $\lambda_D(T)$ is defined through $$\frac{1}{\lambda_D(T)} = \frac{2q^2 n_i(T)}{\varepsilon k_B T}. \tag{2.15}$$

The relative temperature τ is $$\tau = \frac{T}{T_{\max}}. \tag{2.16}$$

The normalized dopant concentration is $$c = \frac{N_d^+ - N_a^-}{2n_i(T_{\max})}. \tag{2.17}$$

The normalized gap energy is $$u_g = \frac{E_g}{k_B T_{\max}}. \tag{2.18}$$

Figure 7:
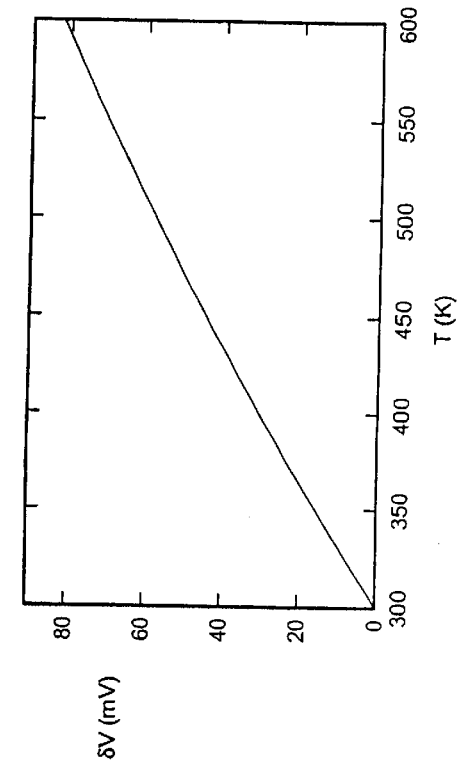
FIG. 7 is a plot of the normalized potential vs x for model doping concentrations with a linear temperature gradient.

The temperature-dependent nonlinear Poisson equation is not difficult to solve numerically. Solutions are illustrated in FIG. 7 under conditions where the doping concentration is given by $$N_d^+ - N_a^- = 10^{20} e^{-(\frac{x}{1\mu})^2} \text{ cm}^{-3} - N_a \tag{2.19}$$

with $N_a$ taken to be $5\times10^{18}$, $10^{17}$, 0, and $-10^{17}$ in units of cm$^{-3}$. In this case the temperature profile was taken to be linear across the thermal diode, with T=350 K at the emitter side at x=0, and T=300 K at the collector side at x=10 μ. The symbol "μ" is used herein to mean μm, or micrometer. One observes that the barrier height is determined by the doping concentration. In the case where there are $5\times10^{18}$ holes/cm$^{-3}$ in the gap region, the barrier height is over 17 k$_B$T$_{max}$. From the discussion given above, it is known that this barrier is sufficiently great that the associated efficiency will be degraded. A barrier on the order of 7 k$_B$T$_{max}$ is preferred. FIG. 7 illustrates that such a low barrier would correspond to n-type doping in the gap region. FIG. 7 shows the normalized potential versus x for model doping concentrations with a linear temperature gradient.

A symmetric npn structure might be provided with an imposed temperature gradient. Furthermore, the collector and emitter regions may somehow ideally be connected to a material with a very tiny thermally-induced EMF. As the Debye length is on the order of 10 Ångstroms away from the depletion layer, it is a good approximation to take the local normalized thermodynamic potential to be $$u = \tau\sinh^{-1}\left[e^{-\frac{u_g}{2}(1-\frac{1}{\tau})}\tau^{-\frac{3}{2}}c\right] \approx \tau\ln\left[2e^{-\frac{u_g}{2}(1-\frac{1}{\tau})}\tau^{-\frac{3}{2}}c\right]. \tag{2.20}$$

The logarithmic approximation given is useful for positive c. This can be used to estimate the potential barrier between the emitter and a p-type gap in terms of the relative doping concentrations, which results in $$\Delta u = \ln\left[\frac{N_d^+ N_a^-}{n_i^2(T_{\max})}\right]. \tag{2.21}$$

The barrier in embodiments of this invention is up to about 7, preferably in the range from about 1.5 to about 7, and more preferably from about 3 to about 7. Unfortunately, it is not possible to achieve this for InSb in the absence of an independent gap bias for a p-type gap region in the vicinity of room temperature. In the case of an n* emitter to n-type gap region, the barrier height is $$\Delta u = \ln\left[\frac{N_d^*}{N_d}\right]. \qquad (2.22)$$

A normalized barrier height of 5–7 corresponds to a doping ratio of $e^5$–$e^7$, which evaluates numerically to 150–1100. If the n* region is doped to a level of $10^{20}$ cm$^{-3}$, then the gap region doping should be in the range of $9\times10^{16}$ cm$^{-3}$ to $7\times10^{17}$ cm$^{-3}$.

The EMF potentially available from this idealized structure can be estimated using this kind of approximation, which results in $$\delta u \approx \ln\left[\frac{N_d^+}{n_i(T_{\max})}\right] - \tau_{\min}\ln\left[\frac{N_d^+}{n_i(T_{\min})}\right]. \qquad (2.23)$$

Figure 8:
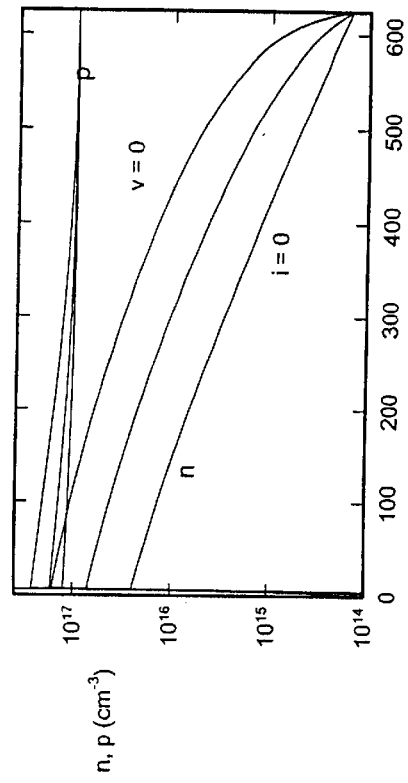
FIG. 8 illustrates the induced EMF between the emitter and collector for an idealized InSb symmetric structure with $N_d^+=10^{20}$.

The corresponding EMF in terms of $\delta V$ for $Nd_d^+$ is illustrated in FIG. 8. FIG. 8 illustrates induced EMF between the emitter and collector for an idealized InSb symmetric structure with $N_d^+=10^{20}$. The collector is assumed to be at room temperature. One observes that the EMF in this case is not very large. In fact, it is the same EMF that would be obtained if the semiconductor were used as a thermoelectric.

The situation when current flow is present is now considered. For simplicity, the gap region is assumed to be sufficiently narrow that recombination can be neglected. In this case, the lossless semiconductor equations are used, which are written in the form:

Gauss's law:

$$\frac{d^2}{dx^2}\phi = -\frac{q}{\varepsilon}(p - n + N_d^+ - N_a^-) \qquad (2.24)$$

Current continuity equations:

$$\frac{d}{dx}J_n = 0 \qquad (2.25)$$

$$\frac{d}{dx}J_p = 0 \qquad (2.26)$$

Current constitutive laws:

$$J_n = -q\mu_e n\frac{d\phi}{dx} + qD_e\frac{dn}{dx} - q\mu_e n\alpha_n\frac{dT}{dx} \qquad (2.27)$$

$$J_p = -q\mu_h p\frac{d\phi}{dx} - qD_h\frac{dp}{dx} - q\mu_h p\alpha_p\frac{dT}{dx} \qquad (2.28)$$

Conservation of thermal energy:

$$\frac{d}{dx}Q - (J_n + J_p)E = S \qquad (2.7)$$

To proceed, the current constitutive laws must be recast into a more convenient form. Recall that the carrier concentrations are taken at their equilibrium values when zero current flow is present. In light of this, the electron current constitutive law should be able to be written in the general form:

$$J_n = [\ldots]\frac{d}{dx}\left[\frac{n}{n_i(T)e^{\frac{q\phi}{k_BT}}}\right]. \qquad (2.29)$$

In this form, if the electron concentration is locally in equilibrium, then the current density is identically zero. Comparing this form with the constitutive law given above results in $$J_n = qD_e n_i(T)e^{\frac{q\phi}{k_BT}}\frac{d}{dx}\left[\frac{n}{n_i(T)e^{\frac{q\phi}{k_BT}}}\right]. \qquad (2.30)$$

The analogous equation for the hole current is similarly $$J_p = -qD_h n_i(T)e^{\frac{-q\phi}{k_BT}}\frac{d}{dx}\left[\frac{n}{n_i(T)e^{-\frac{q\phi}{k_BT}}}\right]. \qquad (2.31)$$

These results can be used to compute electron and hole thermopowers as follows:

$$\alpha_n = -\frac{\phi}{T} + \frac{\phi_g}{2T} + \frac{3}{2}\frac{k_B}{q} \qquad (2.32)$$

where $E_g = q\Phi_g$. In the case of holes, the equation is $$\alpha_p = -\frac{\phi}{T} - \frac{\phi_g}{2T} - \frac{3}{2}\frac{k_B}{q}. \qquad (2.33)$$

Figure 9:
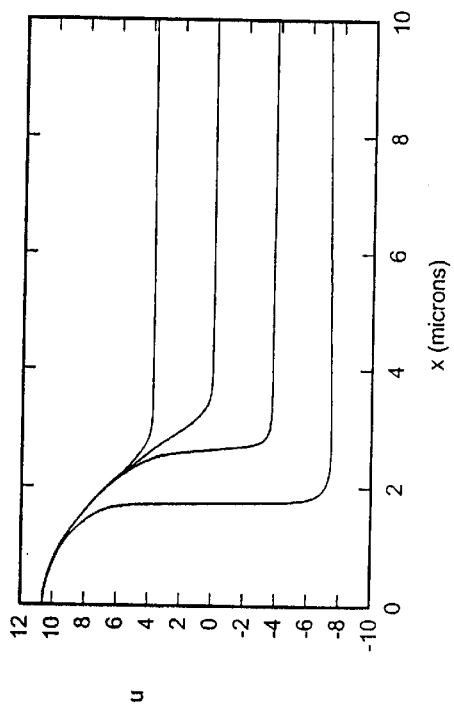
FIG. 9 illustrates the computed thermopowers for electrons and holes for a thermal diode example with $N_a^-=5\times10^{18}$.

FIG. 9 illustrates the computed thermopowers for electrons and holes for a thermal diode example with $N_a^- = 5\times 10^{18}$.

Issues pertaining to energy conservation must be attended to. The first of these is that it is possible to connect the difference in the thermal heat flow to the load power at a fundamental level.

It is assumed that there are no energy sources within the semiconductor, so that $$\frac{d}{dx}Q - J_T E = 0 \qquad (2.34)$$

where $J_T = J_n + J_p$. After integration, the result is $$\int_{x_o}^{x_n}\frac{dQ}{dx}dx - \int_{x_o}^{x_n}J_T E\,dx = 0. \qquad (2.35)$$

The computational boundaries are assumed at $x_o$ on the emitter side, and $x_n$ on the collector side. The first integral is an integration over a derivative, which simply yields the difference in the heat flux at the two boundaries. The second integral can be analyzed using integration by parts $$\int_{x_o}^{x_n}J_T E\,dx = -\int_{x_o}^{x_n}J_T\frac{d\phi}{dx}dx = -[\phi(x)J_T(x)]_{x_o}^{x_n} + \int_{x_o}^{x_n}\left[\frac{dJ_T}{dx}\right]\phi\,dx. \qquad (2.36)$$

The latter integral is zero because the total current is conserved. Consequently, it can be written $$Q(x_n) - Q(x_o) + J_T[\phi(x_n) - \phi(x_o)] = 0. \qquad (2.37)$$

The loss in heat flux is balanced exactly by the product of the current density and the voltage drop, which is equivalent to the load power divided by the area. Whatever heat flux enters the device either emerges at the other end or else goes into driving the load. This is a particularly useful relation.

These results are also valid for incremental changes in x, so that the following constraint may be used equivalently $$\frac{d}{dx}Q + \frac{d}{dx}(J_T\phi) = 0. \quad (2.38)$$

The second important issue relating to energy conservation is the development of the heat flux in terms of the temperature gradient and the current densities. It is known that there are contributions to the total heat flux from lattice phonons, electrons and holes $$Q = Q_L + Q_n + Q_p. \quad (2.39)$$

The lattice heat flux is given in terms of the lattice $$Q_L = -\kappa_L \frac{dT}{dx}. \quad (2.40)$$

The lattice contribution to thermal conductivity $\kappa_L$ is available from the literature for InSb, and the data has been fitted to use in this model.

In the absence of current flow, there exists a carrier contribution to the thermal conductivity which is approximated by $$Q_{n,p} = \kappa_{n,p} \frac{dT}{dx} \quad (2.41)$$

where $\kappa_n = Lq\mu_e nT$ and $\kappa_p = Lq\mu_h pT$.

The parameter L in this equation is given (assuming acoustic deformation scattering) by $$L = \left[\frac{k_B}{q}\right]^2 \left[2 + \left(4 + \frac{E_G}{k_B T}\right)^2 \frac{\mu_e/\mu_h}{(1+\mu_e/\mu_h)^2}\right]. \quad (2.42)$$

In the presence of current flow, the thermal flux should be modified since each carrier transports a thermal energy 3/2 $k_B T$. Including this leads to the overall result $$Q = -\kappa \frac{dT}{dx} + \frac{3}{2}\frac{k_B T}{q}(J_p - J_n) \quad (2.43)$$

where the total thermal conductivity $\kappa$ is made up of three contributions $\kappa = \kappa_L + \kappa_n + \kappa_p$. This leads to the modified energy conservation equation $$-\frac{d}{dx}\left(\kappa \frac{dT}{dx}\right) + \frac{3}{2}\frac{d}{dx}\left[\frac{k_B T}{q}(J_p - J_n)\right] + \frac{d}{dx}(J_T\phi) = 0. \quad (2.44)$$

d. Normalized equations

The normalized equations below are based on the normalizations given above, augmented with the normalized nonequilibrium carrier densities $$\eta = \frac{n}{n_i(T_{max})}, \text{ and} \quad (2.45)$$

-continued $$\rho = \frac{p}{n_i(T_{max})}. \quad (2.46)$$

In terms of the normalized quantities, this leads to Gauss's law:

$$\frac{d^2}{dx^2}u = \frac{1}{\lambda_D^2(T_{max})}\left\{\tau^{\frac{3}{2}}e^{\frac{u_g}{2}(1-\frac{1}{\tau})}\left[\frac{\eta-\rho}{2}\right]-c\right\}. \quad (2.47)$$

The current continuity equations will be directly implemented numerically, so that there is no need to normalize the current densities. The current constitutive laws can be written in terms of normalized carrier densities.

Current constitutive laws:

$$J_n = qD_e n_i(T_{max})\tau^{\frac{3}{2}}e^{\frac{u_g}{2}(1-\frac{1}{\tau})}e^u \frac{d}{dx}\left[\frac{\eta}{\tau^{\frac{3}{2}}e^{\frac{u_g}{2}(1-\frac{1}{\tau})}e^u}\right], \text{ and} \quad (2.48)$$

$$J_p = -qD_h n_i(T_{max})\tau^{\frac{3}{2}}e^{\frac{u_g}{2}(1-\frac{1}{\tau})}e^{-u} \frac{d}{dx}\left[\frac{\rho}{\tau^{\frac{3}{2}}e^{\frac{u_g}{2}(1-\frac{1}{\tau})}e^{-u}}\right]. \quad (2.49)$$

Conservation of thermal energy:

$$-\frac{d}{dx}\left(\kappa T_{max}\frac{d\tau}{dx}\right) + \left[\frac{3k_B T_{max}}{2q}\right]\frac{d}{dx}[\tau(J_p - J_n)] - \frac{d}{dx}(J_T\phi) = 0. \quad (2.50)$$

e. Discretization

To develop numerical solutions for these equations a discretization scheme is required. The discretization of the semiconductor equations have been considered by many authors. At this point the numerical solution of the equations presents no particular difficulty. The only real questions have to do with whether to use uniform zoning or a nonuniform grid, and whether to go to the effort of developing a higher order discretization or not. For simplicity, a uniform grid is used with low order differencing. This has the advantage of reducing development time for the code. Further work in this area, if necessary, would presumably go toward implementing a numerical scheme based on a nonuniform grid.

The discretization of the nonlinear Poisson equation can be done trivially to $O(h^2)$ on a uniform grid using $$\frac{u_{j+1} - 2u_j + u_{j+1}}{h^2} = \frac{1}{\lambda_D^2(T_{max})}\left\{\tau^{\frac{3}{2}}e^{\frac{u_g}{2}(1-\frac{1}{\tau})}\left[\frac{\eta-\rho}{2}\right]-c\right\}_j. \quad (2.51)$$

The finite difference approach in this case is equivalent to the use of finite elements.

The following uses a minor variation on the approach that is normally used on the current continuity equations. The basic idea is that the continuity equation in the absence of recombination implies for the electron current $$(J_n)_{j+\frac{1}{2}} = (J_n)_{j-\frac{1}{2}}. \quad (2.52)$$

Typically, the current density is eliminated in favor of carrier concentrations. It is well known that simply using the constitutive laws in this application leads to significant discretization errors since the carrier density can vary over several orders of magnitude. Instead, it has become customary to use integral relations to relate the current density to the carrier density. The basic approach, modified for these equations, involves starting with the constitutive law in the form $$J_n = qD_e n_i(T)e^{\frac{q\phi}{k_B T}} \frac{d}{dx}\left[\frac{n}{n_i(T)e^{\frac{q\phi}{k_B T}}}\right] \quad (2.30)$$

and then integrating to obtain $$\int_{x_j}^{x_{j+1}} \frac{J_n}{qD_e n_i(T)e^{\frac{q\phi}{k_B T}}} dx = \left[\frac{n}{n_i(T)e^{\frac{q\phi}{k_B T}}}\right]_{x_j}^{x_{j+1}}. \quad (2.53)$$

In the absence of recombination, the current density is constant through the region, and we can solve for $(J_n)_{j+\frac{1}{2}}$ to obtain $$(J_n)_{j+\frac{1}{2}} = \frac{\left[\frac{n}{n_i(T)e^{\frac{q\phi}{k_B T}}}\right]_{j+1} - \left[\frac{n}{n_i(T)e^{\frac{q\phi}{k_B T}}}\right]_j}{\int_{x_j}^{x_{j+1}} \frac{1}{qD_e n_i(T)e^{\frac{q\phi}{k_B T}}} dx}. \quad (2.54)$$

The integral in the denominator can be approximated to low order using $$\int_{x_j}^{x_{j+1}} \frac{1}{qD_e n_i(T)e^{\frac{q\phi}{k_B T}}} dx \approx \quad (2.55)$$

$$\frac{1}{q(D_e)_{j+\frac{1}{2}} n_i(T_{\max})\tau_{j+\frac{1}{2}}^{\frac{3}{2}}} \int_{x_j}^{x_{j+1}} e^{\left(\frac{u_g}{2}-u\right)/t} dx.$$

This presumes that the exponential factors give the fastest dependence on x to the integrand. Assuming that the argument of the exponential can be taken to be linear over the zone, the approximation obtained is $$\int_{x_j}^{x_{j+1}} \frac{1}{qD_e n_i(T)e^{\frac{q\phi}{k_B T}}} dx \approx$$

$$\frac{h}{q(D_e)_{j+\frac{1}{2}} n_i(T_{\max})\tau_{j+\frac{1}{2}}^{\frac{3}{2}}} \frac{e^{\left(\frac{u_g}{2}-u_{j+1}\right)/\tau_{j+1}} - e^{\left(\frac{u_g}{2}-u_j\right)/\tau_j}}{\left(\frac{u_g}{2}-u_{j+1}\right)/\tau_{j+1} - \left(\frac{u_g}{2}-u_{j+1}\right)/\tau_j}.$$

Using these results, the continuity equation becomes $$\frac{q(D_e)_{j+\frac{1}{2}} n_i(T_{\max})\tau_{j+\frac{1}{2}}^{\frac{3}{2}}}{h} \frac{\left[\frac{\eta e^{-u/\tau}}{\tau^{\frac{3}{2}}e^{\left(\frac{u_g}{2}-u\right)/\tau}}\right]_{j+1} - \left[\frac{\eta e^{-u/\tau}}{\tau^{\frac{3}{2}}e^{\left(\frac{u_g}{2}-u\right)/\tau}}\right]_j}{\frac{e^{\left(\frac{u_g}{2}-u_{j+1}\right)/\tau_{j+1}} - e^{\left(\frac{u_g}{2}-u_j\right)/\tau_j}}{\left(\frac{u_g}{2}-u_{j+1}\right)/\tau_{j+1} - \left(\frac{u_g}{2}-u_{j+1}\right)/\tau_j}} = \quad (2.56)$$

$$\frac{q(D_e)_{j-\frac{1}{2}} n_i(T_{\max})\tau_{j-\frac{1}{2}}^{\frac{3}{2}}}{h} \frac{\left[\frac{\eta e^{-u/\tau}}{\tau^{\frac{3}{2}}e^{\left(\frac{u_g}{2}-u\right)/\tau}}\right]_j - \left[\frac{\eta e^{-u/\tau}}{\tau^{\frac{3}{2}}e^{\left(\frac{u_g}{2}-u\right)/\tau}}\right]_{j-1}}{\frac{e^{\left(\frac{u_g}{2}-u_j\right)/\tau_j} - e^{\left(\frac{u_g}{2}-u_{j-1}\right)/\tau_{j-1}}}{\left(\frac{u_g}{2}-u_j\right)/\tau_j - \left(\frac{u_g}{2}-u_{j-1}\right)/\tau_{j-1}}}.$$

This equation is a numerically simple three-term relation for the normalized electron concentration $\eta$. A similar equation is obtained for the normalized hole concentration as follows:

$$\frac{q(D_h)_{j+\frac{1}{2}} n_i(T_{\max})\tau_{j+\frac{1}{2}}^{\frac{3}{2}}}{h} \frac{\left[\frac{\rho e^{-u/\tau}}{\tau^{\frac{3}{2}}e^{\left(\frac{u_g}{2}+u\right)/\tau}}\right]_{j+1} - \left[\frac{\rho e^{-u/\tau}}{\tau^{\frac{3}{2}}e^{\left(\frac{u_g}{2}+u\right)/\tau}}\right]_j}{\frac{e^{\left(\frac{u_g}{2}+u_{j+1}\right)/\tau_{j+1}} - e^{\left(\frac{u_g}{2}+u_j\right)/\tau_j}}{\left(\frac{u_g}{2}+u_{j+1}\right)/\tau_{j+1} - \left(\frac{u_g}{2}+u_{j+1}\right)/\tau_j}} = \quad (2.57)$$

$$\frac{q(D_h)_{j-\frac{1}{2}} n_i(T_{\max})\tau_{j-\frac{1}{2}}^{\frac{3}{2}}}{h} \frac{\left[\frac{\rho e^{-u/\tau}}{\tau^{\frac{3}{2}}e^{\left(\frac{u_g}{2}+u\right)/\tau}}\right]_j - \left[\frac{\rho e^{-u/\tau}}{\tau^{\frac{3}{2}}e^{\left(\frac{u_g}{2}+u\right)/\tau}}\right]_{j-1}}{\frac{e^{\left(\frac{u_g}{2}+u_j\right)/\tau_j} - e^{\left(\frac{u_g}{2}+u_{j-1}\right)/\tau_{j-1}}}{\left(\frac{u_g}{2}+u_j\right)/\tau_j - \left(\frac{u_g}{2}+u_{j-1}\right)/\tau_{j-1}}}.$$

The energy equation, written in terms of the temperature, can be discretized without difficulty to give $$\kappa_{j+\frac{1}{2}}(\tau_{j+1}-\tau_j) - \kappa_{j-\frac{1}{2}}(\tau_j-\tau_{j-1}) -$$

$$\frac{3}{4}\frac{k_B h(J_p - J_n)}{q}(\tau_{j+1}-\tau_{j-1}) - \frac{1}{2}\frac{k_B h J_T}{q}(u_{j+1}-u_{j-1}) = 0$$

The differential equation for the temperature equation (2.50) is seen to be a perfect differential of a lower order equation. It could reasonably be asked as to why not take advantage of this to reduce the equation to a first order equation, and develop a correspondingly simpler discretization scheme. It is somewhat more convenient to work with the second order system assuming that the temperatures are fixed at the boundaries. The second order system has two linearly independent solutions, which allows the specification of both of the boundary conditions. Working with a first order version of the equation can also handle two boundary conditions.

We should note that the energy equation described hereinabove does not conserve entropy. However, additional work using a more advanced model that incorporates entropy conservation gives similar results, with the efficiency numbers differing only by small factors from the corresponding efficiency numbers obtained with the foregoing formulae.

3. Results for the InSb Thermal Diode

Analytic estimates have been described above for the solid state thermionic converter based on a semiconductor implementation, along with the presentation of a detailed numerical model that can be used for simulating such systems. This section presents the numerical results. There are numerous questions that might be asked. For example, the analytic model is based on the notion that carriers are injected from the emitter into the gap region. Can it be verified that the thermal semiconductor equations support such an effect using the numerical model? The analytic model predicts a current and voltage characteristic for the thermal energy converter that is similar to that of a diode.

Does the numerical model also predict the same kind of current and voltage relation even qualitatively? In electronics applications, electrons injected into a p-type region diffuse as a minority carrier. In the present invention, it will prove to be convenient to inject electrons into an n-type gap region. The analytic model is based on diffusion of these excess carriers across the gap region. It is of interest to understand whether a diffusion model is relevant in this limit, and whether injected carriers can make it to the collector. Once these various issues are understood, there remains the question of the peak efficiency that such a system can obtain.

An issue that needs to be addressed concerns the specific emitter and collector configuration to be analyzed. While a symmetric emitter and collector configuration was analyzed above, the successful operation of such a design requires that the electron mobility be constant or increasing as a function of temperature. A realistic model for the mobility has a decreasing mobility as a function of temperature, which means that we must reduce the emission of the collector in order to get net thermionic energy conversion. The following discussion focuses on non-symmetric "diode"—like configurations, in which an emitter injects carriers into the gap as before, but where the collector injects electrons only at a level consistent with equilibrium carrier densities near the collector contact. If injection from the collector is significant, then it can be suppressed by reducing the supply of available carriers from which this current is derived.

Considered first are designs in which the carrier concentration at the collector is assumed to be in equilibrium, with no excess carrier injection assumed to occur from the metal contact. Such a model can be specified mathematically through the use of an equilibrium boundary condition at the collector boundary. Some thought must go into the physical implementation of such a boundary condition. An ohmic contact with a metal that has a large work function, and hence deeper occupied electronic states, would likely suppress collector emission. An alternative approach might be to create a relatively thin layer with a high recombination rate, which would force the carrier concentrations to take on equilibrium values. For example, if the collector side of the gap were damaged by rare gas ion bombardment prior to metallization, there would be a large concentration of defects that would produce a high recombination rate.

Referring again to FIG. 2, the emitter is the hot n* region 14 to the left. The gap region 16 is a thick region in the center, which may be either n-type or p-type (although it is found that the efficiency is higher if the gap is n-type). The collector is depicted here as a metal contact 20 that is cold.

The designs outlined above succeed in developing a significant thermionic energy conversion efficiency. This efficiency is ultimately limited by the presence of an ohmic return current due to the thermoelectric response of the semiconductor. If this return current could be suppressed, then a substantial increase in efficiency would be obtained. One scheme for doing so involves compensating the n-type substrate with p-type doping to produce a nearly intrinsic layer in front of the collector contact in embodiments of the present invention, thus reducing dramatically the supply of available electrons that would initiate an ohmic return current. This approach is considered in the following section. Within the numeric model, this approach appears to be successful, although a trade-off is apparent in that too much p-type compensation can restrict the flow of thermionic current to the collector. The calculations show that there is a small window within parameter space in which a compensated layer can be matched with the gap doping so as to simultaneously allow for nearly free thermionic current flow and nearly zero ohmic return current flow. The resulting designs have a very high predicted efficiency for energy conversion, and may be competitive with the best of the thermoelectrics. As there exists other semiconductors with better mobility to thermal conduction ratios (such as HgSe and HgTe), the compensated diode scheme may have the potential to develop conversion efficiencies well in excess of the best thermoelectrics. As will be shown hereinbelow,— see for example the discussion regarding FIG. 46—compensation layers developed in the context of this invention showed a significantly improved performance for materials such as InSb. This improvement was quantified in an increase in efficiency by a factor of about 2. For $Hg_{1-x}Cd_xTe$, this improvement translates into efficiencies that approach the absolute limit of 50% of an ideal Carnot cycle efficiency.

Because these and other embodiments of compensated diodes, with such semiconductors that exhibit high mobility to thermal conduction ratios, can be designed by one with ordinary skill in the art in light of the teachings and examples provided herein, they are envisaged within the scope of the present invention.

A. Carrier injection

The premise of preferred designs of the present invention is that carriers are boiled off from a hot emitter region into the gap region, where they transport to the collector region. This section focuses on the issue of carrier injection from emitter into gap region, with three different choices of gap region type (p-type, intrinsic, and n-type). Electron injection into a p-type gap region would result in a much simpler problem to analyze, but there exists a significant barrier which occurs in the depletion region. The optimum efficiency occurs when the barrier is on the order of $4 k_B T$. The barrier between an n* emitter and a p-type gap is closer to $8-9 k_B T$. Consequently, to inject a larger number of carriers, a lower barrier is needed. Lower barriers occur with moderate n-type gap regions, but then one must understand carrier injection of a majority carrier.

Figure 10:
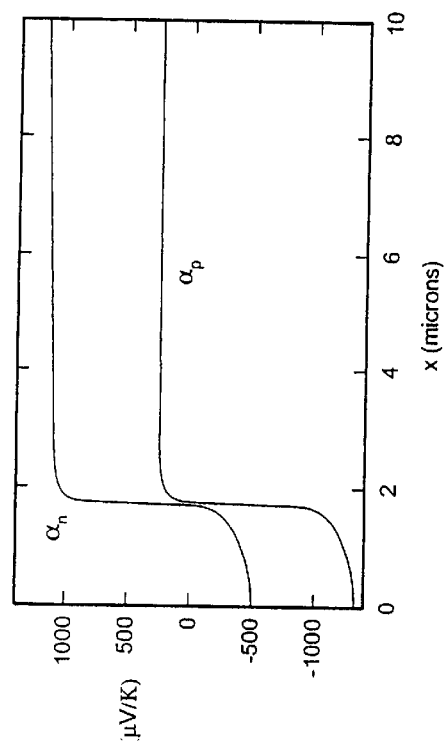
FIG. 10 shows electron and hole concentrations for an n*pn* thermionic structure in InSb, where the donor concentration in the emitter and collector regions is $10^{20}$ cm$^{-3}$, and the acceptor concentration in the gap region is $10^{17}$ cm$^{-3}$.

In the case of thermal electron ejection into a p-type gap region, the analysis of the npn bipolar junction transistor can be used in order to have confidence that this is basically correct. The prior numerical model can also be used to examine this situation. FIG. 10 illustrates numerical solutions for charge emission from a hot n*-type emitter into a p-type gap region. It is seen that electrons are emitted into the gap region and screened by the majority carrier holes, and the minority carrier transport occurs primarily through diffusion. The holes act to screen the field in the gap region.

A significant reduction in the barrier height occurs when the gap region is intrinsic. As the injected carrier densities can be significant, a lightly doped n-type gap region is utilized with $10^{14}$ cm$^{-3}$ donors that will simulate an intrinsic gap region. This simulated intrinsic gap region will have a lower potential barrier than a pure intrinsic gap region. Results for carrier injection in this case are illustrated in FIG. 10. FIG. 10 shows electron and hole concentrations for an n*pn* thermionic structure in InSb. The donor concentration in the emitter and collector regions is $10^{20}$ cm$^{-3}$, and the acceptor concentration in the gap region is $10^{17}$ cm$^{-3}$. The emitter is at 600 K, and the collector is at 300 K. Three cases are illustrated: open circuit i=0 (equilibrium) with no carrier injection; short circuit v=0 with maximum current; and an intermediate case with v equal to half the open circuit voltage. It is seen that the electron and hole densities become very nearly equal, which implies that charge neutrality holds in the gap region to within what can be discerned on a graph of this type. It is thus verified numerically that charge injection into an intrinsic region is possible within the detailed model discussed in the last section. While it might have anticipated significant Debye screening and charge accumulation effects into the gap region, this seems not to occur. Electrons injected into the gap region appear to be able to transport to the collector region.

Figure 11:
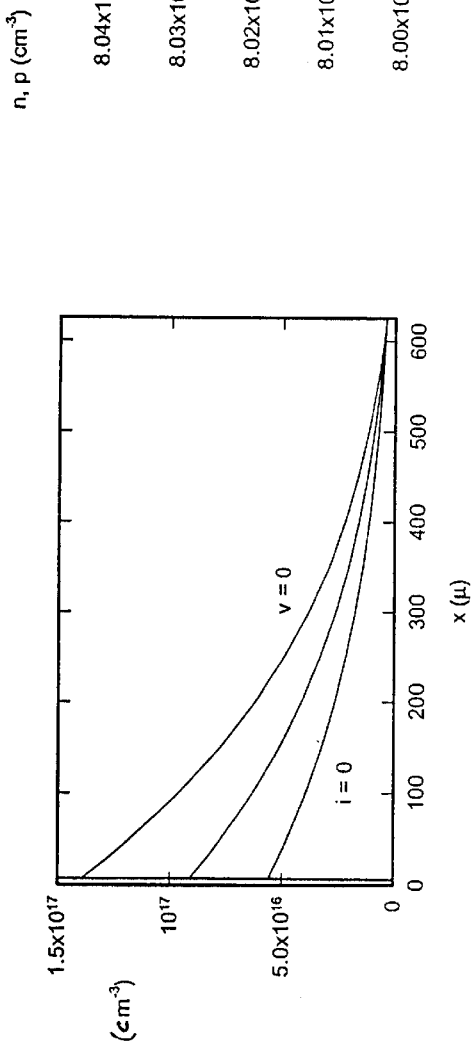
FIG. 11 shows electron concentrations for an n*nn* thermionic structure in InSb, where the donor concentration in the emitter and collector regions is $10^{20}$ cmn$^{-3}$, and the donor concentration in the gap region is $10^{14}$ cm$^{-3}$.

Results for carrier injection in this case are further illustrated in FIG. 11. FIG. 11 shows electron concentrations for an n*nn* thermionic structure in InSb. The donor concentration in the emitter and collector regions is $10^{20}$ cm$^{-3}$, and the donor concentration in the gap region is $10^{14}$ cm$^{-3}$. The emitter is at 600 K, and the collector is at 300 K. Three cases are illustrated: open circuit i=0 (equilibrium) with no carrier injection; short circuit v=0 with maximum current; and an intermediate case with v equal to half the open circuit voltage. It is seen that the electron and hole densities become very nearly equal, which implies that charge neutrality holds in the gap region to within what can be discerned on a graph of this type. It is thus verified numerically that charge injection into an intrinsic region is possible within the detailed model discussed previously. While significant Debye screening and charge accumulation effects into the gap region might have been anticipated, this seems not to occur. Electrons injected into the gap region appear to be able to transport to the collector region without difficulty.

Figure 12:
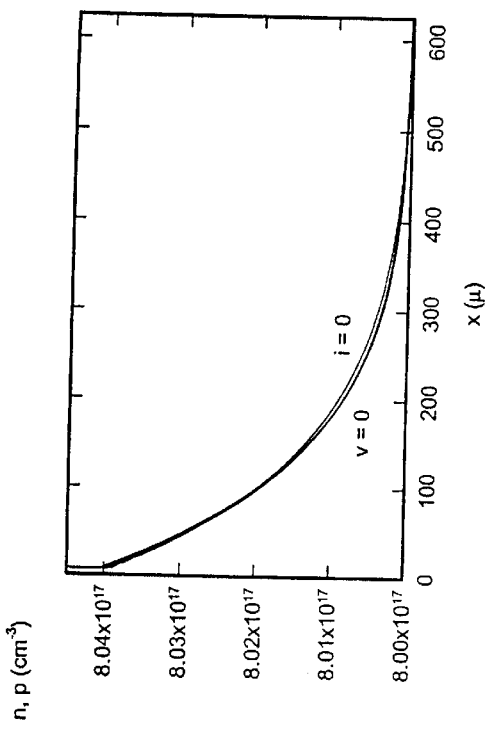
FIG. 12 shows electron and hole concentrations for an n*nn* thermionic structure in InSb, where the donor concentration in the emitter and collector regions is $10^{20}$ cm$^{-3}$, and the donor concentration in the gap region is $8\times10^{17}$ cm$^{-3}$.

The case where carriers are injected from an n*-type emitter region into a moderately-doped n-type gap region is now examined. The numerical results are illustrated in FIG. 12. FIG. 12 shows electron and hole concentrations for an n*nn* thermionic structure in InSb. The donor concentration in the emitter and collector regions is $10^{20}$ cm$^{-3}$, and the donor concentration in the gap region is $8 \times 10^{17}$ cm$^{-3}$. The emitter is at 600 K, and the collector is at 300 K. Three cases are illustrated: open circuit i=0 (equilibrium) with no carrier injection; short circuit v with maximum current; and an intermediate case with v equal to half the open circuit voltage. It is observed that electron injection occurs, and that the transport still looks more or less diffusive.

The results presented above show that electron injection from an n* emitter region into the gap region occurs as expected in the case of a p-type gap, and also in both intrinsic and in n-type gap regions. Injection into a p-type gap region would be expected to follow a diode law. Heating the emitter region relative to the collector leads to a thermally-generated EMF. The collector in this configuration plays the same role as a metallized contact in a diode. Consequently, the current could be calculated directly from a diode law as was done in the analytic modeling. However, electron injection into intrinsic and n-type gap regions is now considered, for which there would be no reason a priori to expect a diode law to be satisfied. It is therefore of interest to investigate whether diode-type behavior extends into the new regimes, and what kinds of modifications might be expected.

Figure 14:
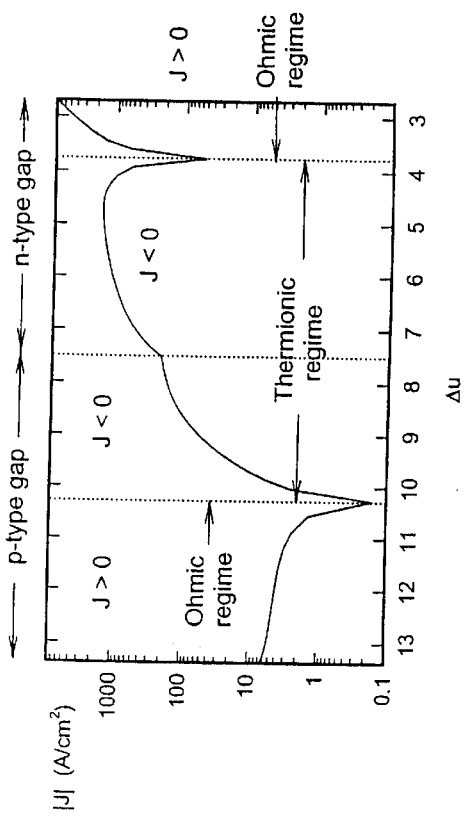
FIG. 14 shows short circuit current as a function of normalized barrier height for the structures considered above with $T_{max}=600$ K and $\Delta\tau=0.5$.
Figure 13:
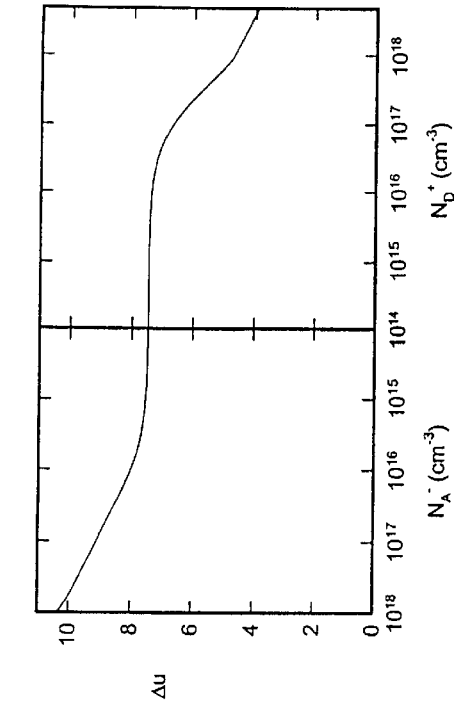
FIG. 13 shows the normalized barrier height $\Delta u=q\Delta\phi/k_BT_{max}$ as a function of the doping concentration.

To carry out such a study, current versus voltage characteristics are required, except that in the thermal energy converter there does not appear to be an adjustable voltage. The barrier height may be adjusted through a selection of the doping characteristic of the gap region. FIG. 13 illustrates the normalized barrier height for the example considered above as a function of the gap doping. FIG. 13 shows the normalized barrier height $\Delta\mu = q\Delta\phi/k_B T_{max}$ as a function of the doping concentration. The emitter is assumed to be doped to have $10^{20}$ electrons/cm$^3$. The donors and acceptors in the gap are assumed to be completely ionized. Using this result as a mapping between doping and barrier height, the numerical model is used to simulate the short circuit current as a function of gap doping, and then create a plot of the magnitude of the current as a function of barrier height. The result is illustrated in FIG. 14. FIG. 14 shows short circuit current as a function of normalized barrier height for the structures considered above with $T_{max}$=600 K and $\Delta\tau$=0.5. It is observed that the diode law is obeyed in the p-type regime away from intrinsic. It is also seen that, qualitatively, generic diode-type law behavior persists well into n-type regime. Such behavior is consistent with the postulated injection of carriers from emitter into gap region, with allowed transport across the gap to the collector. This provides a numerical verification that the general approach appears to be sound, and that the analytic modeling developed for this system based on diode-law behavior should be relevant.

B. The Current-Voltage Relation, Power and Efficiency

Having established the basic thermionic effect, attention now turns to the basic issue of the optimization of the efficiency. While it is possible to run the simulation for all relevant design parameters and carry out a purely numerical optimization, it may be useful to consider the systematic behavior of the solutions in order to understand what the numerical optimization is doing. For example, an examination of the current and voltage characteristic shows an approximate linear relation with offset, as might be expected from a voltage source and resistor. The optimization of the load power in this case is particularly simple. The thermal power that enters the device has a nearly constant offset due to the various Fick's law conduction terms, and an additional contribution due to the presence of current flow. Such a simple form for the thermal power allows for the development of a good approximate relation for the efficiency. An analytic optimization can be carried out, which is perhaps more illuminating as to what is going on in the device than the pure numerical optimization, which is in agreement with the analytic result.

Figure 15:
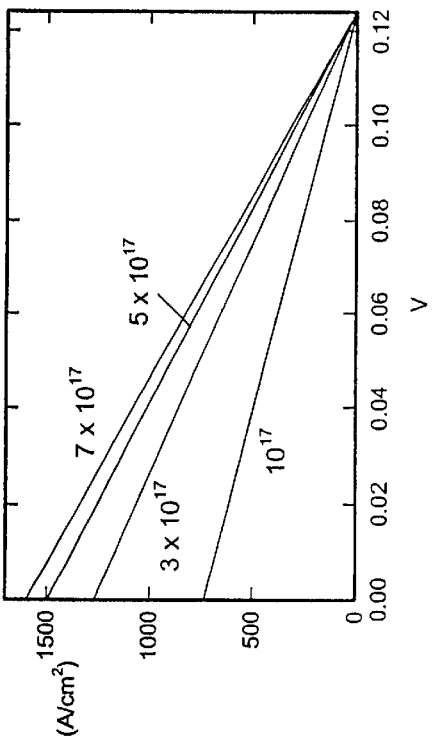
FIG. 15 shows current and voltage characteristic for a 625 $\mu$ thick InSb design, with an emitter electron concentration of $10^{20}$ electrons/cm$^3$, an emitter temperature $T_{max}=600$ K and a collector temperature $T_{min}=300$ K.

The following begins with an examination of the numerical results for the current and voltage relation. Illustrated in FIG. 15 are representative curves that result from the numerical model. FIG. 15 shows current and voltage characteristic for the 625 $\mu$ thick InSb example considered above, with an emitter electron concentration of $10^{20}$ electrons/cm$^3$, an emitter temperature $T_{max}$=600 K and a collector temperature $T_{min}$=300 K. Calculations are shown for gap donor densities of $10^{17}$ (the lowest curve on the plot), $3 \times 10^{17}$, $5 \times 10^{17}$ and $8 \times 10^{17}$ (the highest curve on the plot) in units of cm$^{-3}$. It is shown that to within an excellent approximation, the current and voltage relations are linear. It is also noted that as defined above, electrons boiled off of the emitter will give rise to a negative current, as well as a negative open circuit voltage. FIG. 15 plots the magnitude of both current and voltage.

For the purpose of the optimization arguments that will follow, the current density as an arbitrary function of voltage is given approximately by $$J(v) = J_s\left(1 - \frac{v}{v_o}\right) \quad (3.1)$$

where $J_s$ is the short circuit current density, and where $v_o$ is the open circuit voltage.

The power delivered to the load per unit area is $$Q_L = J(v)v = J_s v\left(1 - \frac{v}{v_o}\right). \quad (3.2)$$

Figure 16:
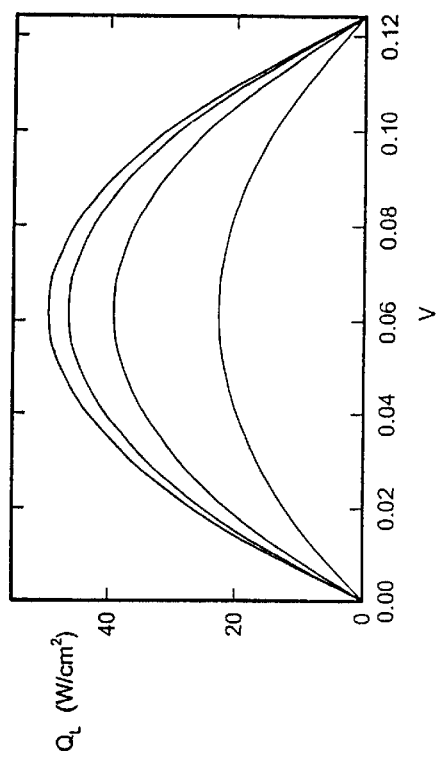
FIG. 16 shows the load power per unit area for a 625 $\mu$ thick InSb design, with an emitter electron concentration $10^{20}$ electrons/cm$^3$, an emitter temperature $T_{max}=600$ K and a collector temperature $T_{min}=300$ K.

The current density in the computations is negative, corresponding to electron flow from left (emitter) to right (collector). The corresponding thermally induced voltage is positive. Consequently, we require J(v) and $J_s$ to be defined here relative to the load, so that they are both positive when thermal power is being converted to electric load power. The numerical results of FIG. 16 agree well with this approximation. FIG. 16 shows the load power per unit area for the 625 $\mu$ thick InSb example considered above, with an emitter electron concentration $10^{20}$ electrons/cm$^3$, an emitter temperature $T_{max}$=600 K and a collector temperature $T_{min}$=300 K. Calculations are shown for gap donor densities of $10^{17}$ (the lowest curve on the plot), $3\times10^{17}$, $5\times10^{17}$ and $7\times10^{17}$ (the highest curve on the plot) in units of cm$^{-3}$.

Figure 17:
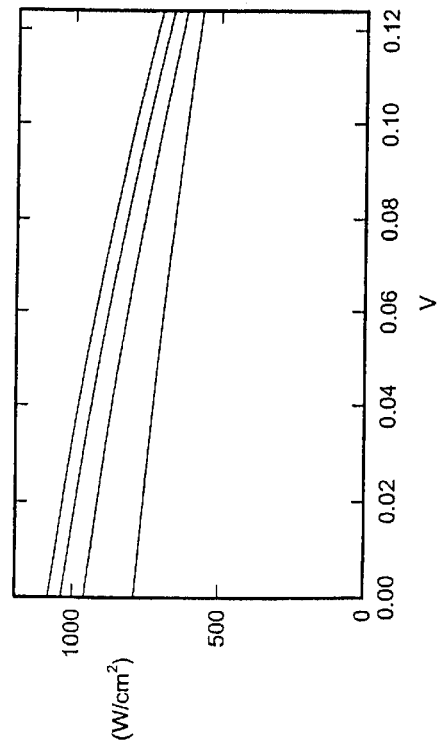
FIG. 17 shows the thermal power dissipated per unit area as a function of voltage for a 625 $\mu$ thick InSb design, with an emitter electron concentration $10^{20}$ electrons/cm$^3$, an emitter temperature $T_{max}=600$ K and a collector temperature $T_{min}=300$ K.

The thermal power per unit area dissipated by the device for the conditions used in the previous examples is illustrated in FIG. 17. FIG. 17 shows the thermal power dissipated per unit area for the 625 $\mu$ thick InSb example considered above, with an emitter electron concentration $10^{20}$ electrons/cm$^3$, an emitter temperature $T_{max}$=600 K and a collector temperature $T_{min}$=300 K. Calculations are shown for gap donor densities of $10^{17}$ (the lowest curve on the plot), $3\times10^{17}$, $5\times10^{17}$ and $7\times10^{17}$ (the highest curve on the plot) in units of cm$^{-3}$. It is seen that the power is composed of a constant Fick's Law contribution at zero current (at the open circuit voltage), and a term linear in the current (and hence linear in the voltage). To within an excellent approximation, the dissipated power per unit area is $$Q = Q_o + \frac{dQ}{dJ}J \quad (3.3)$$

where $Q_o$ is the open circuit thermal power flow per unit area. Using the linear relation between voltage and current, this is equivalent to $$Q = Q_s + \frac{dQ}{dv}v \quad (3.4)$$

where $Q_s$ is the short circuit thermal power flow per unit area.

The efficiency of the solid state energy converter is then given approximately by $$\varepsilon(v) = \frac{Q_L}{Q} = \frac{J_s v\left(1 - \frac{v}{v_o}\right)}{Q_s + \frac{dQ}{dv}v}. \quad (3.5)$$

Figure 18:
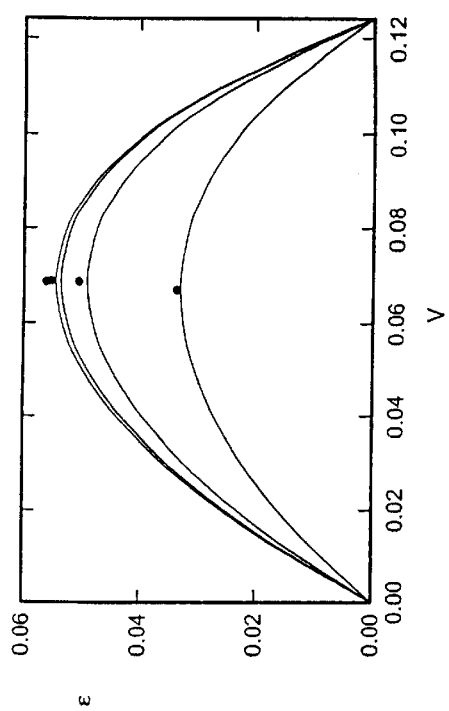
FIG. 18 shows the efficiency as a function of voltage for a InSb design. Calculations are shown for gap donor densities of $10^{17}$ (the lowest curve on the plot), $3\times10^{17}$, $5\times10^{17}$ and $7\times10^{17}$ (the highest curve on the plot) in units of cm$^{-3}$.

This is in reasonable agreement with the results illustrated in FIG. 18. FIG. 18 shows the efficiency as a function of voltage for the InSb example considered above. Calculations are shown for gap donor densities of $10^{17}$ (the lowest curve on the plot), $3\times10^{17}$, $5\times10^{17}$ and $7\times10^{17}$ (the highest curve on the plot) in units of cm$^{-3}$. The dots are the optimum points as estimated by equation (3.8).

The approximate result for efficiency can be used in order to estimate the operating point that leads to optimum efficiency. For optimization, the point where the slope vanishes is solved for $$\frac{d}{dx}\varepsilon(v) = 0. \quad (3.6)$$

This leads to the result $$v_{opt} = \frac{1 - \sqrt{\frac{Q_o}{Q_s}}}{1 - \frac{Q_o}{Q_s}} v_o. \quad (3.7)$$

The efficiency at the optimum point is then $$\varepsilon(v_{opt}) = J_s v_o \left[\frac{\sqrt{Q_s} - \sqrt{Q_o}}{Q_s - Q_o}\right]^2. \quad (3.8)$$

Results from this analytic optimization are in reasonable agreement with the numerical optimization results illustrated in FIG. 18. FIG. 18 shows the efficiency as a function of voltage for the InSb example considered above. Calculations are shown for gap donor densities of $10^{17}$ (the lowest curve on the plot), $3\times10^{17}$, $5\times10^{17}$ and $7\times10^{17}$ (the highest curve on the plot) in units of cm$^{-3}$. The dots in FIG. 18 are the optimum points as estimated by equation (3.8).

Figure 19:
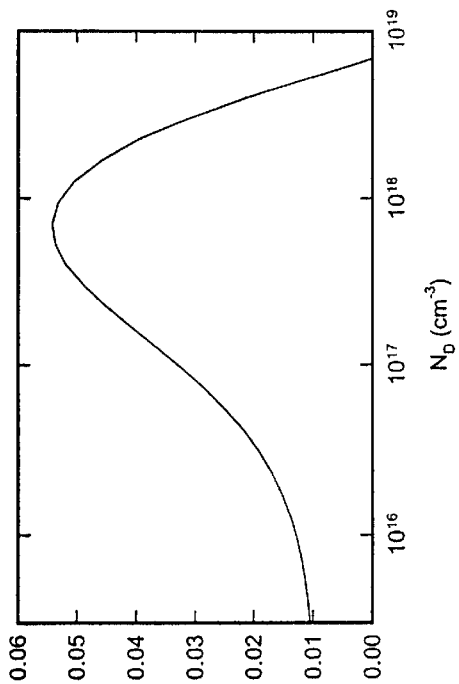
FIG. 19 shows the results of a numerical optimization of efficiency as a function of gap doping over a wide range of doping densities at a fixed emitter ionized dopant concentration of $10^{20}$ cm$^{-3}$.

The results presented above show that the efficiency depends on the gap doping, as the gap doping determines the barrier height and corresponding current flow. A gap donor doping near $7\times10^{17}$ cm$^{-3}$ appears to be near the optimum. To explore this optimization further, FIG. 19 shows the results of a numerical optimization of efficiency as a function of gap doping over a wide range of doping densities at a fixed emitter ionized dopant concentration of $10^{20}$ cm$^{-3}$. If the gap doping is near intrinsic, the efficiency is low. This is ultimately because the associated emitter-gap barrier is high. Accordingly, embodiments with near intrinsic gap doping that have a high emitter-gap barrier have a lower efficiency. If the gap doping gets to be too high, the beneficial effects of the low emitter-gap barrier is counter-balanced by the deleterious effect of the ohmic return current. This issue is examined further below.

C. Examination of scaling

The operation of the thermal diode model in this regime is primarily thermionic, and the scaling of the current, power per unit area, and efficiency follows qualitatively many features of the analytic model that we considered earlier. The following examines some scaling issues of the numerical solutions, essentially to verify the intuition developed from the analytic model.

The analytic model presumed a symmetric emitter and collector configuration (with temperature independent prefactors). The numerical model includes a more realistic mobility model, which in turn leads to a large return current from the collector. This means ultimately that the more accurate numerical model does not give efficiencies as large as what is suggested should be possible from the analytic model. For example, the $\chi$ parameter in the numerical computation is on the order of 0.07 in the gap region. From the analytic model, the optimum might be expected at a normalized barrier height $\phi$~4, with an associated efficiency in the range of 20%. The numerical results do lead to an optimum efficiency for $\phi\rightarrow\Delta u$~4.5 which is obtained through optimization of the gap doping density. The associated efficiency at the optimum is only about 5.5%, which suggests that the prefactors have a strong effect on the optimized efficiency. This has been verified within the framework of the analytic model.

To achieve a larger efficiency, the return current must be reduced. The section below shows that it is possible to increase the efficiency by roughly a factor of 2 when return current is reduced.

Figure 20:
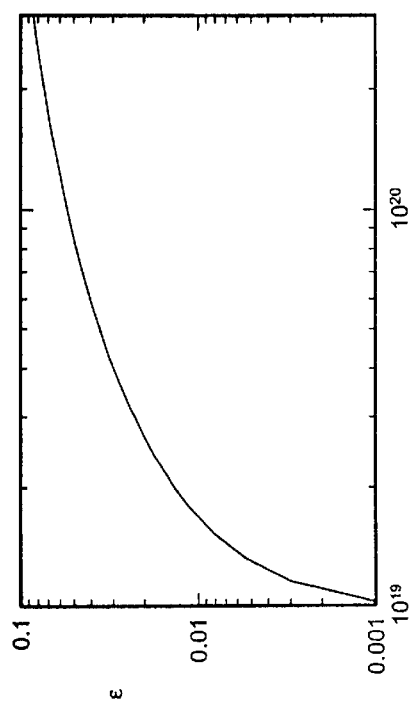
FIG. 20 shows the results for the optimum efficiency as a function of emitter doping with fixed gap doping $N_D=7\times10^{17}$ cm$^{-3}$.

The efficiency of the thermal diode design is a function of the emitter doping. The thickness is assumed to be 625 $\mu$ the gap doping is maintained at $7 \times 10^{17}$ cm$^{-3}$, and the emitter and collector temperatures are assumed to be 600 K and 300 K, respectively. The results are shown in FIG. 20 for the optimum efficiency as a function of emitter doping with fixed gap doping $N_D = 7 \times 10^{17}$ cm$^{-3}$. It is seen that the efficiency increases monotonically with the emitter electron concentration, but the scaling is less than linear. This is due to two interesting effects: the emitter-gap barrier increases at higher emitter doping since the gap doping was kept fixed; and the electron mobility decreases at higher carrier concentration. Both of these effects combine to reduce the beneficial impact of a larger emitter doping.

It is possible to implant Te (which is the lowest ionization energy donor) in the emitter at concentrations on the order of $10^{20}$ cm$^{-3}$. Utilizing the TRIM-91 code, the results indicate that such a high dopant density will lead to the development of an amorphous emitter layer. Such a layer will have a different band gap, effective mass, and mobility than what we have modeled. In addition, one would expect that the recombination rate would be very high. Some consequences of this can be anticipated. Electron injection into the gap will be limited to emitter densities that are available on the order of one recombination length into the emitter as measured from the gap side. This will be the case down to spatial scales that are on the mean free path of the electron.

The consequence of this is that a large amorphous emitter region with a gentle scale length that is on the order of a micron will very likely present an effective doping density to the gap that is much less than the peak density achieved at the semiconductor edge. On the other hand, a sharp n* profile might allow free streaming of the electrons from the highly-doped amorphous region into a crystalline intermediate region. This latter picture would correspond more closely to the assumptions built into the model under discussion here.

Another important issue is that the ionization of the donor levels in the emitter will likely be incomplete. If the emitter region were crystalline at high doping levels, then the associated conduction band density of states would not be particularly large, so that the ionization balance of the donors will likely favor significant occupation of the donors. Data for the donor ionization energy is available (Te appears to have a donor ionization energy of 50 meV in InSb), so that the ionization fraction can be estimated. The use of a metal contact with a low work function at the emitter may circumvent associated problems, as the thermionic injection from a metal can be quite large.

Figure 21:
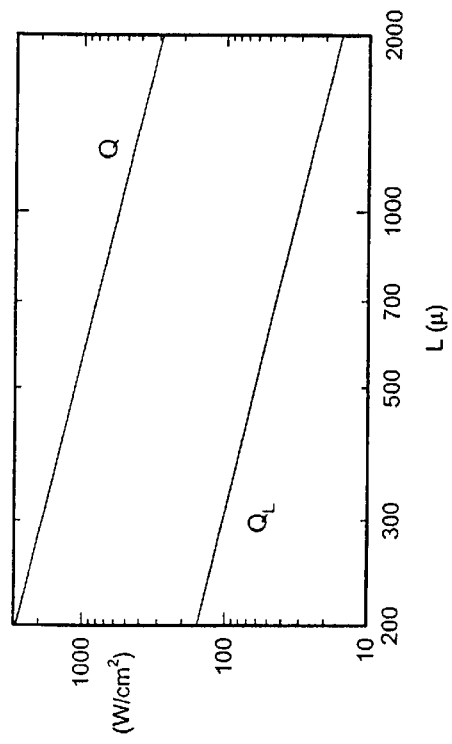
FIG. 21 shows the thermal and load power per unit area for thermal diode designs.

The analytic model suggests that the optimum efficiency should be independent of the gap length. This is very nearly true of the numerical model for a gap thickness ranging between 200 $\mu$ and 2 mm. The thermal power is proportional to the inverse gap thickness in the analytic model, and also in the numeric model as illustrated in FIG. 21 for a thermal diode.

The previous discussion has focused on a total InSb wafer thickness of 625 $\mu$. In the absence of recombination effects, thick layers would be preferred for large $T_{max}$ applications, since the associated thermal flux would be correspondingly less. The recombination length of electrons in bulk n-type crystalline InSb for the gap densities that have been considered is at least 10 times the wafer thickness that has been examined. In addition, the total recombination rate is dominated by radiative recombination, which is likely to be strongly radiation trapped in large crystals such as considered here. Consequently, structures on the order of 1–2 mm should be interesting for energy conversion applications.

The effects of recombination on the device efficiency under conditions where recombination becomes important has not been addressed. While recombination effects might generally be assumed to be universally deleterious for thermionic energy conversion, this should probably not be second guessed in the absence of modeling results. The reason for this is that recombination increases the injected current over the diffusive limit considered here. While the thermal loss is inversely proportional to the gap length, the current would be inversely proportional to the recombination length. One might imagine that in this limit, the net result would be a net increase in the efficiency. This would be mitigated by the fact that the hole current required to support the recombination would come with an associated potential drop. As the hole mobility is low in InSb, the associated potential drop is likely to be large.

Figure 22:
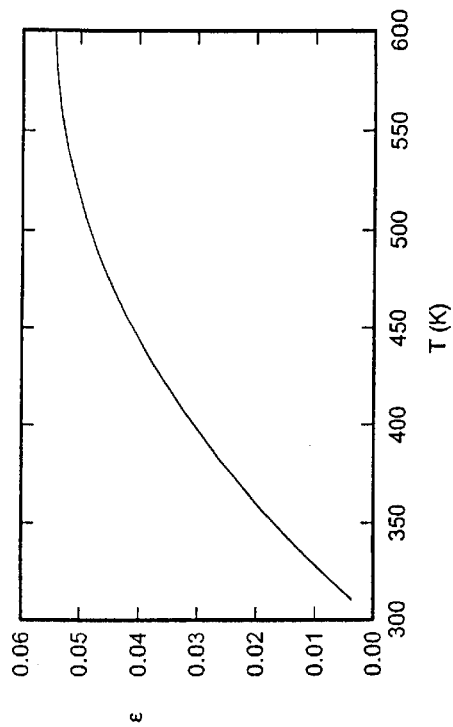
FIG. 22 shows the efficiency of a design with an emitter electron concentration of $10^{20}$ electrons/cm$^3$ and a gap donor density of $7\times10^{17}$ cm$^{-3}$.
Figure 23:
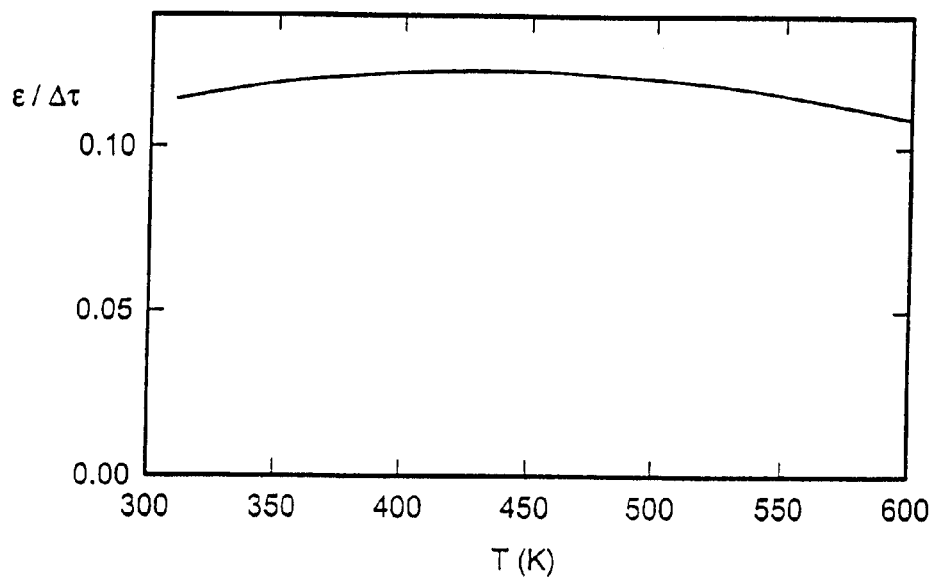
FIG. 23 shows the optimized efficiency as a fraction of the thermodynamic limit.

FIG. 22 shows the efficiency of a design with an emitter electron concentration of $10^{20}$ electrons/cm$^3$ and a gap donor density of $7 \times 10^{17}$ cm$^{-3}$. The results are plotted as a function of the emitter temperature assuming that the collector temperature is 300 K. The results in the two cases are very nearly the same. The optimized efficiency as a fraction of the thermodynamic limit is illustrated in FIG. 23. One observes that the design works more or less equally as well compared to the thermodynamic limit at all temperatures shown.

Figure 24:
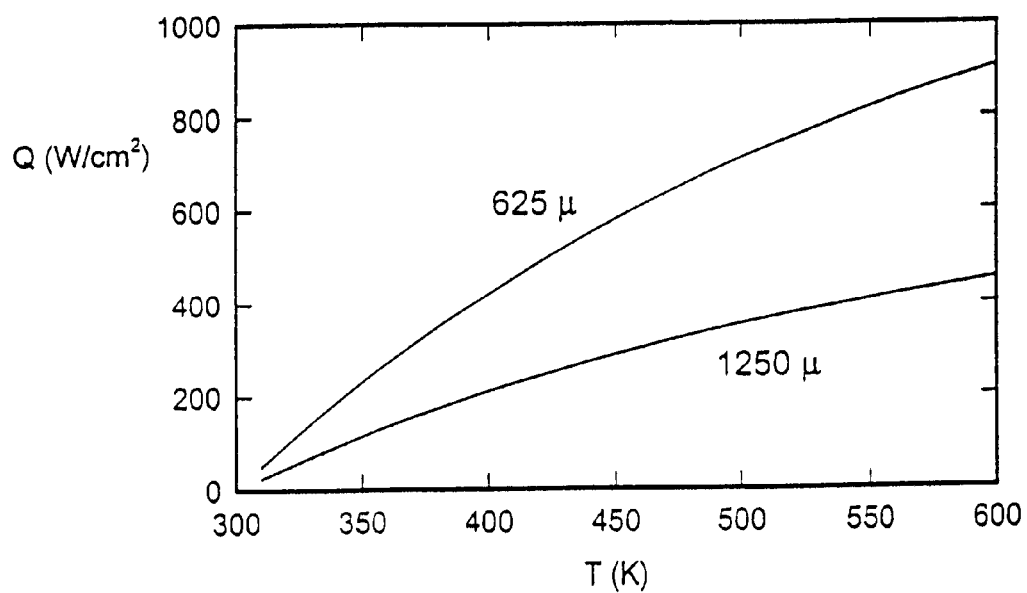
FIG. 24 shows the thermal power flow under conditions of optimum energy conversion at different temperatures.

When the temperature difference is lower, the thermal power flow is less for a given design. FIG. 24 shows the thermal power flow under conditions of optimum energy conversion for 626 $\mu$ and 1250 $\mu$ designs at different temperatures. The thermal power flow is in the range of a few hundred W/cm$^2$ under the optimum operating conditions of interest.

D. Summary

The previous discussion considered a model for a thermal "diode" based on an illustrative InSb implementation. This device uses a highly doped emitter region, a gap region which can be either p-type or n-type, and an ohmic metal collector with a sufficiently large work function arranged so as to have a negligible thermionic injection current above the ohmic contribution due to carrier equilibrium at the collector contact.

The results of the numerical and analytic studies reported above show that to obtain the largest thermionic injection current, an emitter to gap barrier is required that is preferably on the order of 4–5 $k_B T_{max}$, which implies that the gap needs to be preferably an n-type semiconductor. Therefore, this invention envisages embodiments whose emitter to gap barrier is preferably in the range from about 4 $k_B T_{max}$ to about 5 $k_B T_{max}$, as well as other embodiments in which this barrier is outside this range but that can be designed with the teachings provided herein.

As shown above, an n* region can inject electrons into an n-type gap region, and the transport is more or less diffusive in the gap region. Furthermore, it is also shown above that the thermal diode is capable of operation as an energy converter based on thermionic emission from the emitter into the gap, and subsequent transport to the collector. It has also been shown above how to optimize embodiments of the present invention as a function of gap donor concentration. The optimum efficiency of the thermal diode can be as high as 5.5% with a 600 K emitter, assuming that an electron density of $10^{20}$ cm$^{-3}$ can be developed in the emitter. These parameters are preferred characteristics of embodiments of this invention, although embodiments with other characteristics that depart from this particular optimization and which are designed according to the teachings provided herein are also envisaged within the scope of this invention.

4. Results for the InSb Compensated Thermal Diode

A basic thermal diode structure implementation in InSb was considered as an energy converter. The efficiency of the device was found to be limited to somewhat over 10% of the thermodynamic limit. The analytic model considered above predicts a higher efficiency, and the difference between the actual experimental value and the analytic model prediction can be attributed to the temperature dependence associated with the electron mobility. Because of this dependency, the prefactors in the analytic model lead to a reduction in the maximum efficiency that can be obtained. The observation of this discrepancy and its cause suggests a compensation technique. A preferred compensation is implemented as follows.

Figure 25:
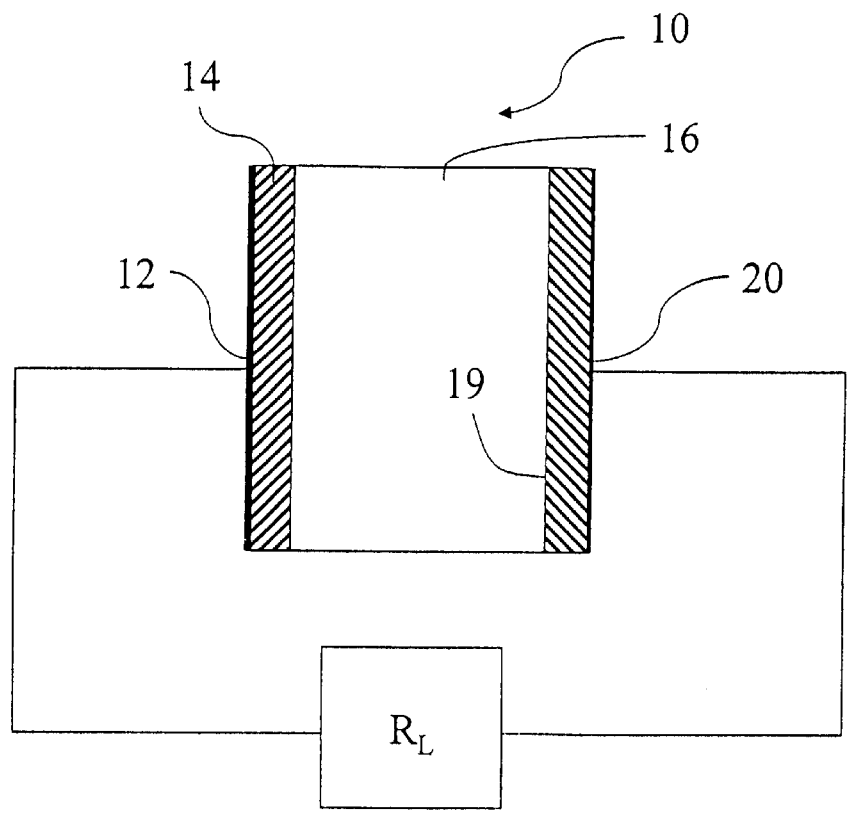
FIG. 25 is a cross-sectional view of a compensated thermal diode.

This reduction of efficiency appears in the numerical models as an ohmic return current with a sign opposite to that of the thermionic current. It was noted in the previous section that it might be possible to increase the efficiency by suppressing this return current. One way to do this is to use p-type doping to produce a compensated layer on the inside of the collector contact, which would prevent injection of electrons from the collector side of the device (see FIG. 25). FIG. 25 schematically shows an embodiment of a compensated thermal diode according to this invention. The emitter is the hot n* region 14 to the left. The gap region 16 is a thick region in the center, which is n-type. The collector is depicted here as a metal contact 20 that is cold. The hot ohmic contact 12 is adjacent to the hot n* region 14. On the inside of the metal contact is a compensated region 19 created through the addition of p-type doping that suppresses the electronic return current. The addition of p-type doping can produce a layer of p-type semiconductor if not precisely matched to the substrate doping, which can inhibit the thermionic electron current from reaching the collector. A small region is found to exist in parameter space around perfect compensation in which design numbers can be chosen that allow simultaneous collection of the thermionic current and rejection of the ohmic return current. The efficiency computed for such a device was found to be substantially increased over that of the basic diode structure. This section considers this device and associated issues.

a. The return current

Figure 26:
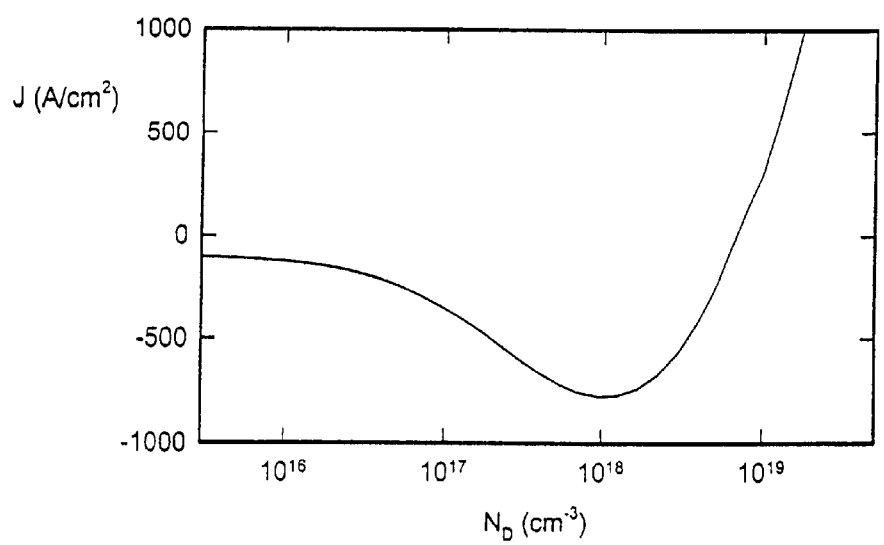
FIG. 26 shows the current as a function of gap doping for an InSb thermal diode design.

Before proceeding, the existence of the return current needs to be established in the basic thermal diode. One way to do this is to plot the current, including the sign, as a function of the gap donor concentration. The result is illustrated in FIG. 26. FIG. 26 shows the current as a function of gap doping for the illustrative InSb thermal diode design considered in the last section. For the thermionic regime, which corresponds to a negative current (electrons moving from left to right), the current is computed under conditions of optimum efficiency. For the thermoelectric regime, which corresponds to positive current (electrons moving from the collector to the emitter), the current is taken under conditions where the voltage is half of the thermally induced EMF, which is roughly where the optimum is in the thermionic regime. The thermally induced current is observed to change sign. At low gap doping, there is not enough conductivity for the gap to sustain an ohmic component large enough to compete with the thermionic injection. When the gap doping increases, at some point the ohmic current surpasses the thermionic current in magnitude, and thermionic energy conversion is no longer possible. This ohmic return current is made up of electrons that originate on the collector side of the device, and transport primarily by drift to the emitter.

b. Optimization of the efficiency with a blocking layer

Figure 27:
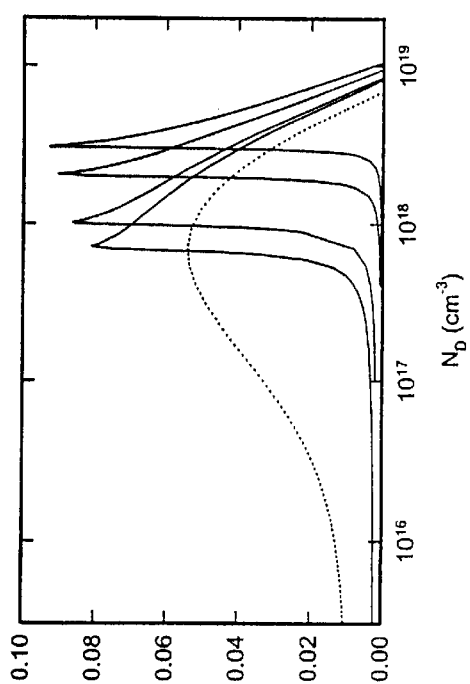
FIG. 27 shows optimization of efficiency as a function of gap doping with p-type compensation using $N_a^-$ concentrations of $7\times10^{17}$, $10^{18}$, $2\times10^{18}$ and $3\times10^{18}$ cm$^{-3}$.

We now consider the predicted operation of the compensated thermal diode, which includes an intrinsic blocking layer. In the simulation, we model the compensation layer using Gaussian p-type doping with a characteristic length of 5 $\mu$. Results for different acceptor densities are shown in FIG. 27. FIG. 27 shows optimization of efficiency as a function of gap doping with p-type compensation using $N_a^-$ concentrations of $7 \times 10^{17}$, $10^{18}$, $2 \times 10^{18}$ and $3 \times 10^{18}$ cm$^{-3}$. The dotted line indicates the efficiency obtained in the absence of a blocking layer. The maximum efficiency is obtained when the acceptor concentration of the compensation layer is adjusted to match the substrate donor concentration. A substantial increase in the optimum efficiency is obtained over the uncompensated case.

The shape of the efficiency curves shown in FIG. 27 can be understood qualitatively from simple considerations. The efficiency is maximized under conditions where the blocking layer is intrinsic, which simultaneously allows transmission of the thermionic current from the emitter, while producing a minimal return current. At lower gap donor concentration, the compensation layer produces a p-type region, which in this application behaves more or less as a reverse biased diode in rejecting the thermionic current. At higher gap donor concentration, the compensation is insufficient to eliminate excess electrons. A return current is initiated, with a magnitude that is roughly linear in the electron concentration in the blocking layer. Consequently, a linear decrease is seen in the efficiency on the high side of the optimum.

From a practical standpoint, the capacity of the electrical current leads limits the current densities to $10^2$–$10^3$ A/cm$^2$. Otherwise, the voltage drop in the wires becomes unacceptable. Moreover, there is a temperature drop across the diode of 200–300° C. For the given thermal conductivity of InSb, this translates into a gap thickness of about 1 cm. This thickness presents challenges such as the recombination length being comparable with the gap thickness and technological problems with polishing thick wafers. For example, most wafer processing equipment is designed for a thickness less than 1 mm.

A typical approach to achieving thick gaps is to stack the diodes. Because the current through the diodes stacked in series is the same, this means that stacked diodes should be current matched. One diode producing a larger current results in a voltage drop across the other diodes and reduced performance due to additional potential barriers.

The following discusses approaches to achieving current matching that can be implemented in the context of the present invention.

(1) Gap Doping Concentration Current Matching

Figure 28:
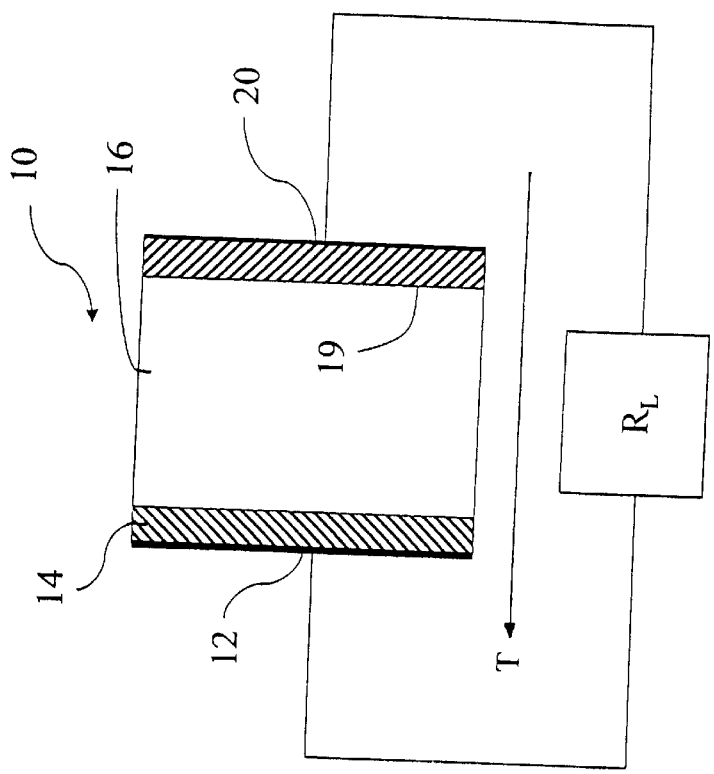
FIG. 28 shows a cross-sectional view of a single compensated thermal diode with increasing temperature indicated by the arrow labeled T.
Figure 29:
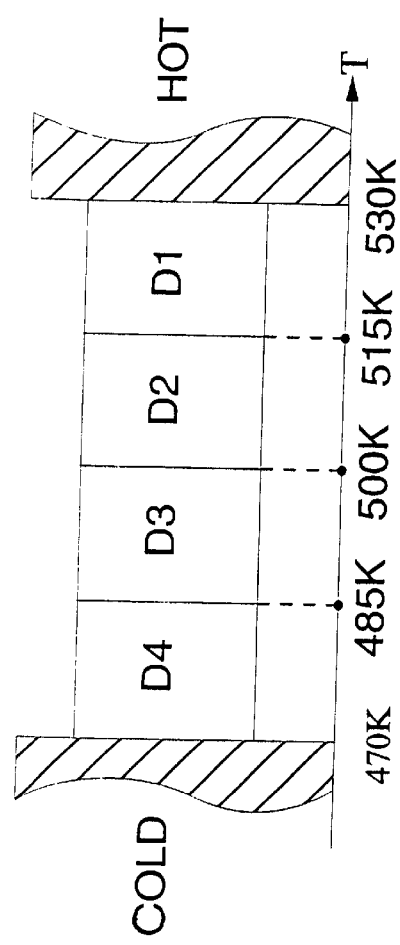
FIG. 29 illustrates an embodiment having four stacked diodes.

The following example assumes an InSb diode material with all diodes having the same geometry and with a heat source temperature of 530 K and a heat sink temperature of 460 K. A single diode configuration is shown in FIG. 28. The arrow in FIG. 28 indicates that the temperature T of the hot ohmic contact 12 is higher than the temperature of collector 20. From the plot illustrated in FIG. 32 and setting an efficiency level at 6%, four diodes may be stacked as shown in FIG. 29, where the first diode ($D_1$) has a gap dopant concentration of $5 \cdot 10^{17}$ cm$^{-3}$, $D_2 \sim 7 \cdot 10^{17}$ cm$^{-3}$, $D_3 \sim 10^{18}$ cm$^{-3}$, and $D_4 \sim 2 \cdot 10^{18}$ cm$^{-3}$. In this embodiment all four diodes are producing the same current, and the overall efficiency stays at 6%. Although some embodiments of stacked diodes according to the present invention comprise diodes whose respective elements are manufactured with the same materials for each diode, it is understood that embodiments of stacked diodes in the context of this invention are not limited to such stacks. Some embodiments of stacked diodes according to the present invention comprise diodes whose respective elements are manufactured with different materials. For example, in some embodiments of stacked diodes the emitters in different diodes comprise different materials, and/or the gap regions in different stacked diodes comprise different materials, and/or the collectors in different stacked diodes comprise different materials.

(2) Current Matching by Geometry

Figure 30:
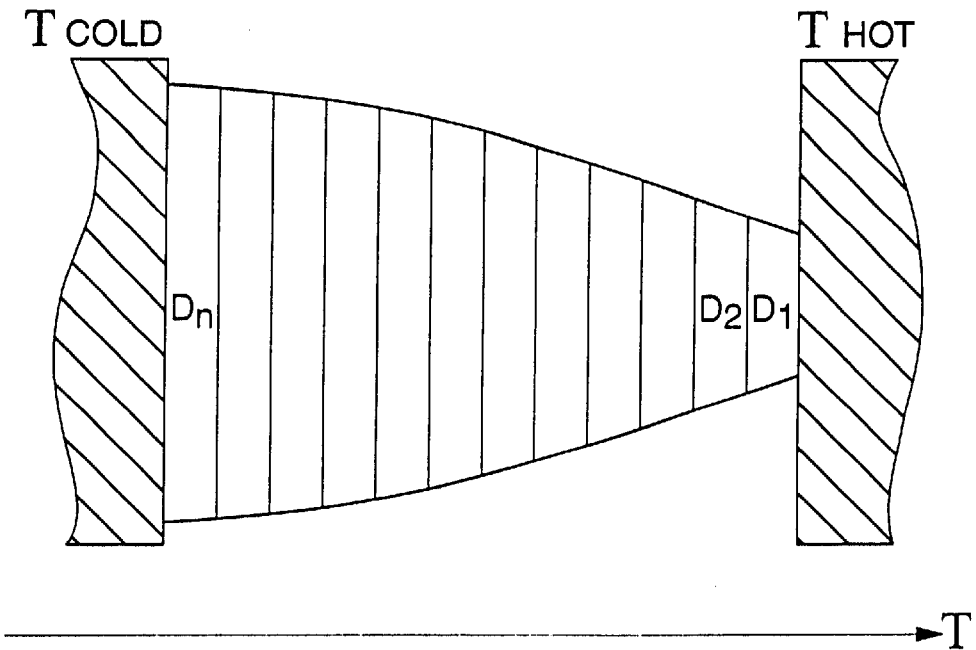
FIG. 30 illustrates an embodiment having multiple stacked diodes having a curved boundary and forming a wedge-shaped geometry.
Figure 31:
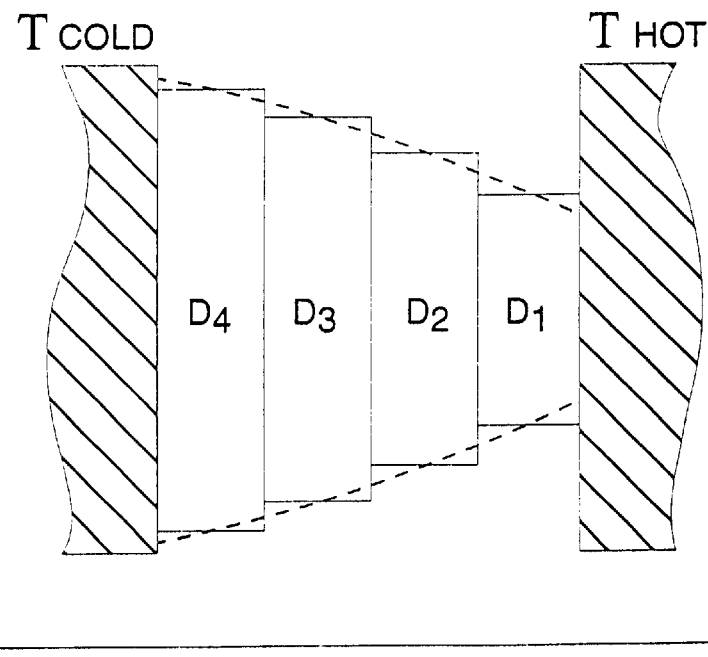
FIG. 31 illustrates an embodiment of stacked diodes wherein the stack boundary approximates an ideal curve as shown in FIG. 30.
Figure 32:
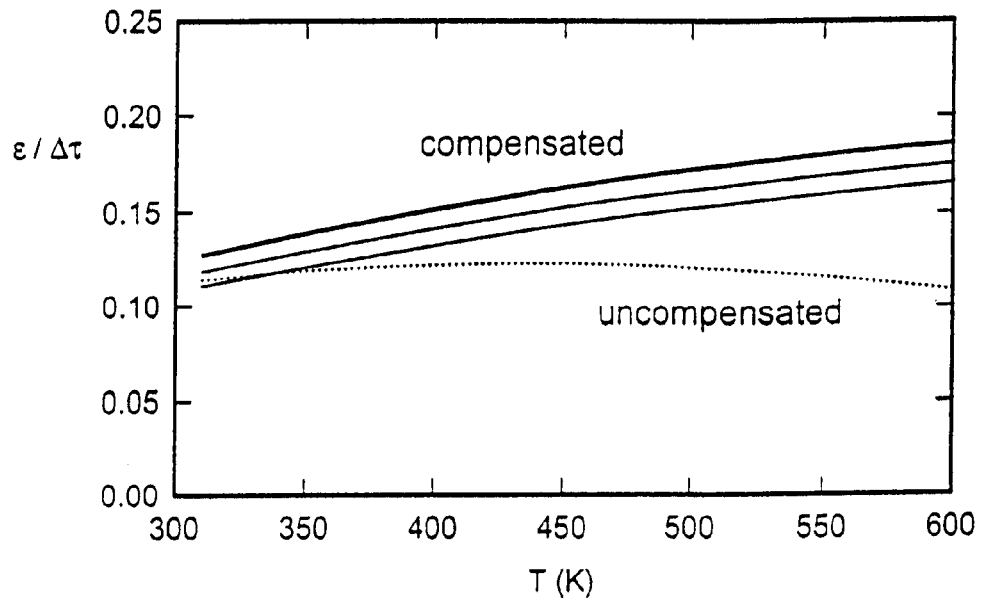
FIG. 32 shows the efficiency under optimized conditions as a function of emitter temperature for different gap doping with perfect compensation. An InSb compensated thermal diode structure 625 $\mu$ thick is assumed, with an emitter electron density of $10^{20}$ cm$^{-3}$ and a collector temperature of 300 K.

The following example assumes the highest efficiency line on FIG. 32, corresponding to a gap donor concentration of $2 \cdot 10^{18}$ cm$^{-3}$. A thin diode in a series stack at 500 K produces a current that is approximately two times greater than the current produced in a non-stacked diode. Current matching will be achieved if the diode is at a temperature of 400 K and has an area that is twice as large as the area of a non-stacked diode. The results of this embodiment are shown in FIG. 30, where the area change is in the form of a wedge-shaped collection of diodes. The boundary of a stack is actually not a straight line, but rather a curve that takes into account non-linear behavior of the efficiency curve on FIG. 32. The stack shown in FIG. 31 shows another embodiment, where the stack boundary approximates an ideal curve as shown in FIG. 30. The arrows in FIGS. 30–31 indicate increasing temperature, T, from $T_{COLD}$ to $T_{HOT}$.

Figure 33:
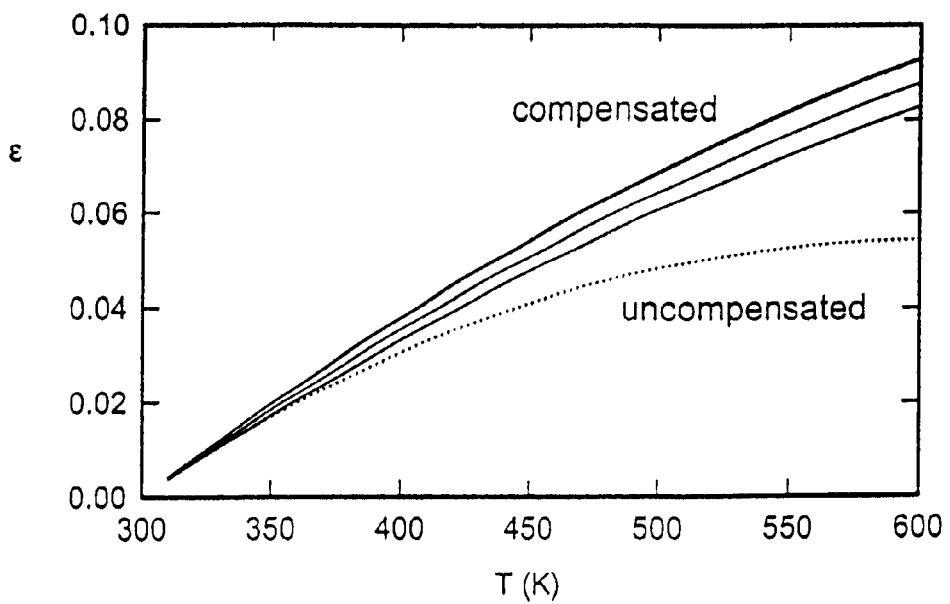
FIG. 33 shows the efficiency normalized to the thermodynamic limit under optimized conditions as a function of emitter temperature for the different cases shown in FIG. 32.

The compensated thermal diode design has been optimized to operate with maximum efficiency with a hot emitter at 600 K. It is of interest to determine the efficiency of the device at other emitter temperatures. Numerical results for the efficiency are illustrated in FIG. 32 for different substrate dopings assuming perfect compensation. FIG. 32 shows the efficiency under optimized conditions as a function of emitter temperature for different gap doping with perfect compensation. An InSb compensated thermal diode structure 625 $\mu$ thick is assumed, with an emitter electron density of $10^{20}$ cm$^{-3}$ and a collector temperature of 300 K. Gap donor concentrations and matched acceptor concentrations are (in order of increasing efficiency as plotted) $7 \times 10^{17}$, $10^{18}$, $2 \times 10^{18}$ and $3 \times 10^{18}$ cm$^{-3}$. The dotted line indicates the efficiency obtained in the absence of a blocking layer. Results for the efficiency normalized to the thermodynamic limit are shown in FIG. 33. FIG. 33 shows the efficiency normalized to the thermodynamic limit under optimized conditions as a function of emitter temperature for the different cases shown in FIG. 32. One observes that the compensation layer is effective at high emitter temperature. In addition, optimization at high temperature appears to produce relative optima at other temperatures such that separate designs optimized for different temperature regimes is not required. More advanced designs that work best around their design temperature, and not as well at other temperatures, will be discussed below.

c. Example

A compensated layer in an n-type semiconductor can be made by, including but not limited to, introducing acceptors. For InSb doped with Te (donor impurity), the donor ionization energy is 50 meV. The same ionization energy is characteristic for acceptors created by vacancies. A compensated layer exists if the number of vacancies matches the initial donor concentration (n).

The number of vacancies is defined by the ion dose per unit area D (ions/cm$^2$) and the number of vacancies created by a single ion V, if vacancies are induced by ion implantation of an inert gas. V is a function of the ion energy E, V=V(E). The number of vacancies is $N_v(E)=D \cdot V(E)$. In this case, the vacancy concentration c depends on the ion range in the material R, which is also a function of the ion energy R=R(E). Thus, for a given ion type, the vacancy concentration as a function of the ion energy is $$C(E) = \frac{D \cdot V(E)}{R(E)},$$

for a compensated layer C(E)=n, or $$D = \frac{n \cdot R(E)}{V(E)}. \tag{4.1}$$

Figure 34:
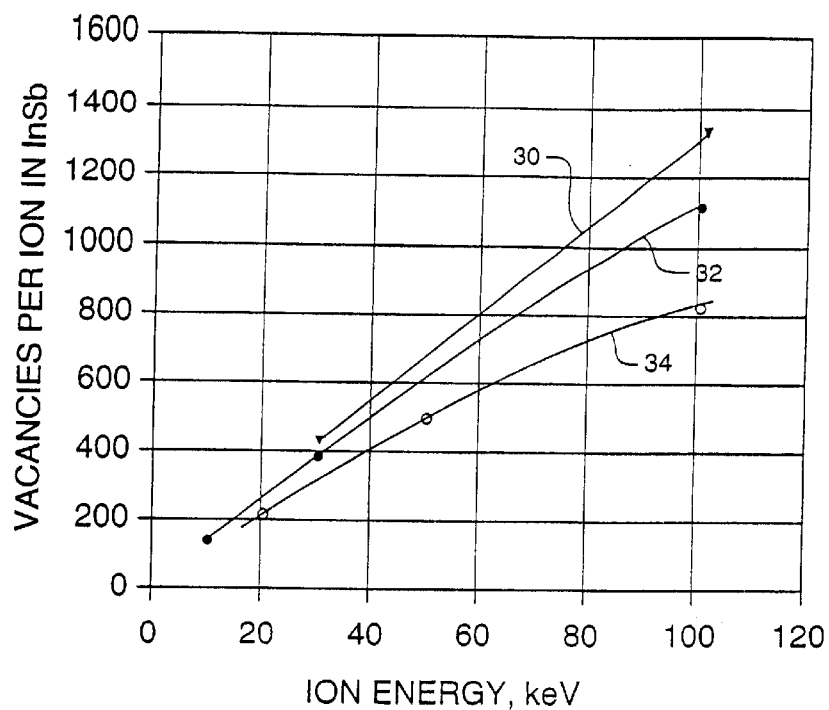
FIGS. 34 and 35 show the dose needed to create a compensated layer over a wide range of ion energies in an n-type InSb diode doped to a concentration n.
Figure 35:
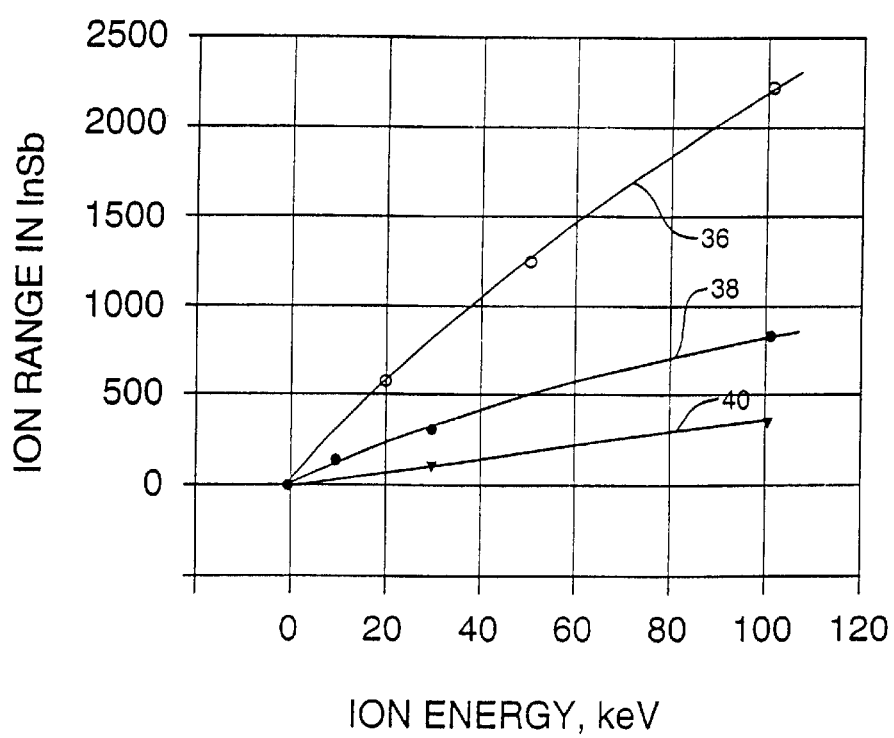

R(E) and V(E) were modeled using TRIM-91 computer code for InSb and Ne, Ar and Xe ions. The modeling results are shown in FIGS. 34 and 35. The dose needed to create a compensated layer over a wide range of ion energies in an n-type InSb diode doped to a concentration n can be determined utilizing FIGS. 34 and 35 and Equation (4.1). Lines 32 and 38 represent the curves for Argon, lines 34 and 36 for Neon, and lines 30 and 40 for Xenon in FIGS. 34 and 35, respectively.

Ion implantation creates a vacancy concentration profile which is more pronounced at the last 20–30% of the ion range. This 20–30% of the ion range can be decreased to less than the tunneling distance in InSb, which is typically between 100–150 Å, to avoid the formation of additional barriers.

Which ion is utilized requires a balancing of the pros and cons, such as the number of shallow levels that are created versus the damage to the solid structure. For example, Xe creates more shallow layers; however, it inflicts more damage and the crystal is semi-amorphous.

d. Summary

A modification of the basic thermal diode design introduced in the last section has been set forth which seeks to reduce the ohmic return current that limits the maximum efficiency of the device. It was demonstrated that an ohmic return current is present in the computations, and that it dominates the thermionic current at high gap doping. Including a compensated layer on the inside of the collector is shown to reduce the return current, leading to a higher optimum efficiency. The results of the modeling indicate that perfect compensation produces the highest efficiencies for a given gap donor concentration. This conclusion is consistent with what could have been reasoned a priori from simple physical arguments. Therefore preferred embodiments of compensated thermal diodes according to the present invention are characterized by high efficiencies, such that a larger compensation extent leads to a higher efficiency. The peak efficiency computed for the compensated thermal diode is competitive with the best thermoelectrics.

5. Ohmic Contact

An ohmic contact is defined as a metal-semiconductor contact that has a negligible contact resistance relative to the bulk or spreading resistance of the semiconductor. (See Sze, S. M., *Physics of Semiconductor Devices*. N.Y., John Wiley & Sons, 1981, pp. 304–311, the contents of which are specifically incorporated herein.) This section describes preferred ohmic contacts and preferred methods for making such contacts according to this invention.

Metal-semiconductor interfaces introduce local potential barriers, which are known under the generic name of Schottky barriers. In its simplified form, the height of a Schottky barrier $\phi_b$ measured relative to the Fermi level can be written as $\phi_b=\phi_m-\chi_s$, where $\phi_m$ is the metal electron work function and $\chi_s$ is the semiconductor electron affinity. Examples of the Schottky barrier values are 0.70 eV for GaAs and 0.18 eV for InSb.

For a solid state metal-semiconductor thermionic converter, the operating voltage range is lower than the Schottky barrier height. This will destroy the effect or at least bring down operating currents.

The typical operating voltage of the present invention is 10–100 mV and the power is 1–10 W. This results in an operating current of $I_o$=100–1000 A. The power loss on a Schottky barrier is $W_{loss}=I_o\phi_b$. For $W_{loss}$ to be less than 1% of the total power, $\phi_b$ must be less than 1 meV. The barrier is often expressed in terms of a contact resistance. Therefore, at the stated currents, the contact resistance must be less than $10^{-5}$–$10^{-6}$ ohm.

The references Chang et. al., *Specific Contact Resistance of Metal-Semiconductor Barriers. Solid-State Electronics,* Vol. 14 (1971), pp. 541–550, and Shannon, J. M., *Control of Schottky Barrier Height Using Highly Doped Surface Layers. Solid-State Electronics.* Vol. 19 (1976), pp. 537–543, which are incorporated herein by reference, set forth a method of forming an ohmic contact. An electric field at the metal-semiconductor interface creates a carrier depleted region in the semiconductor. As the concentration of ionized impurity increases, the depletion width becomes narrower. This in turn causes the transmission coefficient for tunneling to increase. Hence, even a high barrier contact can become ohmic if the barrier is thin enough such that tunneling dominates the carrier transport process. A dopant level corresponding to $10^{-6}$ohm/cm$^2$ is $10^{20}$–$10^{21}$ (Te in InSb) at 300° C. The electron effective mass for tunneling increases with temperature, and at 500° C. the required concentration is $10^{21}$ rather than $10^{20}$. A high dopant concentration layer must be sufficiently thin so it does not introduce its own barrier on the contacting semiconductor interface. The Shannon reference cited above estimates this thickness as less than 150 Å. This approach applies to both n-type and p-type doping, while keeping in mind that the current sign is reversed when going from an n-type region to a p-type region.

Figure 36:
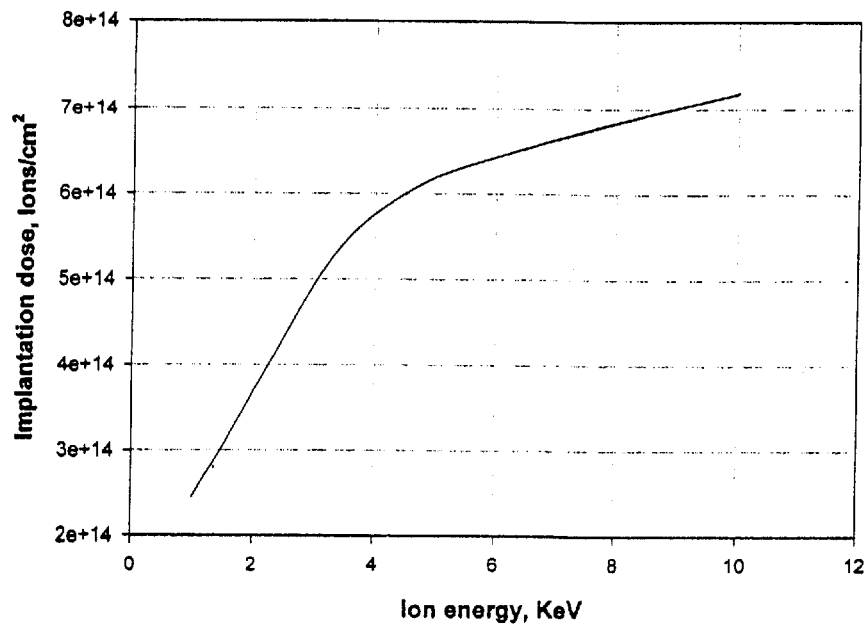
FIG. 36 shows the results for an ohmic contact implantation dose required to achieve a $10^{21}$ cm$^{-3}$ shallow doping of Te for an InSb design.
Figure 37:
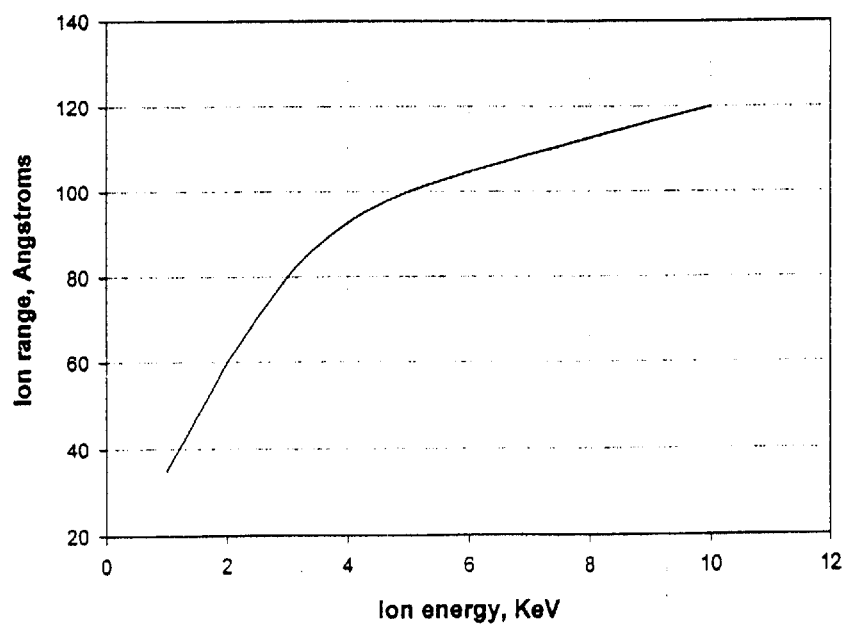
FIG. 37 shows the ion range for FIG. 36.

The implantation dose required to achieve a $10^{21}$ cm$^{-3}$ shallow doping was calculated using TRIM-91 computer code (G. Ziegler, G. Biersack. IBM (1991)). The ion range and required dose were calculated separately for In and Sb. The calculation results were averaged to approximate InSb. The difference between In and Sb in this energy range was no more than 20%. Te was utilized as an n-type dopant because Te has the lowest known ionization energy (50 meV). FIG. 36 shows the calculation results for this dose, while FIG. 37 shows the ion range.

Figure 38:
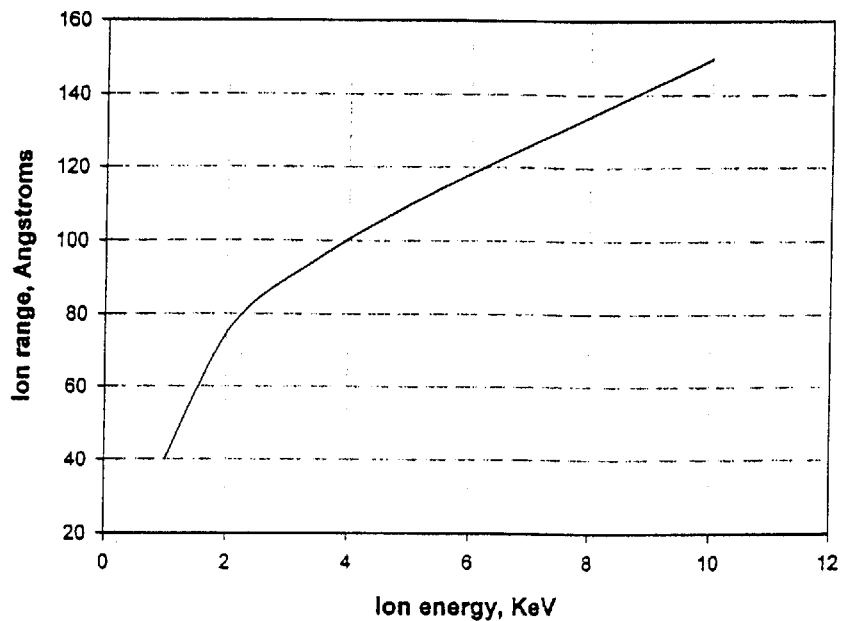
FIG. 38 shows the results for Ag doping to achieve an ohmic contact.
Figure 39:
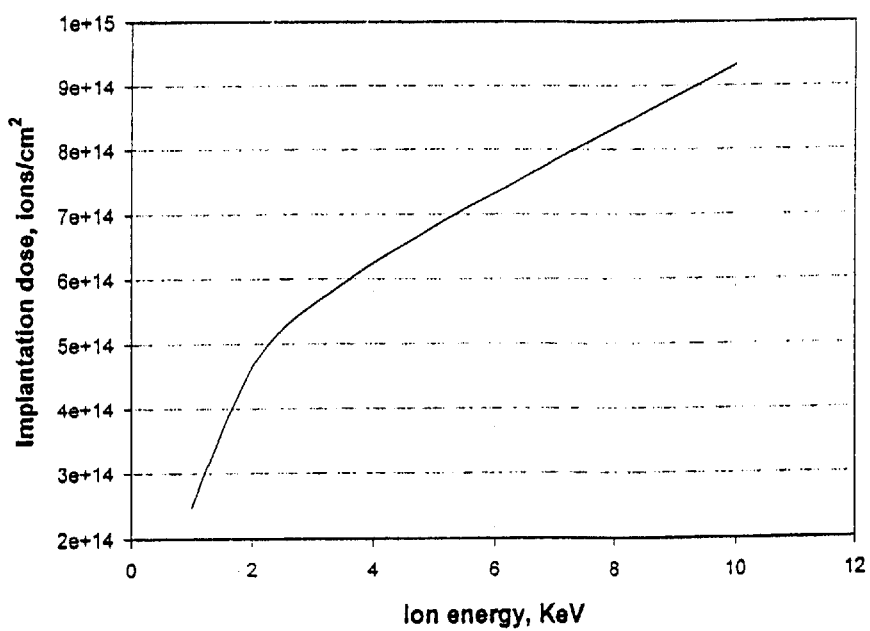
FIG. 39 shows the results for Ag doping to achieve an ohmic contact.

For p-type doping, the known materials for InSb include Ge (9 meV ionization energy) and Ag ($E_i$=30 meV). Ag is evidently a preferred ion since it is heavier than Ge and has a shorter range for the same ion energies, which allows for a smaller depleted region width. The calculations for Ag doping are shown in FIGS. 38 and 39. The ion implantation process creates vacancies which subsequently must be annealed.

Another method for forming an ohmic contact is through diffusion annealing. For example, an ohmic contact for a diode comprising InSb may be formed by annealing indium layers on InSb wafers. The following procedure was performed in an acid cleaned quartz ampule. The ampule was baked for more than one hour in a high vacuum at 800° C. The InSb samples having an indium coating were loaded into the quartz ampules, which was pumped down and filled with 10–100 torr of helium. Helium, which has a high thermal conductivity, provides for quick cooling. After annealing at various temperatures, I vs. V curves were measured on the samples to confirm that ohmic contacts existed. Positive results were obtained in the temperature range of 250–400° C. with an annealing time of 10–60 minutes. At temperatures exceeding 500° C. the indium dissolved completely rendering the samples unusable, even though the samples showed ohmic behavior.

6. Examples a. Design parameters

Referring to FIG. 2, intermediate, thermally conducting layers may be placed in other embodiments of this invention between the ohmic contacts (12, 20) and heat sinks to ensure thermal contact. For example, a deposited layer of In or the like may be used on the hot side and a deposited layer of In-Ga eutectic or the like may be used on the cold side. These materials are sufficiently malleable to ensure adequate thermal contact at low compression (0.1–1.0 MPa).

Accordingly, preferred materials that can be used for these layers according to this invention are malleable thermal conductors, although other materials can be used in other embodiments. Another method of providing thermal contact is the application of paste, glue, a low temperature soldering alloy, or equivalents thereof. An electrically and thermally conducting layer is then added to serve as a diffusion barrier between a thermally conducting layer and a semiconductor. In this embodiment, the thermally and electrically conducting layer is used as an emitter without an additional semiconductor emitting layer. The characteristics and functions of this layer preferably include, but are not limited to, the following: (1) conducts heat; (2) conducts electricity; (3) emits electrons; (4) creates a Schottky barrier at the metal-semiconductor interface; (5) creates a diffusion barrier; (6) prevents a chemical reaction of a semiconductor with a subsequent layer; (7) matches the thermal expansion of a semiconductor to prevent delamination; (8) is thermally stable within the range of operation of the thermal diode; and (9) has a high resistance to oxidation if not vacuum encapsulated or encased in an inert environment.

InSb, for example, has a thermal expansion coefficient of 5.2–5.4×10$^{-6}$ K$^{-1}$ in the temperature range of 300–500 K. Other possible materials include, but are not limited to, Mo, Cr, W, Ta, Re, Os, Ir, lanthanoids and nickel alloys, Pt and soft metals such as In, Au, Cu or the like. From this list, Ta and the lanthanoids are prone to oxidation, and In has a low melting temperature.

Highly doped semiconductors and semi-metals may also be used. For example, a thin layer of Si has a sufficiently high thermal and electric conductivity. However, certain precautions should be observed, and, in particular, it should be noted that a large forbidden gap when compared to InSb ensures the information of an internal barrier which impedes current transport.

The thickness of preferred embodiments of the thermally and electrically conducting layer is defined dby the following design rules. The thermal conductivity is preferably higher than that of a semiconductor gap. With a gap thickness of 100–1000 microns, the thickness of the layer is preferably less than about a few microns since it will increase thermal losses. On the thin side, there are a few considerations that define the layer thickness. For example, metal layers are preferably thicker than the electron mean free path in order to maintain its bulk properties. Since the layer is in close proximity to another metal (intermediate layer), it can affect its Fermi level position and change the electron emission into the semiconductor. This effect is known to be significant at metal layer thicknesses below 1000 Å. This number is at least a few electron mean free path lengths and can be regarded as a low practical limit in order to avoid unnecessary complications. Similar thickness considerations apply to the semiconductor emitter region n*.

The most preferred situation for the emitter-gap interface is when the region has matched crystallography, i.e., when the emitter region is grown epitaxially on top of the gap region. For InSb this can be achieved by maintaining the deposition temperature above 150° C. (PVD). For other gap materials, such as $Hg_{1-x}Cd_xTe$, the epitaxial growth is more complex. Scattering and decreased converter performance occurs when the emitter-gap interface is mismatched.

One skilled in the art of electric and thermal contacts recognizes there are numerous methods of providing an adequate electric and thermal contact, and the scope of this invention is not limited to the examples cited above, but it also envisages other embodiments designed according to different criteria.

b. Uncompensated thermal diodes

The following examples are intended to be illustrative of select embodiments of the present invention and not restrictive. The invention maybe embodied in other specific forms without departing from its spirit or essential characteristics. The dopant concentration in the following examples (1)–(9) are given in units of $cm^{-3}$.

(1) $metal_1/n/metal_2$: InGa eutectic (bulk)/Cr or Ni (1000–4000 Å)/InSb (360 microns; doped with $1.1 \times 10^{18}$ Te, orientation 100)/Pt (1500 Å)/ In (bulk). The thickness of $metal_1$ cannot be less than the mean free path of electrons for the specific metal at a specific temperature, e.g., for Ag the mean free path is about 400 Å.

(2) $metal_1/n*/n/metal_2$: InGa eutectic (bulk)/Cr (1500 Å)/InSb (400 Å; doped with $3.0 \times 10^{19}$ Te)/InSb (360 microns; doped with $1.1 \times 10^{18}$ Te)/Pt (1500 Å)/In (bulk).

(3) $metal_1/n**/n*/n/n**/metal_2$: InGa eutectic (bulk)/Cr (1500 Å)/InSb (400 Å; doped with $3.0 \times 10^{19}$ Te)/inSb (360 microns; doped with $1.1 \times 10^{18}$ Te)/In (100 Å)/Pt (1500 Å)/ In (bulk).

(4) $metal_1/n**/n*/n/n**/metal_2$ : InGa eutectic (bulk)/Cr (1500 Å)/In (100 Å)/InSb (400 Å; doped with $3.0 \times 10^{20}$ Te)/InSb (360 microns; doped with $1.1 \times 10^{18}$ Te)/In (100 Å)/Pt (1500 Å)/ In (bulk).

(5) $metal_1/n/n/n/metal_2$: InGa eutectic (bulk)/Cr (1500 Å)/In (100 Å)/InSb (360 microns; doped with $1.1 \times 10^{18}$ Te)/In (100 Å)/Pt (1500 Å)/ In (bulk).

(6) $metal_1/n/n/n/metal_2$: InGa eutectic (bulk)/Cr (1500 Å)/In (100 Å)/InSb (500 microns; doped with $1.1 \times 10^{18}$ Te)/In (100 Å)/Pt (1500 Å)/ In (bulk).

(7) $metal_1/n**/n*/n/n**/metal_2$ : InGa eutectic (bulk)/Cr (1500 Å)/In (100 Å)/InSb (400 Å; doped with $3.0 \times 10^{20}$ Te)/InSb (500 microns; doped with $1.1 \times 10^{18}$ Te)/In (100 Å)/Ni (1500 Å)/ In (bulk).

(8) $metal_1/n/n/n/metal_2$: InGa eutectic (bulk)/Cr (1500 Å)/In (100 Å)/InSb (500 microns; doped with $1.9 \times 10^{17}$ Te)/In (100 Å)/Pt (1500 Å)/ In (bulk).

(9) $metal_1/n/n/n/metal_2$: InGa eutectic (bulk)/Cr (1500 Å)/In (100 Å)/InSb (500 microns; doped with $1.9 \times 10^{17}$ Te)/In (100 Å)/Ni (1500 Å)/ In (bulk).

C. Compensated thermal diodes

The following examples are intended to be illustrative of select embodiments of the present invention and not restrictive. The invention maybe embodied in other specific forms without departing from its spirit or essential characteristics. Layers referred to as having a low doping (p) may also be n-type. The dopant concentration in the following examples (1)–(5) are given in units of $cm^{-3}$.

(1) $metal_1/n**/n*/n/p/n**/metal_2$: InGa eutectic (bulk)/Cr (1500 Å)/In (100 Å)/InSb (400 Å; doped with $3.0 \times 10^{19}$ Te)/InSb (500 microns; doped with $1 \times 10^{18}$ Te; 2° from (100))/p-InSb (400 Å; doped with $3.1 \times 10^{14}$ Te)/In (100 Å)/Pt (1500 Å)/ In (bulk).

(2) $metal_1/n**/n*/n/p/n**/metal_2$: InGa eutectic (bulk)/Cr (1500 Å)/In (100 Å)/InSb (400 Å; doped with $3.0 \times 10^{19}$ Te)/InSb (500 microns; doped with $1 \times 10^{20}$ Te; 2° from (100))/p-InSb (400 Å; doped with $3.1 \times 10^{14}$ Te)/In (100 Å)/Pt (1500 Å)/In (bulk).

(3) $metal_1/n/n/p/n/metal_2$: InGa eutectic (bulk)/Cr (1500 Å)/In(100 Å)/InSb (500 microns; doped with $1 \times 10^{18}$ Te; 2° from (100))/p-InSb (400 Å; doped with $3.1 \times 10^{14}$ Te)/In (100 Å)/Pt (1500 Å)/In (bulk).

(4) $metal_1/n**/n*/n/p/n**/metal_2$: InGa eutectic (bulk)/Cr (1500 Å)/In (100 Å)/InSb (400 Å; doped with $3.0 \times 10^{19}$ Te)/InSb (500 microns; doped with $1 \times 10^{20}$ Te; 2° from (100))/p-InSb (2000 Å; doped with $3.1 \times 10^{14}$ Te)/In (100 Å)/Pt (1500 Å)/In (bulk).

(5) $metal_1/n**/n*/n/p/n**/metal_2$: InGa eutectic (bulk)/Cr (1500 Å)/In (100 Å)/InSb (400 Å; doped with $1.0 \times 10^{20}$ Te)/InSb (500 microns; doped with $1 \times 10^{18}$ Te)/p-InSb (400 Å; where p-type region is ion implanted with Ar or Ne)/In (100 Å)/Pt (1500 Å).

7. Distributed Schottky Diode

The formation of a Schottky barrier on a metal-semiconductor interface is well described in Rhoderick, E. H. and Williams, R. H., *Metal-Semiconductor Contacts.* Oxford, Clarendon Press (1988), which is incorporated herein by reference. Two major models of a Schottky barrier exist. For the Schottky-Mott model the barrier, $\phi_B$, is considered to be the difference of a metal work function, $\phi_m$, and semiconductor electron affinity, $\chi_s$: $\phi_B = \phi_m - \chi_s$. In reality, $\phi_B$ is almost independent on the metal work function imp The explanation by J. Bardeen is that the barrier is affected by surface states. Compensation of this charge is affected by the charge in the surface states $Q_{ss}$. And the electroneutrality condition is $Q_m + Q_d + Q_{ss} = 0$, where $Q_m$ is the negative charge on the surface of the metal and $Q_d$ is the positive charge of uncompensated donors. The compensation $\phi_o$ barrier (neutral level) properties depends on the relative position of $\phi_o$ and the Fermi level $E_F$. If $\phi_o$ is measured relative to the top of the valence band, the Schottky barrier is as follows: $\phi_B \approx E_g - \phi_o$.

The gap energy $E_g$ is a function of the temperature, and to some extent the dopant concentration. The accumulation of impurities on the surface affects $\phi_B$ as described in Section 5 regarding ohmic contacts. A partial impurity accumulation on the interface also affects the barrier height.

Figure 40:
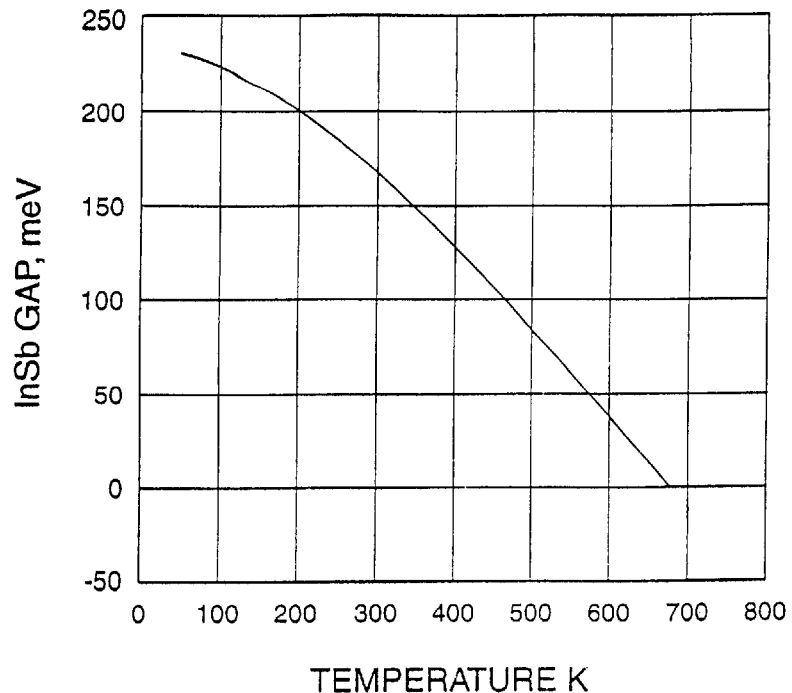
FIG. 40 shows the temperature behavior of an InSb gap.

FIG. 40 shows the temperature behavior of the InSb gap (see Landolt-Börnstein, *Numerical Data and Functional Relationships in Science and Technology, Group III: Crystal and Solid State Physics,* (1983) Vol. 22b, the contents of which are specifically incorporated herein).

Figure 41:
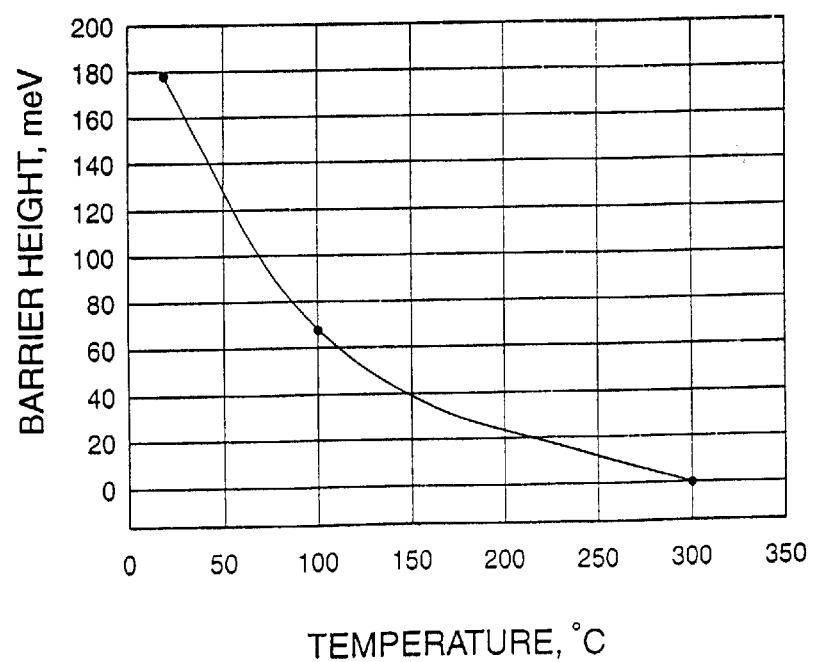
FIG. 41 shows the temperature dependence on barrier height for an interface layer doped with Te to $3\times10^{19}$ cm$^{-3}$ deposited on InSb doped with Te to $1\times10^{18}$ cm$^{-3}$ with an In emitter.
Figure 42A:
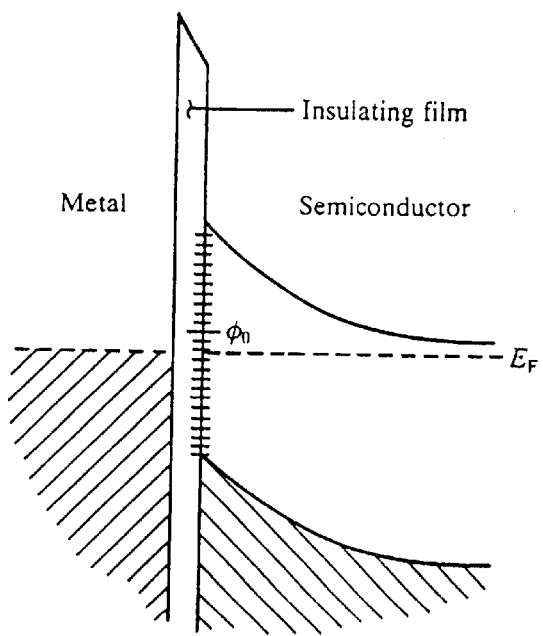
FIG. 42 A shows the surface states of a metal-semiconductor contact.
FIG. 42B schematically illustrates an embodiment of the present invention comprising a metal-semiconductor-interface-barrier reduction layer.

Schottky barrier values can be determined by the slope change of the curve taken from external I vs. V curve measurements. At room temperature the barrier height was 175–180 meV, irrespective of the dopant concentration (Te) in InSb up to $10^{20}$ $cm^{-3}$ (in contact). FIG. 41 shows the barrier height as a function of temperature for a 2000 Å interface layer doped with Te to $3 \times 10^{19}$ $cm^{-3}$ deposited on InSb doped with Te to $1\times10^{18}$ cm$^{-3}$ (500 $\mu$) for an In emitter. Since the barrier height decreases with temperature at a faster rate than $E_g$, it means that the neutral level $\phi_o$ is higher than $E_F$, and the surface density of states increases with temperature. FIGS. 40 and 41 provide for $\phi_o$ to be estimated at 15–20 meV at around 300° C. This type of barrier is illustrated in FIG. 42A. The insulating film (oxide) shown in FIG. 42A is so thin that carriers tunnel through without giving an appearance of an actual barrier, even if it is present. It has been found in the context of this invention that the implementation of this type of diode increases operating temperatures of embodiments of this invention.

a. Experimental results

Samples were manufactured on the basis of InSb wafers doped with Te to $1\times10^{18}$ cm$^{-3}$. The wafer thickness was about 500 microns and polished on both sides. After standard cleaning, an emitter layer of 2000 Å of InSb doped with Te to $3\times10^{19}$ cm$^{-3}$ concentration was deposited on a wafer by magnetron sputtering. The sample size ranged from 1×1 to 3×3 mm$^2$ squares that were painted with InGa eutectic ($T_m$=35° C.) on both sides. The painting process involved the application of some pressure to destroy any surface oxide layer.

Figure 42B:
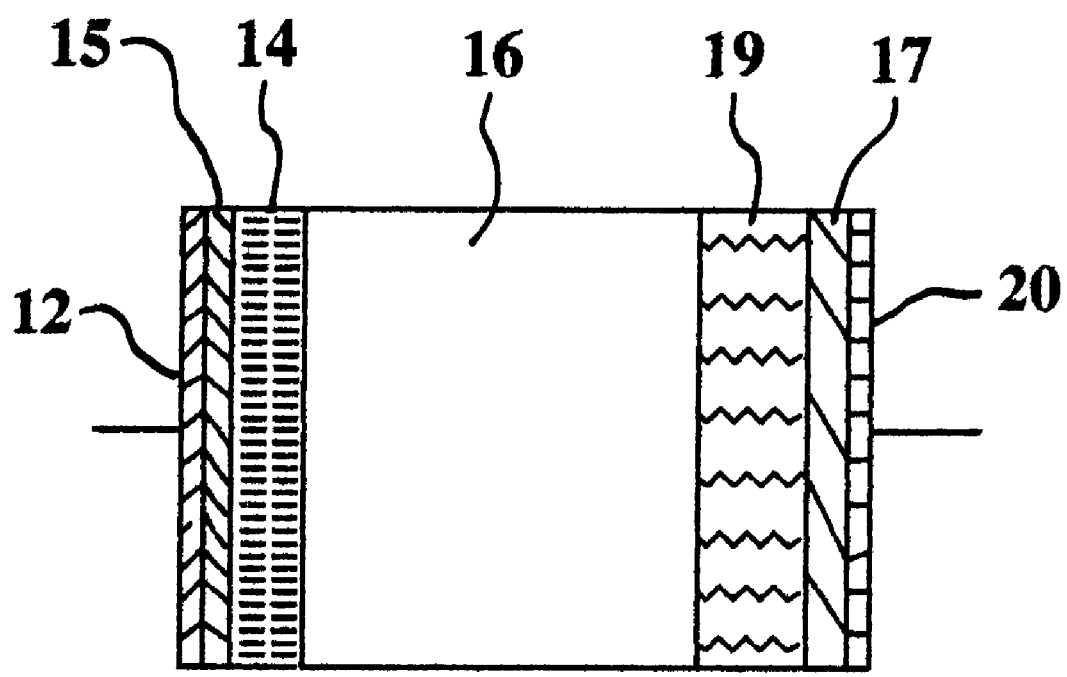

FIG. 42B schematically illustrates an embodiment of the present invention comprising a hot ohmic contact 12, an emitter 14, a gap region 16, a compensated region 19, and a collector 20. Region 15 is preferably formed on the emitter side that faces hot ohmic contact 12 to reduce the metal-semiconductor interface barrier. In preferred embodiments, this metal-semiconductor-interface-barrier-reduction layer is formed by magnetron sputtering. Region 17 is preferably formed on the gap region side that faces the collector cold metal contact 20, and its effect is to reduce the metal-semiconductor interface barrier. This region is preferably formed by techniques analogous to those employed to form region 15. Other embodiments of the present invention comprise only region 15, and still other embodiments of the present invention comprise only region 17. As indicated above, the presence of at least one of regions 15 and 17 in embodiments of the present invention, including compensated and uncompensated embodiments, increases their operating temperatures.

The test apparatus included a cartridge heater rated at 400 W in a massive silverized copper block, and a water cooled cold plate (silverized copper) mounted on a micrometric linear stage. The electric leads were massive flexible copper strands (<10$^{-4}$ ohms). The temperature was controlled with Omega RTD's with a Keithly 2001 display. A custom made resistor bank was provided for loads from 10$^{-4}$ ohms and higher. The voltage was measured with 0.01% accuracy, and the current with 1% accuracy. The samples were installed on a hot plate and compressed with the cold plate on a linear positioning stage. Argon gas was introduced between the plates to prevent oxidation of the materials at elevated temperatures. The hot side was thermally insulated from the mounting plate and ambient air.

Figure 43:
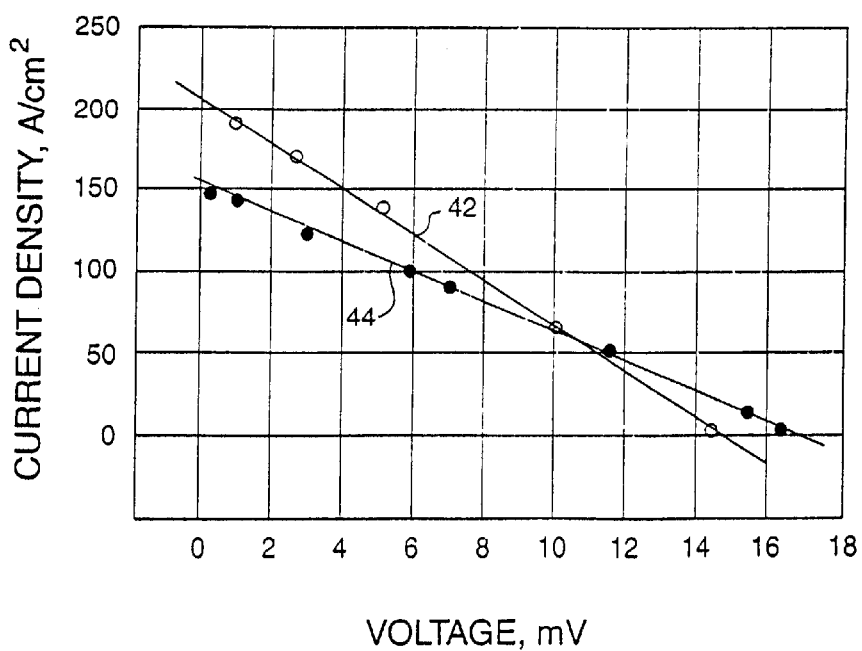
FIG. 43 shows the I–V curves for a single diode and a stack of three InSb diodes.

FIG. 43 illustrates an example output I vs. V curve for a single sample indicated by line 42 and a stack of three samples indicated by line 44 for an emitter temperature of 200° C. At the point of maximum extracted power, the output difference is less than 20% when the decrease in the heat flow is at least three times. This means that the efficiency in a stack configuration increases dramatically. Furthermore, each interface introduces thermal resistance due to the non-ideal contact and the phonon mismatch effect. The minimal numbers for phonon mismatch are around 4% (See Swartz, E. T., *Thermal Boundary Resistance,* Vol. 61, No. 3 (July 1989), which is incorporated herein by reference). Each sample introduces two additional boundaries.

Replacing the sample orientation in a stack, such as the emitter layer on the cold side, reduces the output in a stack of 5 samples by approximately 5 times at 200° C., and approximately 2 times at 300° C., compared with a stack built correctly. At 300° C. and recalculated on the basis of InSb thermal conductivity and electric output, in some instances the efficiency was better than 25% of ideal Carnot cycle with an output power density of 3–8 W/cm$^2$.

8. Additional Examples

This section describes testing device characteristics, sample preparation techniques, and more specific results regarding embodiments that contain InSb and/or an Hg—Cd—Te— based material.

a. Test Apparatus and Sample Preparation.

Testing devices were designed on the basis of standard mechanical parts for laser applications, including a Coherent® stainless steel bread board. Micrometric linear stage and laser optical stands allowed for 100 mm of vertical linear travel.

The hot side was mounted with a Macor ceramic ring on the linear stage and consisted of a massive copper block with a 400 W Ogden Scientific cartridge heater. The copper block was thermally insulated with porous ZrO$_2$ ceramics and fiberglass fabric. Interchangeable copper rods made of oxygen-free copper that had a 2-micron coating of silver were used to deliver heat to the sample. Each rod had at least two holes configured for receiving temperature sensors. By measuring temperature at two points along the rod and knowing the thermal conductivity and cross-section of the rod, the heat flow to the sample was determined.

A silver coated water-cooled cold plate was mounted on the top of the optical stand with a Newport three axis "Ball and Socket" stage, which allowed the parallel alignment of the cold and hot plates.

The electric current lead comprised silver coated braided copper wires having a resistance of about 10$^{-4}$ ohm. Load resistors in the range of about 10$^{-5}$ ohm to about 10$^{-1}$ ohm were made of copper and stainless steel and were connected to the current leads by massive bolts.

Power to the heater was supplied by a Xantrex 300—3.5 DC power supply. Voltage across the load and sample resistance were measured with a HP34420A NIST-traceable nanovolt/microohmeter in a 4-wire configuration. Keithley 2001 multimeters were used as readouts for Omega thermocouples and RTD temperature sensors. Electric current was measured by an Amprobe® A-1000 transducer. Load and leads resistance allowed independent current determination. On all measured parameters except currents below 1A, the accuracy was better than 1%.

To prevent oxidation of the sample and contacts at elevated temperatures, argon gas was introduced between the hot and cold plates using a Capton foil skirt.

Material for the sample preparation comprised InSb wafers (WaferTech, U.K.) of about 2" in diameter and 500$\mu$ in thickness. The wafers were polished to about 20 Å RMS (root mean square) on both sides. Standard dopant (Te) concentration was about 10$^{18}$ cm$^{-3}$. The emitter layer was deposited by magnetron sputtering. An InSb target doped with $3\times10^{19}$cm$^{-3}$ Te was also used. The emitter layer thickness was in the range from about 400 Å to about 15000 Å. Emitter thickness in embodiments of the present invention was at least about 400 Å. Furthermore, principles in the context of this invention do not impose any limitation to the emitter thickness and therefore embodiments of this invention are not limited by constraints in an upper bound for such thickness.

To create a compensation layer, about $10^{18}$ cm$^{-3}$ p-type impurity was placed in the semiconductor to compensate the already existing n-type dopant (Te) at a concentration of about $10^{18}$ cm$^{-3}$. Vacancies in InSb form p-type carriers with ionization energy of about 60 meV (see, e.g., Landolt-Bornstein), which is roughly the same as the ionization energy of Te. The implantation doses were recalculated by using TRIM-91 software to form a compensation layer.

Figure 46:
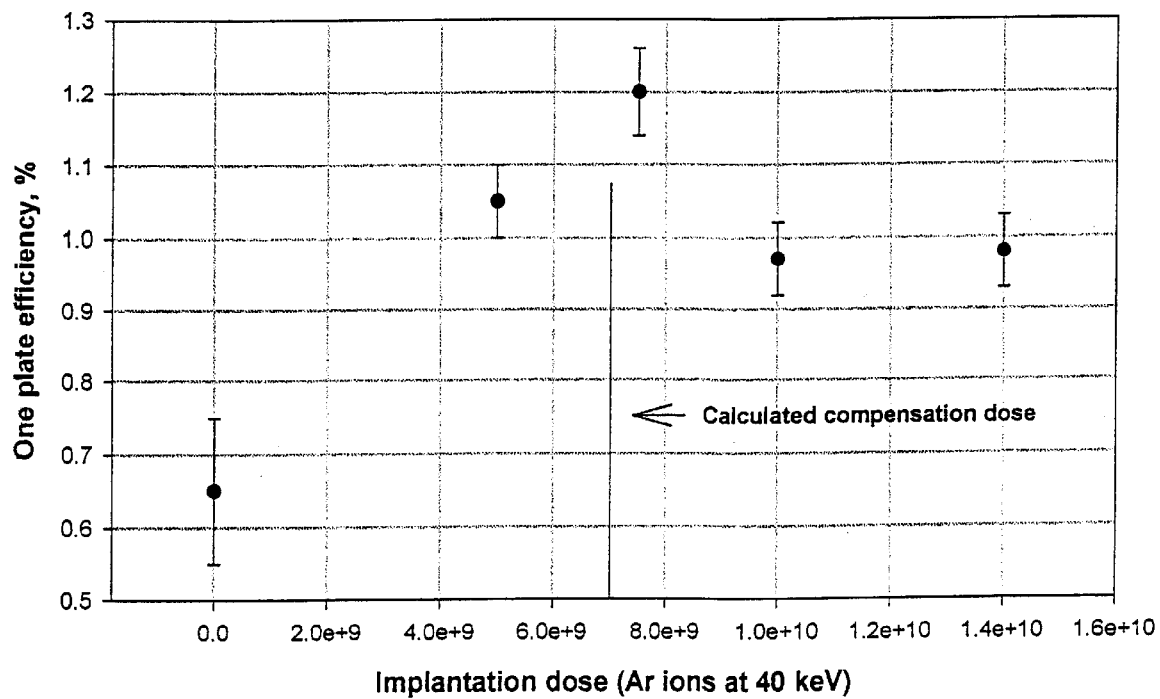
FIG. 46 shows a graph of one plate efficiency for InSb as a function of Ar ion implantation dose for a sample whose size is $0.50\times1.0\times1.5$ mm$^3$.

The samples were then cleaned and cleaved to fit the implanter. The samples were implanted with 40 keV Ar ions (Core Systems, Inc., Santa Clara, Calif.) at different doses. Each sample was tested in a conversion mode at about 200° C. Test results are shown in FIG. 46, together with calculated doses required for the compensated diode. The doses were varied because the dopant concentration in wafers was known to about 10% accuracy. An implantation dose of zero in FIG. 46 corresponds to a non-compensated sample, and implantation doses greater than zero in FIG. 46 refer to compensated samples. As shown in FIG. 46, comparison of the maximum efficiency for the compensated samples shown therein with the efficiency of the non-compensated sample reveals that the compensation layer leads to about 80% performance improvement. For comparison, FIG. 46 also shows the computed efficiency that is predicted at a given implantation dose.

Figure 47:
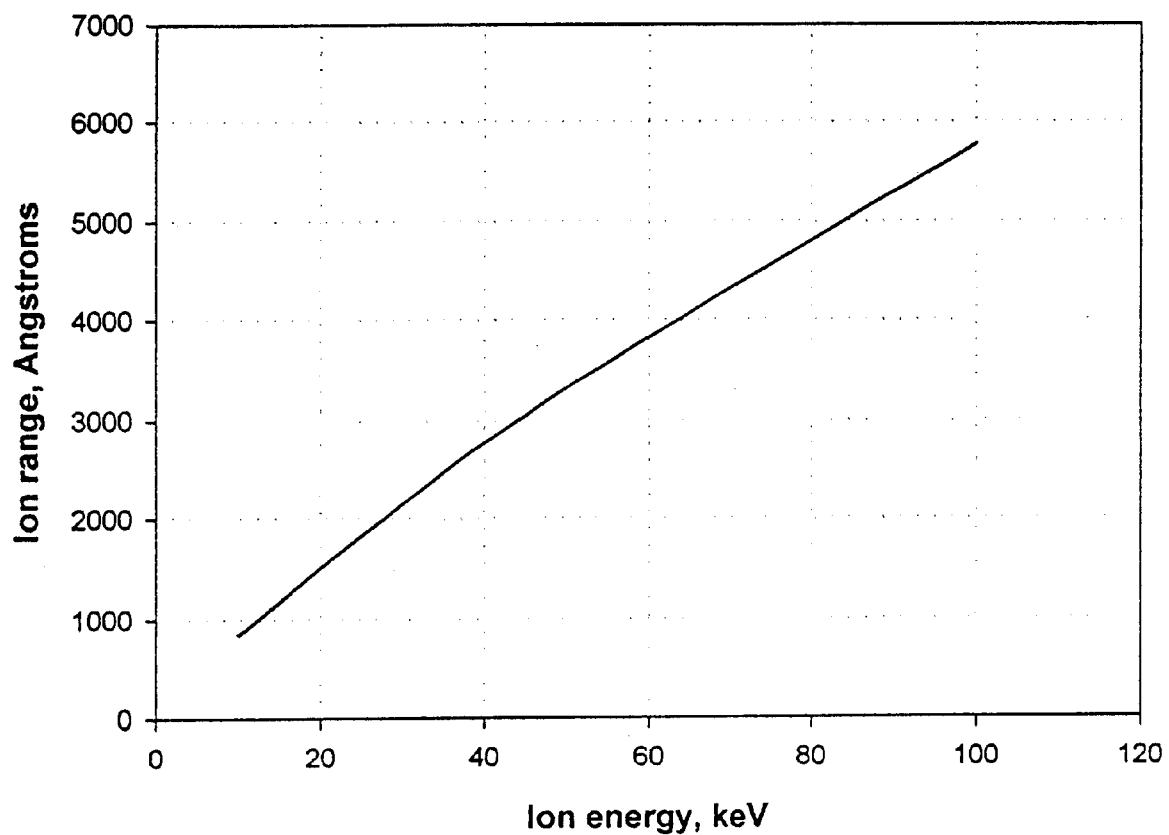
FIG. 47 shows a graph of the $^4$He ion implantation range as a function of ion energy for an InSb target.
Figure 48:
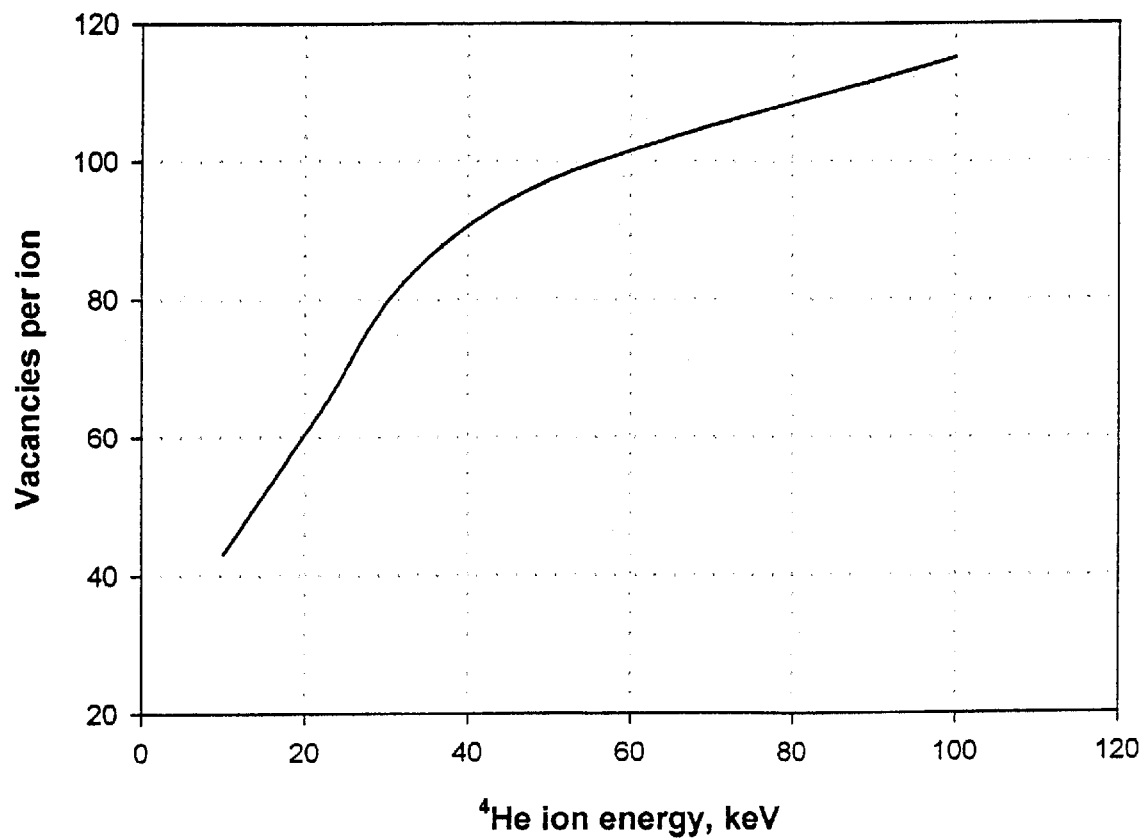
FIG. 48 shows the results of a simulation for the number of vacancies per ion as a function of $^4$He ion energy for the ion implantation referred to in FIG. 47.

The range for Ar$^+$ at 40 keV in InSb is approximately 400 Å, which is sufficient for creating a compensation layer. A 400 Å layer is prone to fast diffusion loss of vacancies at elevated temperatures. To avoid such diffusion loss, He ion implantation is performed in other embodiments. The He ion layer thickness in these embodiments is of the order of a few microns, which increases the effective life of the implantation layer. For example, the estimated diffusion half life of vacancies in InSb at 1 micron thickness is approximately 1 year at 200° C. Because the compensation layer is located on the cold side of embodiments of this invention, diffusion problems are typically avoided when the compensation layer is a few microns thick. Computed ion ranges and vacancy formation for $^4$He ions in InSb are shown in FIGS. 47–48.

b. Embodiments with Hg$_{1-x}$Cd$_x$Te

Hg$_{1-x}$Cd$_x$Te semiconductors (herein referred to as "MCT") have very good thermionic figure-of-merit values when $0.08 \leq x \leq 0.15$, where the upper and lower bounds are given approximately. In preferred embodiments, x is about 0.14. Embodiments of this invention comprised a 500 micron thick Hg$_{0.86}$Cd$_{0.14}$Te wafer (Lockheed Martin IR Imaging Systems). MCT reacts with various substrates, creating heavily doped donor (reacting with metals such as In, Fe, Ga and Al) or acceptor (reacting with metals such as Ag, Au, and Bi) layers, with the reaction rate depending on the material and temperature. See, P. Caper, *Properties of Narrow Gap Cadmium-based Compounds*, INSPEC, 1994, which is incorporated herein by reference.

The reactivity of MCT allows to build n*/n emitter layers more easily than with InSb because InSb is less reactive and requires the implementation of a more complex technique for creating an n* region. Furthermore, InSb is limited to dopant concentrations of about $2-3 \times 10^{19}$ cm$^{-3}$.

Figure 49:
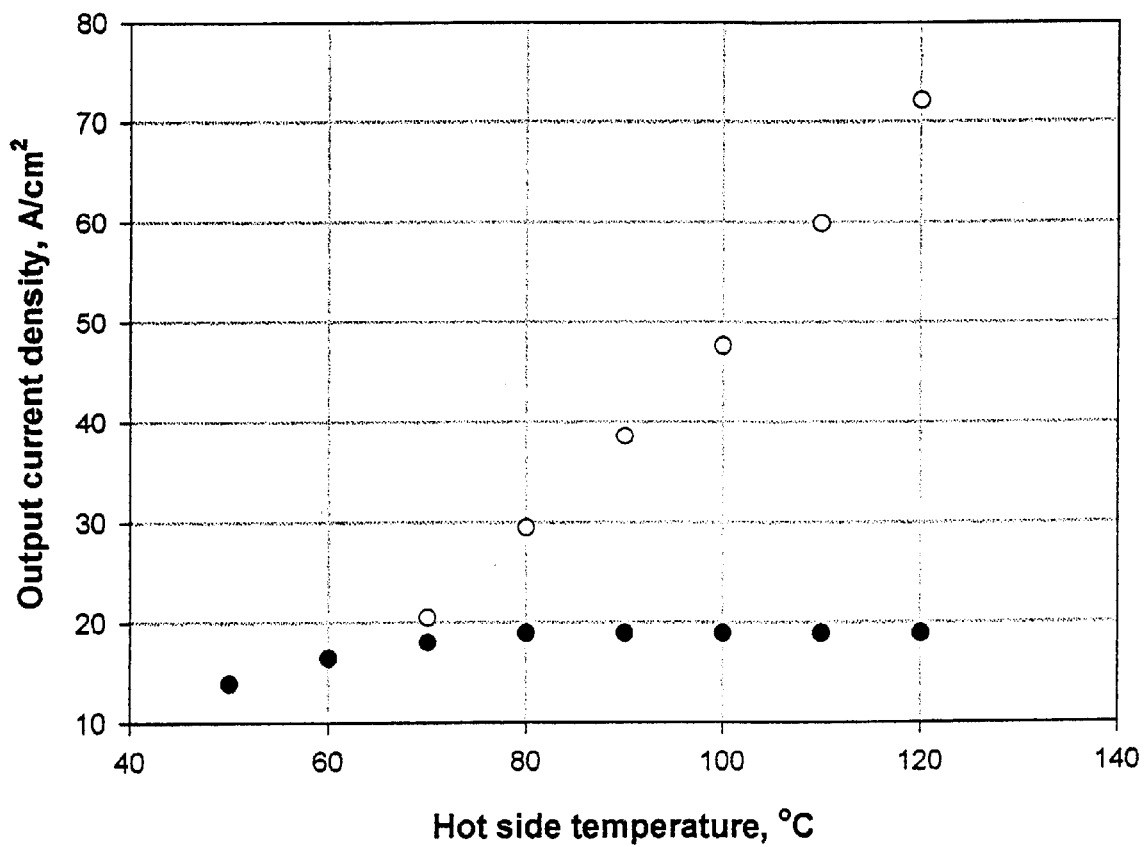
FIG. 49 shows a graph of output current density for an embodiment comprising a $Hg_{0.86} Cd_{0.14}$ Te sample as a function of the hot side temperature for the sample with a Cu emitter layer and for the sample with an In-Ga emitter layer.

Embodiments of the present invention show that substrates that form donor impurities are preferred because they generate higher current densities. As shown in FIG. 49, a thermoelectric response without a carrier injection layer generates a current density that exhibits little or no change with respect to temperature. For example, copper forms an acceptor impurity and should not form an n* region. In contrast, substrates such as Al, In and Ga form n-type impurities in MCT and they create electron-injecting n* regions. FIG. 49 shows electric current density as a function of temperature for Hg$_{0.86}$Cd$_{0.14}$Te samples, one of them with a Cu emitter layer and another with an In-Ga emitter layer with substrate composition In$_{0.75}$Ga$_{0.25}$ Contact resistance was monitored in both cases to ensure that oxide layers do not play a significant role in the observed results. In particular, it was found that In-Ga makes a slightly better contact than copper (about 92 mΩ for In-Ga compared to about 103 mΩ for copper). As shown in FIG. 49, the electric current density as a function of temperature for the sample with copper flattens out. The MCT sample was allowed to cool down and a layer of In-Ga about 20–50 micron thick was placed on top of the copper substrate. As shown in FIG. 49, the electric current density exhibited a change with temperature that was similar to that exhibited by the sample with copper only at temperatures up to about 70° C. The same figure shows that above this point the electric current density clearly increased with temperature. This is attributed to the acceptor-type impurity being swamped by n-type impurity, thus causing the sample to exhibit a carrier injection mode with many times higher current output. Output voltage in both cases was approximately the same, from about 290 to about 350 μ V/K, and is consistent with the known thermoelectric Zeebeck coefficient for MCT.

Figure 50:
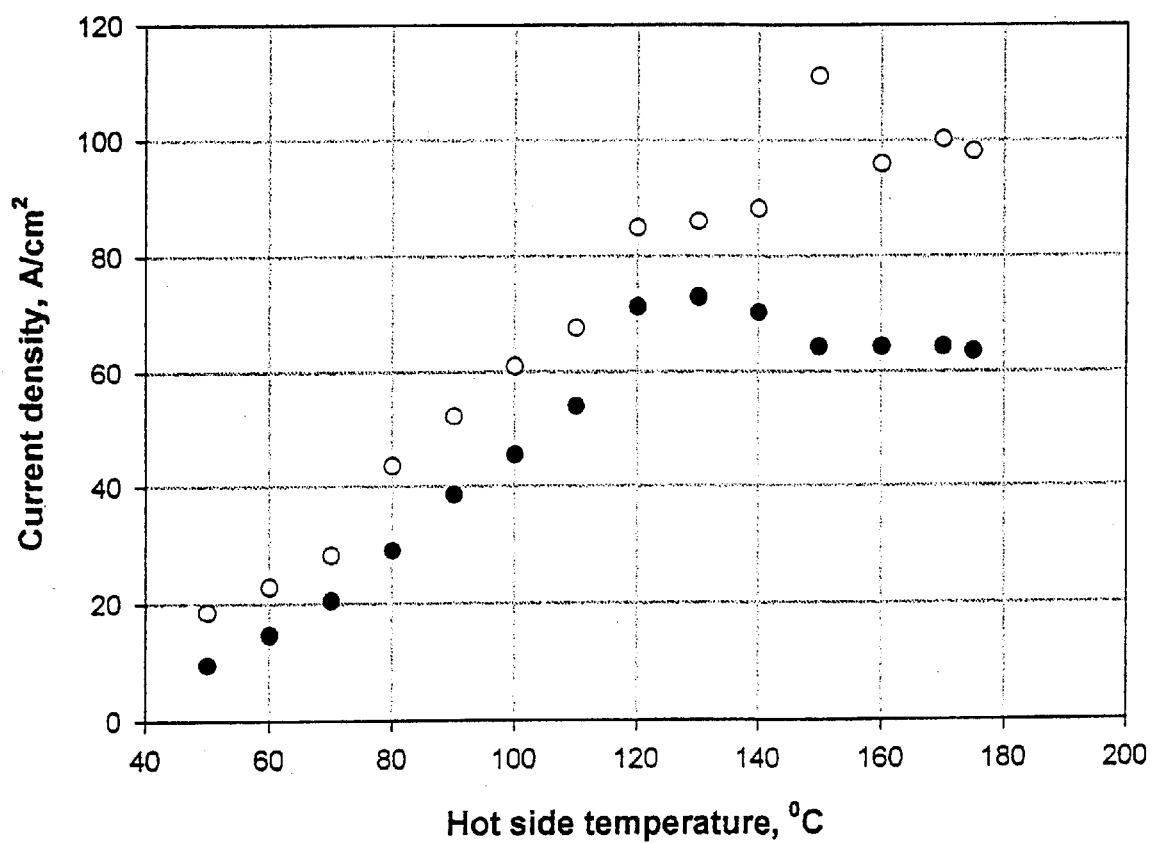
FIG. 50 shows a graph of output current density for an embodiment comprising a $Hg_{0.86} Cd_{0.14}$ Te sample as a function of the hot side temperature for the sample with an Al substrate and for the sample with an In-Ga substrate.

Different donor materials lead to different electric current densities. FIG. 50 shows the electric current density as a function of temperature for two Hg$_{0.86}$Cd$_{0.14}$Te samples, one of them with an Al substrate and the other sample with an In-Ga substrate. A preferred composition of this substrate is embodied by In 0.75 Ga$_{0.25}$. The In-Ga substrate forms a better emitter than Al because the electric current density as a function of temperature is consistently higher for the sample with In-Ga over the entire temperature range. Although not shown in the form of electric current density vs. temperature graphs, In forms a better emitter than Ga, particularly with pure In substrate. Substrates such as Al, In and Ga are examples of substrates that form n-type impurities in MCT that create electron injecting n* regions.

Figure 51:
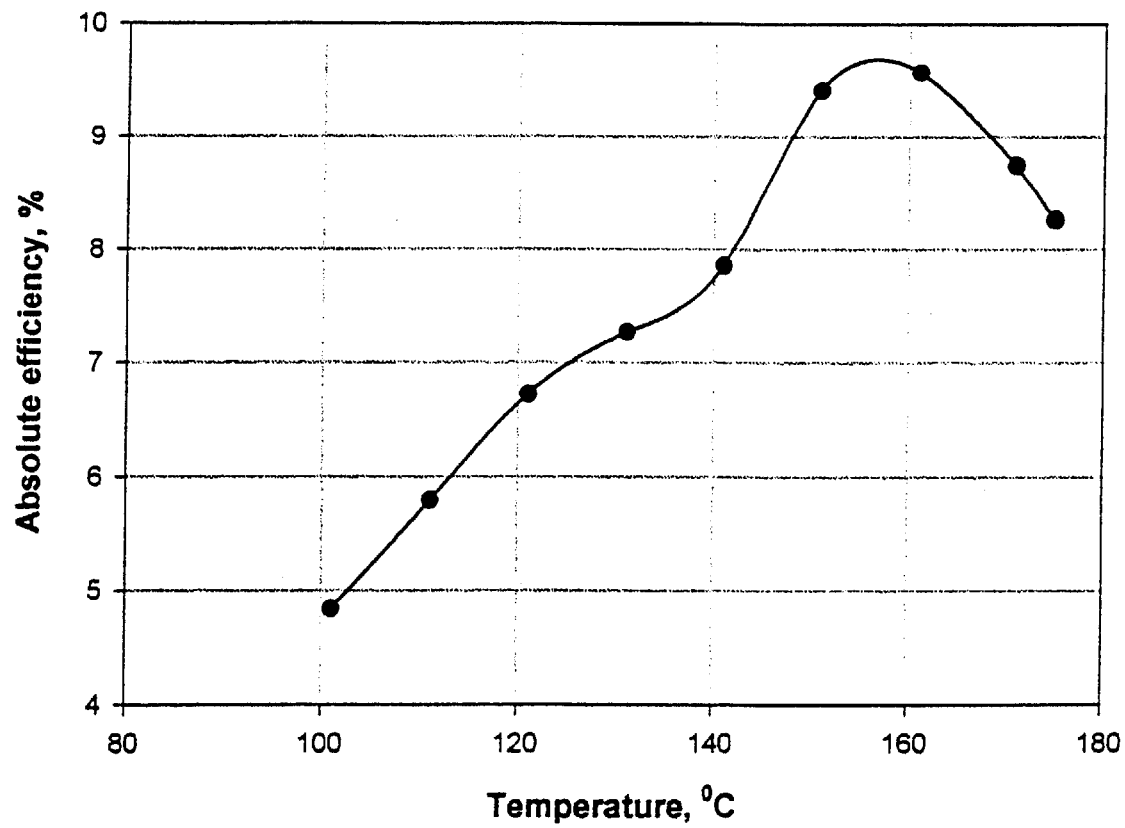
FIG. 51 shows a graph of the absolute efficiency as a function of temperature for an embodiment of a thermal diode without compensation comprising a $Hg_{0.86} Cd_{0.14}$ Te sample.
Figure 52:
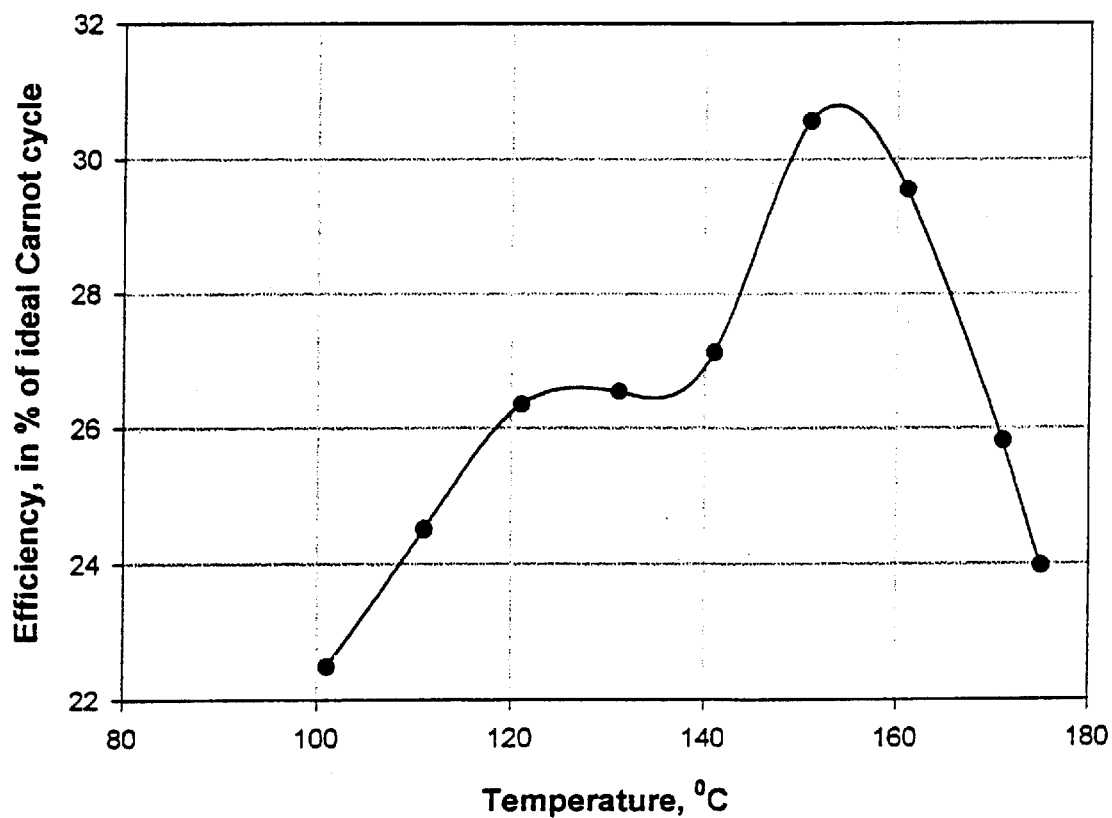
FIG. 52 shows a graph of the efficiency, expressed as a percentage of ideal Carnot cycle efficiency, as a function of temperature for the same embodiment referred to in FIG. 51.

FIG. 51 shows the absolute efficiency exhibited by an embodiment of a MCT converter according to the present invention in which the n* emitter layer was formed by reacting MCT with In$_{0.75}$G$_{0.25}$ eutectic. Absolute efficiency is defined as the ratio of an electric power output to the heat flow through the sample. The same data shown in FIG. 51 was recalculated in terms of a percentage of an ideal Carnot cycle efficiency, which are shown in FIG. 52. Ideal Carnot cycle efficiency $\Theta_c$ is defined as $\eta_c = (T_{hot} - T_{cold})/T_{hot}$. It is accepted that more than 30% of an ideal Carnot cycle efficiency is beyond the capabilities of any conventional thermoelectric device, and that conventional thermoelectric devices can hardly reach 20% of an ideal Carnot cycle efficiency. In contrast, FIG. 52 shows that embodiments of the present invention consistently generate over 20% of an ideal Carnot cycle efficiency in the temperature range from about 100° C. to about 175° C. with $T_{cold} = 20.5$° C., and that the efficiency is over 30% of an ideal Carnot cycle efficiency at temperatures from about 150° C. to about 160° C.

Declining converter performance beyond 150–160° C. could be attributed to emitter layer dissolution and/or injected carrier recombination. To avoid this declining converter performance, embodiments of the present invention comprise a diffusion barrier. An ytterbium layer of up to about 10 Å is an example of such diffusion barrier. A thickness of up to about 10 Å is preferred because such metal layer does not significantly affect electron transport properties. For additional ways to make diffusion barriers, see, e.g., A. Raisanen et al., in Properties of II–VI Semiconductors, MRS Society Symposium Proceedings, vol. 161, pp. 297–302, 1990, which is incorporated herein by reference.

C. Embodiments with a InSb/Hg$_{1-x}$Cd$_x$ Te Sandwich.

As shown above, embodiments of this invention that comprise stacked InSb plates with an emitter on a hot side configuration, display a significantly enhanced efficiency. Efficiency for these types of embodiments was determined as follows.

InSb and MCT exhibit best performances at different temperatures: from about 300° C. to about 350° C. for InSb and about 150° C. for MCT. By taking into consideration these different temperatures, embodiments of converters according to this invention are optimized for both materials.

The small thermal conductivity of MCT makes the direct measurement of heat flow difficult, especially when the measurements have to be taken with small samples. Furthermore, the dimensions of some of the samples used in embodiments of the present invention were at most a few square millimeters and, because of these reduced dimensions, were not suitable for contact temperature measurements with available temperature sensors. In addition, the small size of these samples did not permit the use of standard IR imaging cameras because of the limited spacial resolution of such IR imaging cameras. A methodology that relies on custom optics IR cameras avoids this problem.

Another methodology, which was adopted in these experiments, implies the following assumptions. Plates with the same thickness exhibit the same heat flow with substantially no heat loss. The total temperature drop across the stack is written as $\Delta T=\Delta T_1+\Delta T_2$, where $\Delta T_1$ is the temperature drop across the first plate and $\Delta T_2$ is the temperature drop across second plate. The temperature-dependent thermal conductivities of InSb and MCT are, respectively, $\lambda_1(T)$ and $\lambda_2(T)$. The following system of equations is set forth with these variables:

$$\lambda_1(T)\Delta T_1 = -\lambda_2(T)\Delta T_2 \quad \Delta T = \Delta T_1 + \Delta T_2$$

$\Delta T$ can be measured as a temperature difference between the cold and the hot plates, and the first equation can be iterated using $\Delta T_1$, $\lambda_1(T)$ and $\lambda_2(T)$ values. The heat flow and the temperature drop across each plate are estimated according to this iterative procedure. As indicated above, the converter efficiency is computed by taking the ratio of the electric power output to the heat flow through the device. The thickness of the InSb plate was adjusted to vary the converter operating temperature range from less than 150° C. to more than 300° C. with substantially the same fraction of Carnot cycle efficiency at over 30%. In contrast, conventional energy converters available at present typically exhibit a fraction of Carnot cycle efficiency of about 16% in a narrow temperature range.

Figure 53:
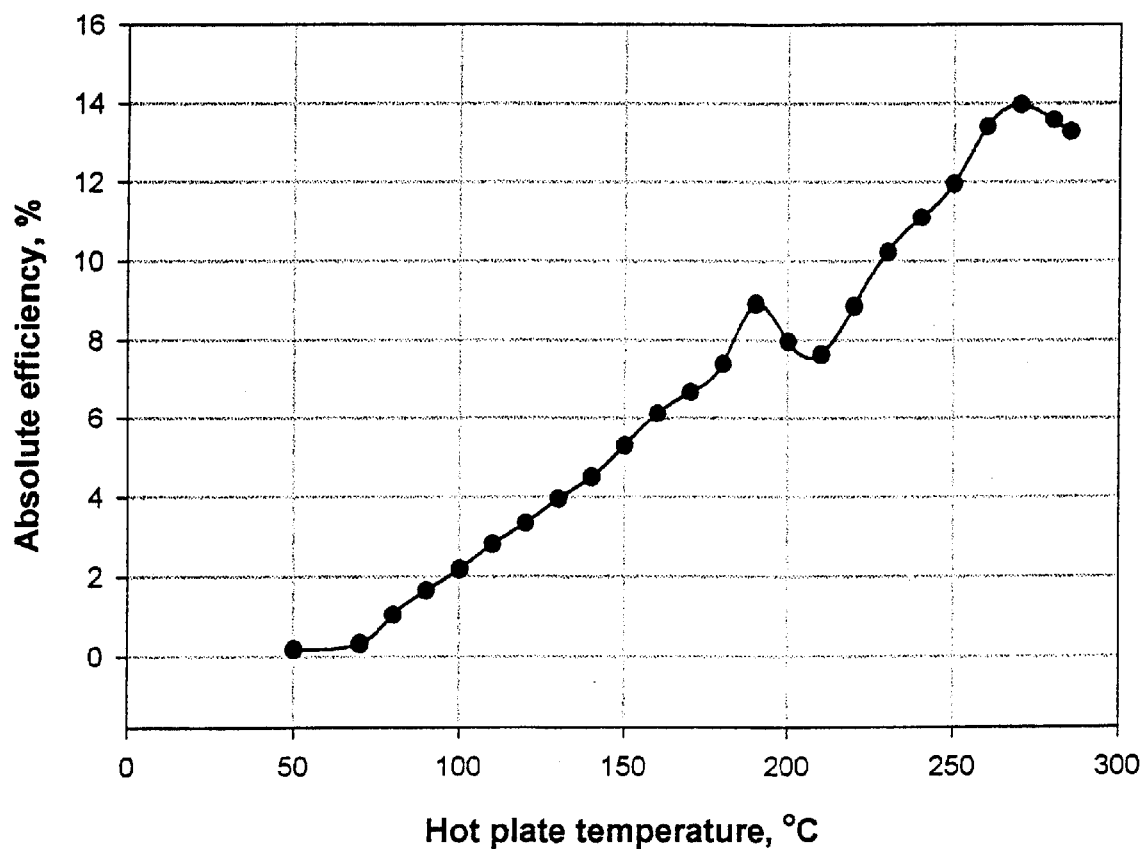
FIG 53 shows a graph of the absolute efficiency for an embodiment of a sandwich converter as a function of hot plate temperature.
Figure 54:
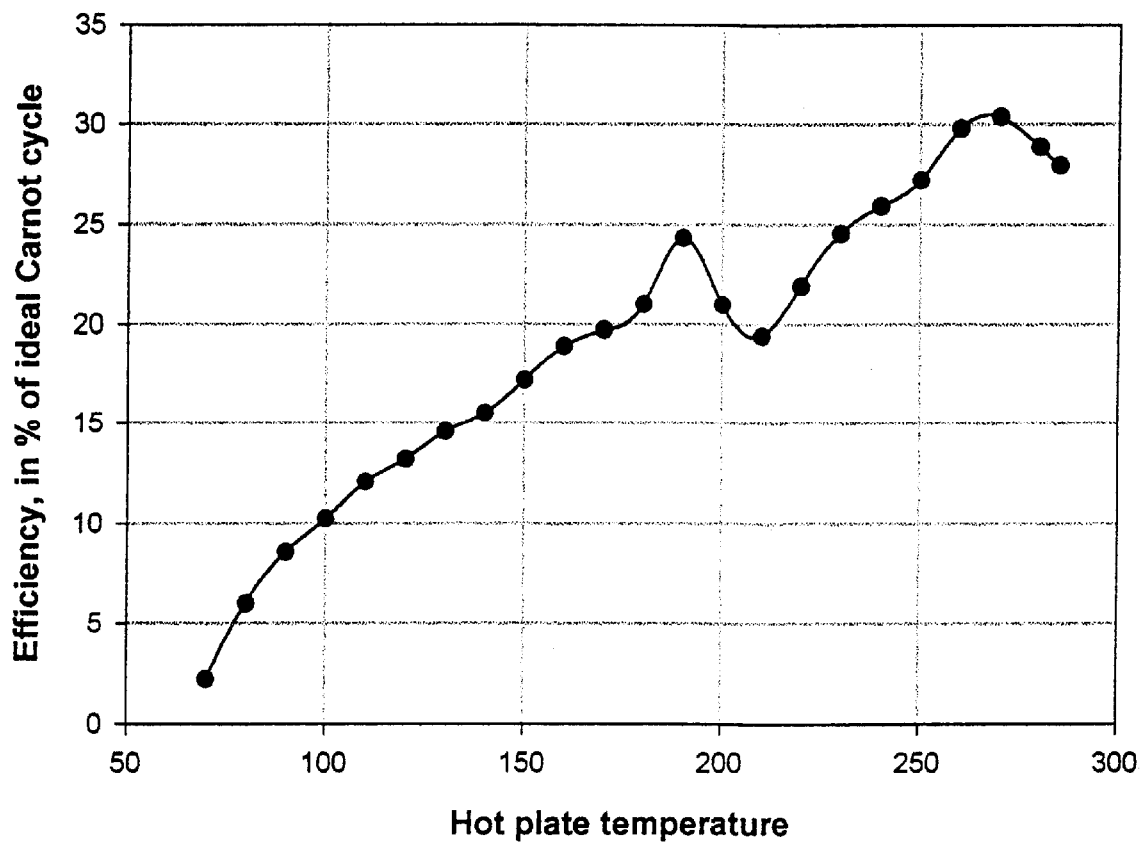
FIG. 54 shows a graph of the efficiency, expressed as a percentage of ideal Carnot cycle efficiency, as a function of hot plate temperature for the same embodiment referred to in FIG. 53.

FIG. 53 shows the efficiency of an embodiment of a sandwich converter according to the present invention. An about 1-mm thick InSb plate was used in this embodiment and the dopant (Te) concentration was about $10^{18}$ cm$^{-3}$. The emitter layer was about 2000 Å and it comprised a sputtered InSb layer with about $3 \times 10^{19}$ cm$^{-3}$ Te. The plate was coated with a layer containing In—Ga. A preferred composition of this In—Ga material is embodied by In$_{0.75}$ Ga$_{0.25}$. The thickness of this layer was from about 30 microns to about 50 microns. A second plate was made of Hg$_{1-x}$Cd$_x$Te, with x preferably satisfying $0.08 \leq x \leq 0.15$, with the upper and lower bounds given approximately. A more preferred form of this compound has an approximate stoichiometry given by Hg$_{0.86}$ Cd$_{0.14}$ Te, with a thickness of about 0.51 mm. The average stack cross section was about $1.70 \times 1.52$ mm$^2$. The fraction of an ideal Carnot cycle efficiency as a function of the hot plate temperature for this embodiment is shown in FIG. 54. $T_{cold}$ regarding FIG. 53–54 was 20° C. As shown in FIG. 54, the percentage of an ideal Carnot cycle efficiency for this embodiment at maximum performance is about the same as that displayed in FIG. 52, but this embodiment exhibits it at a significantly higher temperature.

d. Hg$_{1-x}$Cd$_x$ Te Figure of Merit.

Figure 55:
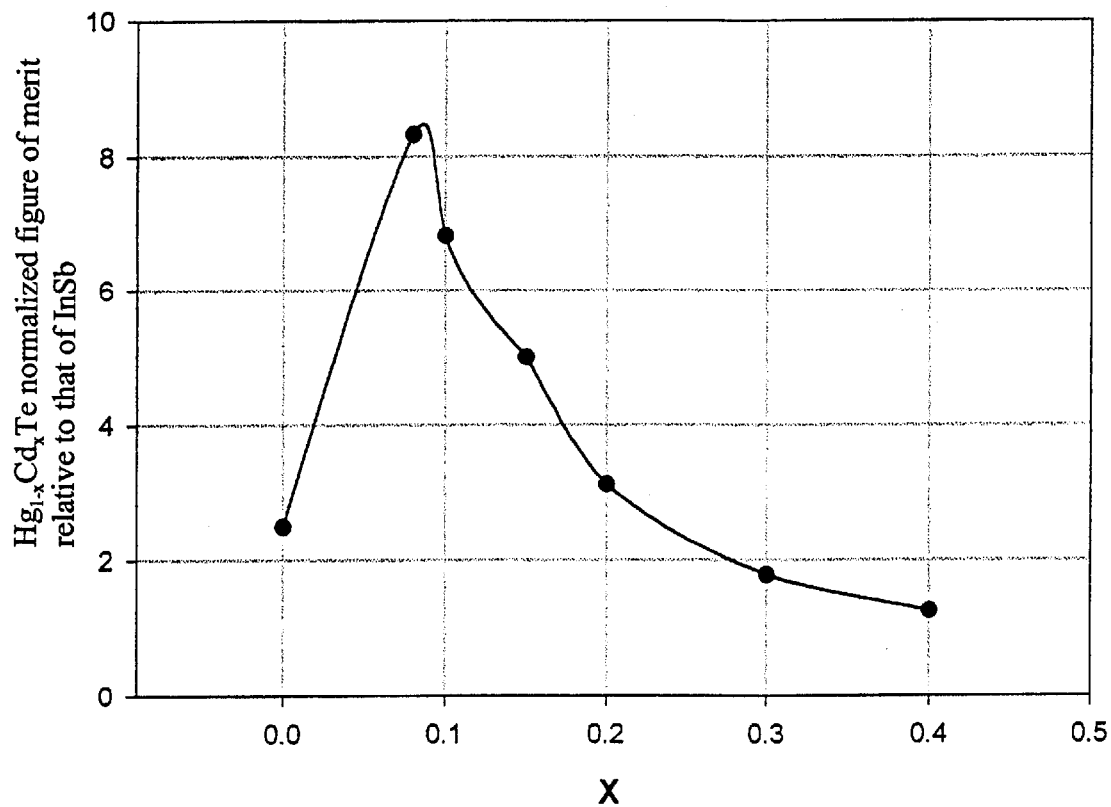
FIG. 55 shows a graph for the $Hg_{1-x}Cd_x$ Te normalized figure of merit relative to that of InSb as a function of x.

As shown in Table 2, the figure of merit for the HgTe is about 2.5 times better than that for InSb. Addition of Cd to HgTe improves carrier mobility and reduces thermal conductivity. FIG. 55 shows the normalized thermionic figure of merit for Hg$_{1-x}$ Cd$_x$ Te relative to that of InSb as a function of x. For x=0.08, the figure of merit for Hg$_{0.92}$ Cd$_{0.08}$ Te is about 0.0065, which is better than the figure of merit for HgTe by a factor of about 2. In other embodiments of this invention, the figure of merit is envisaged to be as low as about 0.001.

It was also found in the context of this invention that preferred embodiments of Hg$_{1-x}$ Cd$_x$ Te have x-values in the range from about 0.08 to about 0.15 and that it is in this region that this material exhibits the highest value for its thermionic figure of merit while the material still exhibits semiconductor properties. This supports the relationship between the n* emitter layer and the gap and the compensation layer and the gap that has been described hereinabove.

9. Refrigeration Embodiments

Figure 1:
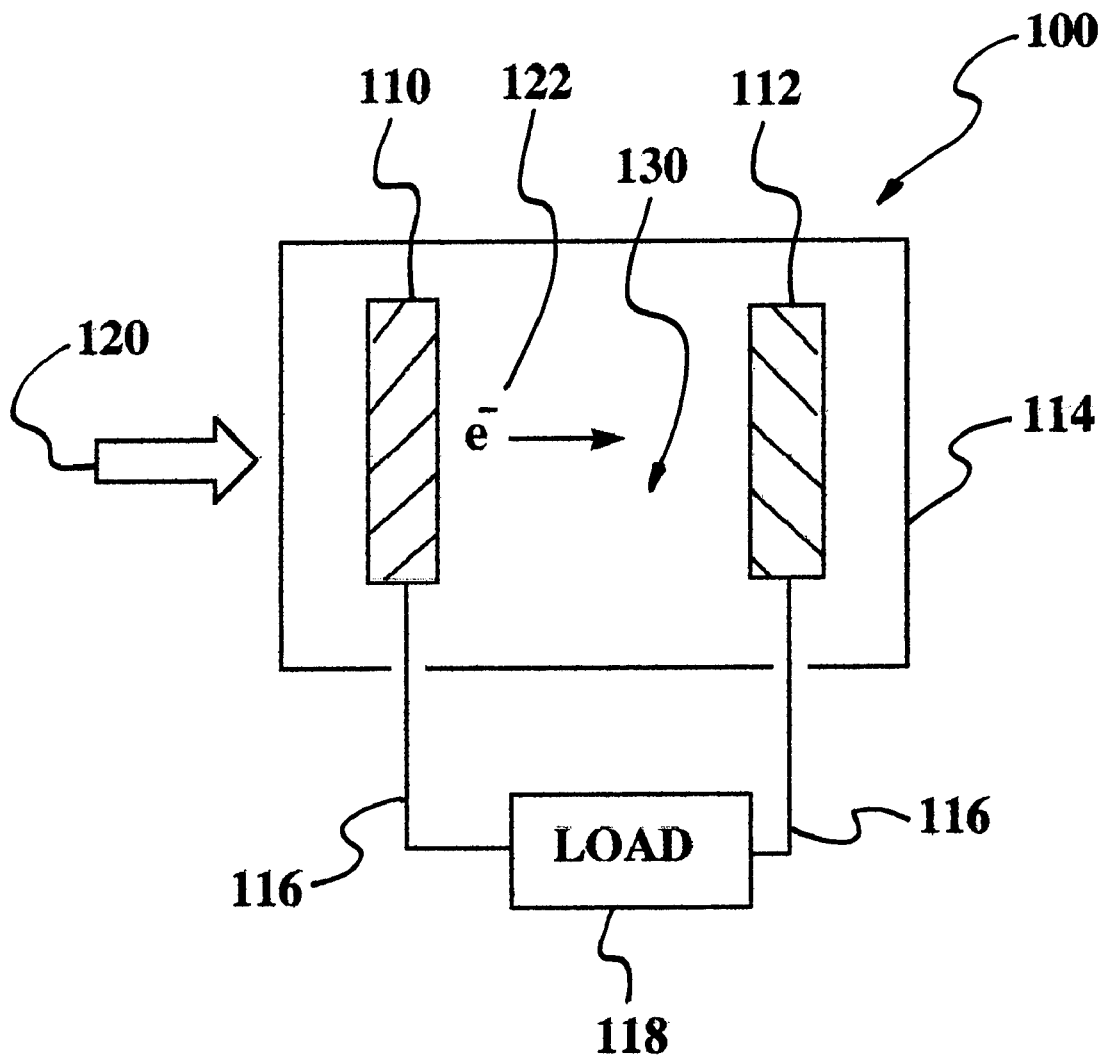
FIG. 1 schematically shows an embodiment of a conventional thermionic converter.

The main components of a thermionic converter 50 for providing refrigeration (see FIGS. 44 and 45) are essentially the same as those of a thermal diode 10 for converting heat to electricity, as set forth above (see FIGS. 1 and 25). Accordingly, the terms "solid state thermionic converter of thermal energy" generically refer herein to embodiments of converters of thermal energy into electricity according to this invention, and to refrigeration embodiments according to this invention.

Figure 44:
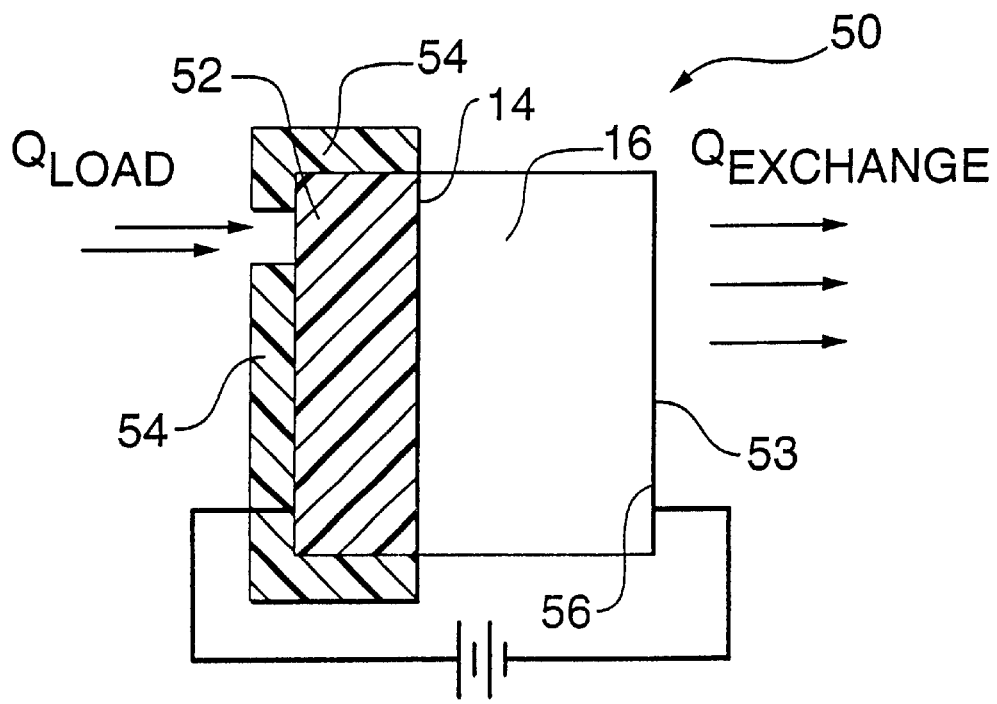
FIG. 44 illustrates a thermal diode for providing cooling.
Figure 45:
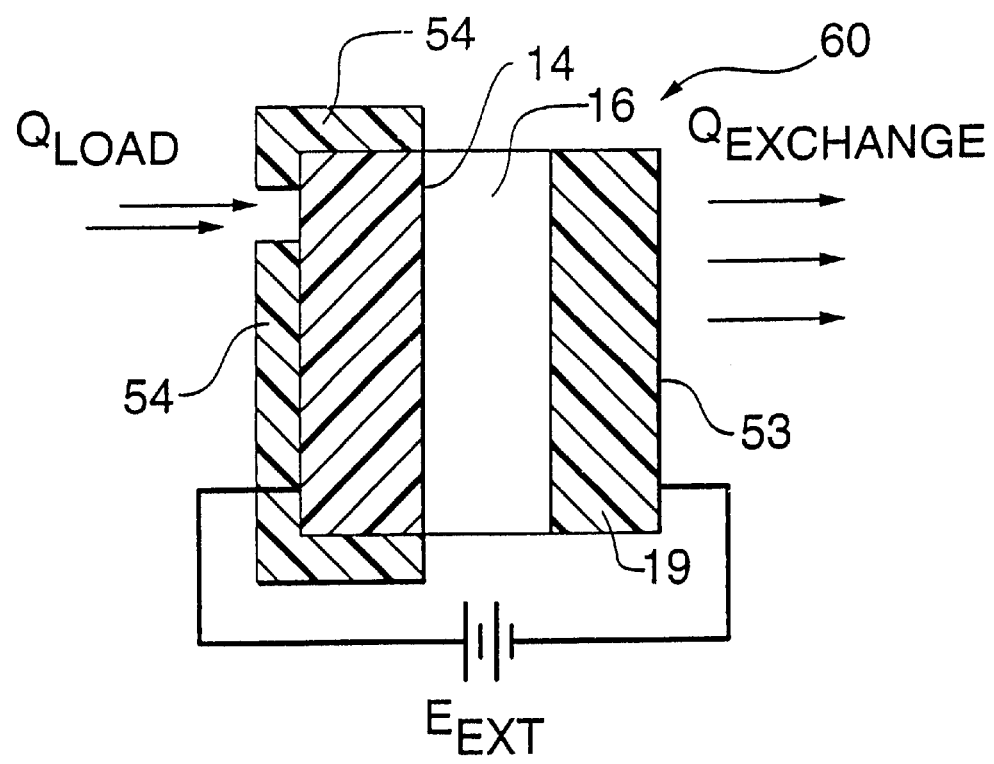
FIG. 45 shows a compensated thermal diode for providing cooling.

FIG. 44 illustrates the uncompensated thermal diode and FIG. 45 the compensated thermal diode. The essential difference between the heat to electricity and refrigeration embodiments is that carrier transport is assisted by an external electric field, $E_{Ext}$, and the n*-type region 14 is connected to a thermal load that is cooled by heat flow to the first ohmic contact 52 on the n*-type region 14. The n*-type region 14 is thermally insulated by means of an insulating material 54. Rather than a heated n*-type region 14, as is the case in the heat to electricity embodiment, a thermal load is cooled by heat flow, $Q_{Load}$, to the n*-type region 14 in the thermal diode 50 illustrated in FIG. 44. A gap 16 region is adjacent to the n*-type region 14, and a second ohmic contact 53 having a recombination collector region 56 is formed between the second ohmic contact 53 and the gap region 16. The gap region 16 may be n-type, p-type or intrinsic. For the case of the compensated thermal diode as shown in FIG. 45, a compensated region 19 is on the inside of the metal contact, which is created through the addition of p-type doping that suppresses the electronic return current. The back surface of the second ohmic contact 53 acts as a heat exchanger, and heat flow $Q_{Exchange}$ dissipates the heat from hot electrons. One skilled in the art of heat exchangers recognizes there are many means for accomplishing heat exchange including, but not limited to, air and liquid cooling, or equivalents thereof.

10. Applications

Since energy conversion is the basis of modem civilization, an efficient energy converter has numerous applications, such as existing utility power plants, solar power plants, residential electricity supplies, residential/ solar electricity supply, automotive, maritime, solar/maritime, portable electronics, environmental heat pump, refrigeration (cooling, air conditioning, etc.), aerospace, and so forth.

Power plants have a tremendous amount of waste heat with a potential of 300° C. and lower. Converting the waste heat at 20–40% of Carnot efficiency by using embodiments of the present invention is expected to give an additional 10–20% overall plant efficiency with equivalent savings on fuel.

The proliferation of low-cost energy converters according to the present invention is expected to lower the capital costs of solar concentrator power plants with a higher efficiency than current steam/electricity cycles. Lower operating temperatures will also lower maintenance costs.

Residential electric supplies based on direct heat to electric energy conversion are ideal for remote areas, where it is difficult or inconvenient to install power lines. The heat source may either be in the form of fossil fuel or solar concentrators. Solar concentrators can also be in the form of solar heated water pools, utilizing day/night temperature differences. A few hundred cubic meters of water with a hundred square meters of surface in conjunction with embodiments of the present invention could provide the electricity supply for a house in areas with a temperature differential of about 10° C.

A thermal diode according to the present invention in combination with a conventional engine driving an electric generator and an electric motor would substantially increase mileage.

Direct energy conversion has tremendous application in electric cars. One application involves using thermionic devices according to the present invention with operating temperatures up to about 150 to 200° C. as overall efficiency boosters. Another application is an automobile with an electric drive and a conventional engine coupled with an electric generator having a converter array according to the present invention as an intermediate radiator.

Automotive and propulsion applications are also applicable to maritime applications. In addition, solar concentrators may be used in a sail-type fashion. A combination of light and inexpensive plastic Fresnel lenses with thermal diode converters according to the present invention may be incorporated into modem rigid wing-type sails, providing for the use of wind and sun energy to propel a boat with about 100–200 W/m² of the sail solar component.

Since embodiments of the converter according to the present invention can utilize very small temperature gradients in a self-sustaining mode, a temperature gradient between the heat sinks will be created with asymmetric heat exchange on the surface (e.g., one heat sink can be thermally insulated). Also, the system will run until something malfunctions, cooling the environment and producing electricity. In summary, the method and apparatus disclosed herein is a significant improvement from the present state of the art of energy conversion.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by Letters Patent is:

1. A solid state thermionic converter, comprising:
   an emitter having at least a region comprising a first donor having a concentration $N_d^*$;
   a collector; and
   a gap region between said emitter and said collector in electric and thermal communication with said emitter and said collector, said gap region comprising a semiconductor, said semiconductor comprising a second donor having a concentration $N_d$, said concentration of said second donor being selected such that the natural logarithm of the ratio $N_d^*/N_d$ is between a numerical value greater than 0 and about 7.

2. A converter as recited in claim 1, further comprising a compensated region disposed between said gap region and said collector, said compensated region being configured to suppress electric current from said collector to said gap region.

3. A converter as recited in claim 1, wherein said natural logarithm of the ratio $N_d^*/N_d$ is in a range between about 3 and about 7.

4. A converter as recited in claim 1, wherein the temperature of said emitter is higher than the temperature of said collector when an electric current flows from said emitter to said collector.

5. A converter as recited in claim 1, wherein said emitter comprises a metal.

6. A converter as recited in claim 1, wherein said gap region comprises an n-type semiconductor.

7. A converter as recited in claim 1, further comprising a recombination region either disposed in electric communication between said gap region and said collector or comprising a portion of said collector in electric communication with said gap region.

8. A converter as recited in claim 1, wherein said emitter comprises InSb.

9. A converter as recited in claim 1, wherein said emitter comprises InSb doped with Te.

10. A converter as recited in claim 1, wherein said gap region comprises InSb doped with Te at a concentration in the range from about $10^{16}$ cm$^{-3}$ to about $3 \cdot 10^{19}$ cm$^{-3}$.

11. A converter as recited in claim 1, wherein said emitter comprises InSb doped with Te at a concentration in the range from about $10^{18}$ cm$^{-3}$ to about $3 \cdot 10^{19}$ cm$^{-3}$.

12. A converter as recited in claim 1, wherein said gap region comprises InSb doped with Te at a concentration of about $10^{18}$ cm$^{-3}$.

13. A converter as recited in claim 1, wherein the thickness of said emitter is at least about 400 Å.

14. A converter as recited in claim 1, wherein said gap region comprises a semiconductor whose dimensionless normalized conductivity $\chi$ is within the range from about 1 to about 0.001.

15. A converter as recited in claim 1, wherein said gap region comprises HgSe.

16. A converter as recited in claim 1, wherein said gap region comprises HgTe.

17. A converter as recited in claim 1, wherein said gap region comprises $Bi_{1-y}Sb_y$, wherein y is within the range from about 0.05 to about 0.2.

18. A converter as recited in claim 1, wherein said gap region comprises $Se_zTe_{1-z}$, wherein z satisfies $0 \leq z \leq 1$.

19. A converter as recited in claim 1, wherein said gap region comprises $Hg_{1-x}Cd_xTe$, wherein x is within the range from about 0.08 to about 0.2.

20. A converter as recited in claim 1, wherein said gap region comprises $Hg_{1-x}Cd_xTe$, wherein x is about 0.08.

21. A converter as recited in claim 1, wherein said gap region comprises a doped semiconductor with a dopant concentration in the range from about $10^{15}$ cm$^{-3}$ to about $10^{20}$ cm$^{-3}$.

22. A converter as recited in claim 1, wherein said gap region comprises a p-type semiconductor.

23. A converter as recited in claim 1, wherein said gap region comprises an intrinsic semiconductor.

24. A converter as recited in claim 1, wherein the energy barrier for electron injection from said emitter to said gap region is in the range from about $4 k_B T$ to about $5 k_B T$, where $k_B$ is the Boltzman constant and T is the absolute temperature at which the electron injection takes place.

25. A converter as recited in claim 1, wherein said emitter is thermally insulated.

26. A solid state thermionic converter of thermal energy, comprising:
an emitter having at least a region comprising a first donor having a concentration $N_d^*$;
a first ohmic contact in electric and thermal communication with said emitter;
a metal-semiconductor-interface-barrier-reduction layer between said first ohmic contact and said emitter;
a collector;
a second ohmic contact in electric communication with said collector;
a gap region between said emitter and said collector in electric and thermal communication with said emitter and said collector, said gap region comprising a semiconductor, said semiconductor comprising a second donor having a concentration $N_d$, said concentration of said second donor being selected such that the natural logarithm of the ratio $N_d^*/N_d$ is between a numerical value greater than 0 and about 7.

27. A converter as recited in claim 26, wherein said natural logarithm of the ratio $N_d^*/N_d$ is in a range from about 3 to about 7.

28. A converter as recited in claim 26, further comprising a compensated region disposed between said gap region and said collector, said compensated region being configured to suppress electric current from said collector to said gap region.

29. A converter as recited in claim 26, wherein said collector is formed on said second ohmic contact.

30. A converter as recited in claim 26, further comprising a thermally conducting layer deposited on at least one of said first and second ohmic contacts.

31. A converter as recited in claim 26, further comprising a recombination region either disposed in electric and thermal communication between said gap region and said collector or comprising a portion of said collector in electric and thermal communication with said gap region.

32. A solid state thermionic converter of thermal energy, comprising:
a plurality of plates $P_i$, with $1 \leq i \leq m$, where m is the total number of said plates, each one of said plates $P_i$ having an emitter $E_i$ having at least a region comprising a first donor having a concentration $N_d^*$;
a collector $C_i$; and
a gap region $G_i$ between said emitter $E_i$ and said collector $C_i$ in electric and thermal communication with said emitter $E_i$ and said collector $C_i$, said gap region $G_i$ comprising a semiconductor, said semiconductor comprising a second donor having a concentration $N_d$, said concentration of said second donor being selected such that the natural logarithm of the ratio $N_d^*/N_d$ is between a numerical value greater than 0 and about 7, and such that $1 \leq i \leq m$;
wherein each plate $P_j$ having an emitter $E_{j+1}$, a gap region $G_{j+1}$, and a collector $C_{j+1}$, so configured is connected in series with a group of an emitter $E_j$, a gap region $G_j$, and a collector $C_j$, for $1 \leq j \leq (m-1)$, the indexes i and j being integers, and such that collector $C_j$ is in electric communication with emitter $E_{j+1}$ for each j satisfying $1 \leq j \leq (m-1)$.

33. A converter as recited in claim 32, wherein said natural logarithm of the ratio $N_d^*/N_d$ is in a range from about 3 to about 7.

34. A converter as recited in claim 32, further comprising a compensated region disposed between said gap region $G_i$ and said collector $C_i$, said compensated region $R_i$ being configured to suppress electric current from said collector to said gap region, wherein each plate $P_j$ having an emitter $E_{j+1}$, a gap region $G_{j+1}$, a compensated region $R_{j+1}$, and a collector $C_{j+1}$, so configured is connected in series with a group of an emitter $E_j$, a gap region $G_j$, a compensated region $R_{j+1}$, and a collector $C_j$, for $1 \leq j \leq (m-1)$.

35. A converter as recited in claim 34, wherein emitters $E_i$ and $E_j$ comprise substantially the same materials, collectors $C_i$ and $C_j$ comprise substantially the same materials, and compensated regions $R_i$ and $R_j$ comprise substantially the same materials, for $i \neq j$, and $1 \leq i \leq m$, $1 \leq j \leq m$.

36. A converter as recited in claim 32, such that the temperature of each of said emitter $E_i$ is higher than the temperature of each of said collector $C_i$ when an electric current flows between said emitter $E_i$ and said collector $C_i$.

37. A converter as recited in claim 32, wherein said first plate $P_1$ comprises InSb.

38. A converter as recited in claim 32, wherein said first plate $P_1$ comprises InSb doped with Te.

39. A converter as recited in claim 32, wherein said first plate $P_1$ comprises InSb doped with Te at a concentration of about $10^{18}$ cm$^{-3}$.

40. A converter as recited in claim 32, wherein at least said first plate emitter $E_1$ comprises InSb doped with Te.

41. A converter as recited in claim 32, wherein at least said first plate emitter $E_1$ comprises InSb doped with Te at a concentration of about $3 \cdot 10^{19}$ cm$^{-3}$.

42. A converter as recited in claim 32, wherein said first plate $P_1$ is coated with a material comprising In-Ga.

43. A converter as recited in claim 32, wherein at least said first plate $P_1$ is coated with a material having In$_{1-u}$Ga$_u$, wherein u is in a range from about 0 to about 0.3.

44. A converter as recited in claim 32, wherein at least said first plate $P_1$ is coated with a material having In$_{1-u}$Ga$_u$, wherein u is about 0.25.

45. A converter as recited in claim 32, wherein at least one of said plates comprises Hg$_{1-x}$Cd$_x$Te, with x being in the range from about 0.08 to about 0.2.

46. A converter as recited in claim 32, wherein at least one of said plates comprises Hg$_{1-x}$Cd$_x$Te, with x being in a range from about 0.08 to about 0.14.

47. A converter as recited in claim 32, wherein said first emitter $E_1$ is thermally insulated.

48. A solid state thermionic converter of thermal energy, comprising:
an emitter having at least a reaction product of Hg$_{1-x}$Cd$_x$Te, x being in the range from about 0.08 to about 0.25, with a substrate comprising In;
a collector; and
a gap region between said emitter and said collector in electric and thermal communication with said emitter and said collector, said gap region comprising a semiconductor selected from the group consisting of n-type, p-type and intrinsic semiconductors.

49. A converter as recited in claim 48, further comprising a compensated region disposed between said gap region and said collector, said compensated region being configured to suppress electric current from said collector to said gap region.

50. A converter as recited in claim 48, wherein said substrate comprises In-Ga.

51. A converter as recited in claim 48, wherein x is within the range from about 0.08 to about 0.2.

52. A converter as recited in claim 48, wherein x is within the range from about 0.08 to about 0.15.

53. A converter as recited in claim 48, wherein said substrate comprises $In_{1-w}Ga_w$, wherein w is within the range from about 0.1 to about 0.3.

54. A converter as recited in claim 48, wherein said emitter is provided with a diffusion barrier.

55. A converter as recited in claim 48, wherein said emitter is provided with a diffusion barrier comprising ytterbium.

56. A converter as recited in claim 48, wherein said emitter is thermally insulated.

57. A solid state thermionic converter of thermal energy, comprising:
- an emitter having at least a region comprising a first donor having a concentration $N_d^*$;
- a gap region adjacent to and in electric and thermal communication with said emitter, said gap region comprising a semiconductor, said semiconductor comprising a second donor having a concentration $N_d$, said concentration of said second donor being selected such that the natural logarithm of the ratio $N_d^*/N_d$ is between a numerical value greater than 0 and about 7;
- a compensated region disposed between said gap region and said collector, said compensated region being configured to suppress electric current from said collector to said gap region; and
- a cold ohmic contact in electric and thermal communication with said gap region, wherein said cold ohmic contact comprises a recombination collector region next to said gap region.

58. A converter as recited in claim 57, wherein said natural logarithm of the ratio $N_d^*/N_d$ is in a range from about 3 to about 7.

59. A converter as recited in claim 57, wherein said recombination collector region is formed on said cold ohmic contact.

60. A converter as recited in claim 57, wherein said collector comprises a metal.

61. A converter as recited in claim 57, wherein said gap region comprises an n-type semiconductor.

62. A converter as recited in claim 57, wherein said gap region is adjacent to said emitter.

63. A solid state thermionic converter of thermal energy, comprising:
- an emitter having at least a region comprising a first donor having a concentration $N_d^*$;
- a compensated region;
- a gap region between said emitter and said compensated region, such that said gap region is in electric and thermal contact with said emitter and said compensated region, said gap region comprising a semiconductor, said semiconductor comprising a second donor having a concentration $N_d$, said concentration of said second donor being selected such that the natural logarithm of the ratio $N_d^*/N_d$ is between a numerical value greater than 0 and 7; and
- a collector in electric and thermal contact with said compensated region, said compensated region having p-type doping such that electric current from said collector to said gap region can be substantially suppressed while allowing thermionic current from said gap region to said collector.

64. A converter as recited in claim 63, wherein the temperature of said emitter is higher than the temperature of said collector when an electric current flows between said emitter and said collector.

65. A converter as recited in claim 63, wherein said natural logarithm of the ratio $N_d^*/N_d$ is in a range from about 3 to about 7.

66. A solid state thermionic converter comprising a plurality of individual converters arranged in series, wherein each of said individual converters is configured as recited in claim 63.

67. A converter as recited in claim 63, wherein said compensated region is formed by ion implantation into said gap region.

68. A converter as recited in claim 63, wherein said compensated region comprises vacancies created by ion implantation.

69. A converter as recited in claim 63, wherein said emitter is thermally insulated.

70. A method for refrigeration by using a solid state thermionic converter, comprising:
- establishing externally an electric potential difference across a thermionic converter having
  - a thermally insulated emitter having at least a region having a first donor concentration $N_d^*$;
  - a collector;
  - a gap region between said emitter and said collector in electric and thermal communication with said emitter and said collector, said gap region comprising a semiconductor, said semiconductor comprising a second donor having a concentration $N_d$, said concentration of said second donor being selected such that the natural logarithm of the ratio $N_d^*/N_d$ is between a numerical value greater than 0 and about 7; and
- delivering a thermal load to said emitter such that said thermal load is cooled by heat flow as said externally established electric potential difference causes the flow of electric current between said emitter and said collector.

71. A method as recited in claim 70, wherein said natural logarithm of the ratio $N_d^*/N_d$ is in a range between about 3 and bout 7.

72. A method as recited in claim 70, with said thermionic converter further having a compensated region disposed between said gap region and said collector, said compensated region being configured to suppress electric current from said collector to said gap region.

* * * * *

UNITED STATES PATENT AND TRADEMARK OFFICE
CERTIFICATE OF CORRECTION

PATENT NO. : 6,396,191 B1
DATED : May 28, 2002
INVENTOR(S) : Peter L. Hagelstein and Yan R. Kucherov It is certified that error appears in the above-identified patent and that said Letters Patent is hereby corrected as shown below:

<u>Title page,</u>
Item [75], Inventors: after "Halgelstein" change "Farmington" to -- Framingham --
Item [56], OTHER PUBLICATIONS; before "and" change
"Space-Ch arge" to -- Space-Charge --

<u>Column 3,</u>
Line 29, before "where" change "$(2\pi^2 h^2)$," to -- $(2\pi^2 h^2)$, --
Line 30, after "and" change "h" to -- $\hbar$ --

<u>Column 5,</u>
Line 9, change "$N_{D*D}$" to -- $N^*_D$ --

<u>Column 12,</u>
Line 22, after "as" change "$P_{k=K(T_1-T_2)}$." to -- $P_\kappa = \kappa(T_1-T_2)$. --

<u>Column 13,</u>
Line 5, after "$\Delta$" change "r" to -- $\tau$ --
Line 29, last term: change $$\chi \Delta \; \frac{\tau}{e^{-\varphi}[e^{\varphi\Delta\tau}e^{-\nu}-1]}$$

to --

$$\chi \; \frac{\Delta\tau}{e^{-\varphi}[e^{\varphi\Delta\tau}e^{-\nu}-1]}$$

--

<u>Column 14,</u>
Line 7, Table 2, column 4, change "X" to -- $\chi$ --
Line 23, Table 2, column 1, change "$Bi_{0.9}Te_{1-x}$" to -- $Bi_{0.9}Sb_{0.1}$ --

<u>Column 17,</u>
Line 13, before "law" change "Gaussφs" to -- Gauss's --

<u>Column 23,</u>
Equation 2.55; last term, after " / " change "t" to -- $\tau$ --

<u>Column 27,</u>
Line 63, after "height" change "$\Delta\mu = q\Delta\varphi/k_b T_{max}$" to -- $\Delta u \Delta\varphi/k_b T_{max}$ --

UNITED STATES PATENT AND TRADEMARK OFFICE
CERTIFICATE OF CORRECTION

PATENT NO. : 6,396,191 B1
DATED : May 28, 2002
INVENTOR(S) : Peter L. Hagelstein and Yan R. Kucherov It is certified that error appears in the above-identified patent and that said Letters Patent is hereby corrected as shown below:

Column 29,
Line 10, after "require" change "J(v)" to -- J(v) --

Column 39,
Line 41, after "Te)" change "inSb" to -- InSb --

Column 40,
Line 39, after "function" change "imp" to -- $\varphi_m$. --

Column 44,
Line 47, after "efficiency" change "$\Theta_c$" to -- $\eta_c$ --

Column 46,
Line 8, after "d." change "$Hg_{1-}Cd_x$" to -- $Hg_{1-x}Cd_x$ --
Line 64, after "of" change "modem" to -- modern --

Column 47,
Line 44, after "into" change "modem" to -- modern --

Column 52,
Line 15, before "in a range" change "$_i$s" to -- is --

Signed and Sealed this

Twenty-eighth Day of January, 2003

JAMES E. ROGAN
*Director of the United States Patent and Trademark Office*